US 12,328,900 B2

(12) United States Patent
Kimoto et al.

(10) Patent No.: US 12,328,900 B2
(45) Date of Patent: Jun. 10, 2025

(54) SEMICONDUCTOR DEVICE, SEMICONDUCTOR DEVICE MANUFACTURING METHOD, INVERTER CIRCUIT, DRIVE DEVICE, VEHICLE, AND ELEVATOR

(71) Applicant: KABUSHIKI KAISHA TOSHIBA, Tokyo (JP)

(72) Inventors: Shinichi Kimoto, Tsukuba (JP); Ryosuke Iijima, Setagaya (JP); Shinsuke Harada, Tsukuba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 662 days.

(21) Appl. No.: 17/654,407

(22) Filed: Mar. 11, 2022

(65) Prior Publication Data

US 2023/0080779 A1    Mar. 16, 2023

(30) Foreign Application Priority Data

Sep. 16, 2021    (JP) .................. 2021-150892

(51) Int. Cl.
    H10D 30/66        (2025.01)
    H01L 21/04        (2006.01)
    (Continued)

(52) U.S. Cl.
    CPC ......... *H10D 30/668* (2025.01); *H10D 12/031* (2025.01); *H10D 62/127* (2025.01);
    (Continued)

(58) Field of Classification Search
    CPC ... H10D 12/031; H10D 30/668; H01L 21/046
    (Continued)

(56) References Cited

U.S. PATENT DOCUMENTS 9,029,871 B2    5/2015 Soeno et al.
2019/0074373 A1    3/2019 Kobayashi et al.
(Continued)

FOREIGN PATENT DOCUMENTS

JP       5547347 B1       7/2014
JP       2017-63082 A     3/2017
(Continued)

OTHER PUBLICATIONS

Japanese Office Action dated Feb. 18. 2025, issued in Japanese Patent Application No. 2021-150892 (with English translation; documents 15-20 being cited therein).

*Primary Examiner* — Fazli Erdem
(74) *Attorney, Agent, or Firm* — Oblon, McClelland, Maier & Neustadt, L.L.P.

(57) ABSTRACT

A semiconductor device of embodiments includes: a silicon carbide layer including a trench, a n-type first SiC region, a p-type second SiC region on the first SiC region, a n-type third SiC region on the second SiC region, a fourth SiC region of p-type between the first trench and the first SiC region, and a fifth SiC region electrically connecting the second SiC region and the fourth SiC region; and a gate electrode in the trench. The first trench has a first region extending in a first direction, a second region continuous with the first region, and a third region continuous with the second region and extending in the first direction. The second width of the second region in the second direction is larger than the first width of the first region in the second direction. The fifth SiC region is disposed in the second direction of the second region.

17 Claims, 45 Drawing Sheets

(51) Int. Cl.
*H10D 12/01* (2025.01)
*H10D 62/10* (2025.01)
*H10D 62/17* (2025.01)
*H10D 62/832* (2025.01)

(52) U.S. Cl.
CPC ....... *H10D 62/314* (2025.01); *H10D 62/8325* (2025.01); *H01L 21/046* (2013.01)

(58) Field of Classification Search
USPC .......................................................... 257/77
See application file for complete search history.

(56) References Cited

U.S. PATENT DOCUMENTS

2019/0259870 A1* 8/2019 Meiser ................ H01L 21/0495
2021/0288156 A1 9/2021 Fukui et al.
2021/0343834 A1* 11/2021 Lichtenwalner ..... H10D 62/107

FOREIGN PATENT DOCUMENTS

| | | |
|---|---|---|
| JP | 2018-064023 A | 4/2018 |
| JP | 2019-50352 A | 3/2019 |
| JP | 2019-087612 A | 6/2019 |
| JP | 2019-160899 A | 9/2019 |
| JP | 2019-160901 A | 9/2019 |
| JP | 2019-176013 A | 10/2019 |
| JP | 2019-195081 A | 11/2019 |
| JP | 2020-088158 A | 6/2020 |
| JP | 2021-93461 A | 6/2021 |

* cited by examiner

SEMICONDUCTOR DEVICE, SEMICONDUCTOR DEVICE MANUFACTURING METHOD, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2021-150892, filed on Sep. 16, 2021, the entire contents of which are incorporated herein by reference.

FIELD

Embodiments described herein relate generally to a semiconductor device, a semiconductor device manufacturing method, an inverter circuit, a drive device, a vehicle, and an elevator.

BACKGROUND

Silicon carbide (SiC) is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such physical properties, it is possible to realize a semiconductor device that can operate at high temperature with low power loss.

In a vertical metal oxide semiconductor field effect transistor (MOSFET), a trench gate structure in which a gate electrode is provided in a trench is applied in order to realize a low on-resistance. By applying the trench gate structure, the channel area per unit area is increased, and accordingly, the on-resistance is reduced.

In addition, in the vertical MOSFET, it is desired to reduce the switching loss in order to reduce a power loss.

DETAILED DESCRIPTION

Figure 1:
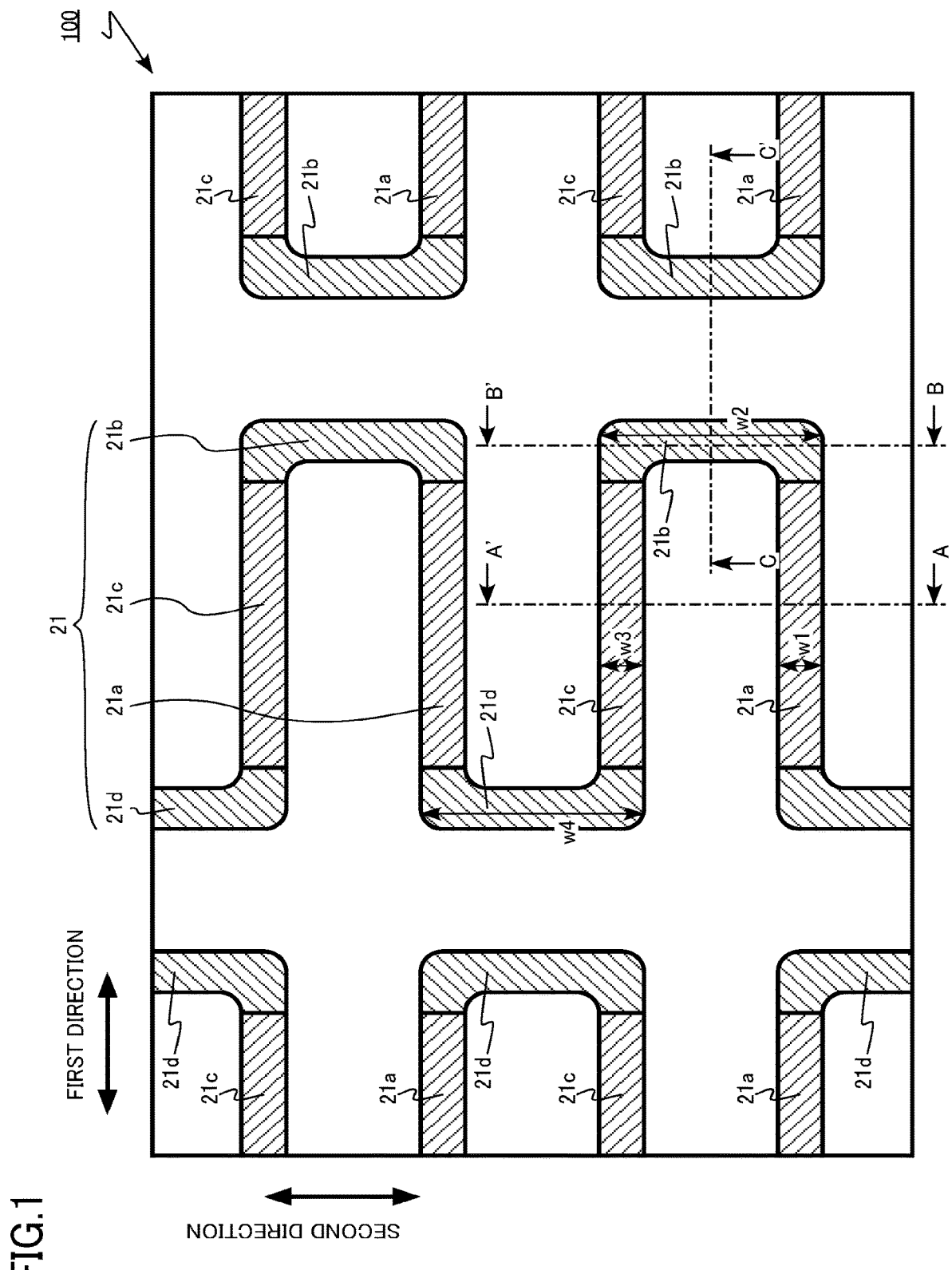
FIG. 1 is a schematic plan view of a semiconductor device of a first embodiment.

A semiconductor device of embodiments includes: a silicon carbide layer having a first face and a second face opposite to the first face, the first face being parallel to a first direction and a second direction, the second direction being perpendicular to the first direction, and the silicon carbide layer including: a first trench disposed on a side of the first face and including a first region, a second region, and a third region, the first region extending in the first direction, the second region continuous with the first region, the third region continuous with the second region and extending in the first direction, a second width of the second region in the second direction being larger than a first width of the first region in the second direction and a third width of the third region in the second direction; a first silicon carbide region of n-type; a second silicon carbide region of p-type disposed between the first silicon carbide region and the first face, a distance from the second face to the second silicon carbide region being larger than a distance from the second face to the first trench; a third silicon carbide region of n-type disposed between the second silicon carbide region and the first face; a fourth silicon carbide region of p-type disposed between the first trench and the first silicon carbide region; and a fifth silicon carbide region disposed in the second direction of the second region and electrically connecting the second silicon carbide region and the fourth silicon carbide region to each other; a gate electrode disposed in the first trench; a gate insulating layer disposed between the gate electrode and the silicon carbide layer; a first electrode disposed on the side of the first face of the silicon carbide layer and in contact with the third silicon carbide region; and a second electrode disposed on a side of the second face of the silicon carbide layer.

Hereinafter, embodiments will be described with reference to the diagrams. In the following description, the same or similar members and the like will be denoted by the same reference numerals, and the description of the members and the like once described will be omitted as appropriate.

In addition, in the following description, when the notations of $n^{++}$, $n^+$, n, $n^-$, $p^{++}$, $p^+$, p, and $p^-$ are used, these notations indicate the relative high and low of the impurity concentration in each conductive type. That is, $n^{++}$ indicates that the n-type impurity concentration is relatively higher than $n^+$, $n^+$ indicates that the n-type impurity concentration is relatively higher than n, and $n^-$ indicates that the n-type impurity concentration is relatively lower than n. In addition, $p^{++}$ indicates that the p-type impurity concentration is relatively higher than $p^+$, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of an impurity region can be calculated from, for example, an SCM image.

The depth of a trench, the thickness of an insulating layer, and the like can be measured, for example, on an image of SIMS or transmission electron microscope (TEM).

In addition, in this specification, the "p-type impurity concentration" in the p-type silicon carbide region means the net p-type impurity concentration obtained by subtracting the n-type impurity concentration in the region from the p-type impurity concentration in the region. In addition, the "n-type impurity concentration" in the n-type silicon carbide region means the net n-type impurity concentration obtained by subtracting the p-type impurity concentration in the region from the n-type impurity concentration in the region.

First Embodiment

A semiconductor device of a first embodiment includes: a silicon carbide layer having a first face parallel to a first direction and a second direction perpendicular to the first direction and a second face opposite to the first face and including: a first trench disposed on a side of the first face and having a first region extending in the first direction, a second region continuous with the first region, and a third region continuous with the second region and extending in the first direction, a second width of the second region in the second direction being larger than a first width of the first region in the second direction and a third width of the third region in the second direction; a first silicon carbide region of n-type; a second silicon carbide region of p-type disposed between the first silicon carbide region and the first face, a distance from the second face being larger than a distance from the second face to the first trench; a third silicon carbide region of n-type disposed between the second silicon carbide region and the first face; a fourth silicon carbide region of p-type disposed between the first trench and the first silicon carbide region; and a fifth silicon carbide region disposed in the second direction of the second region and electrically connecting the second silicon carbide region and the fourth silicon carbide region to each other; a gate electrode disposed in the first trench; a gate insulating layer disposed between the gate electrode and the silicon carbide layer; a first electrode disposed on the side of the first face of the silicon carbide layer and in contact with the third silicon carbide region; and a second electrode disposed on a side of the second face of the silicon carbide layer.

The semiconductor device of the first embodiment is a vertical MOSFET 100 using silicon carbide. The MOSFET 100 is a MOSFET having a trench gate structure in which a gate electrode is provided in the trench. In addition, the MOSFET 100 is an n-channel MOSFET having electrons as carriers.

Figure 2:
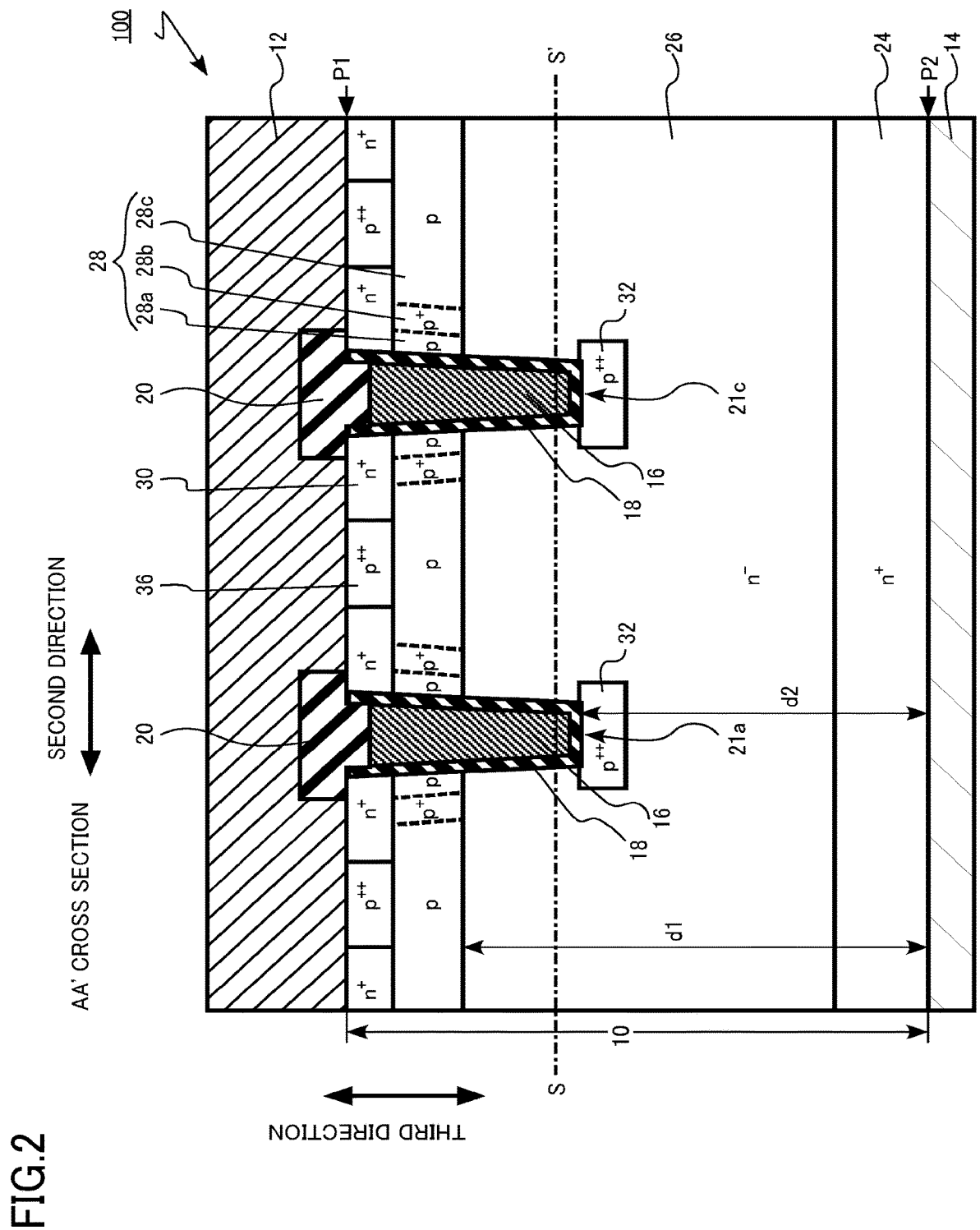
FIG. 2 is a schematic cross-sectional view of the semiconductor device of the first embodiment.
Figure 3:
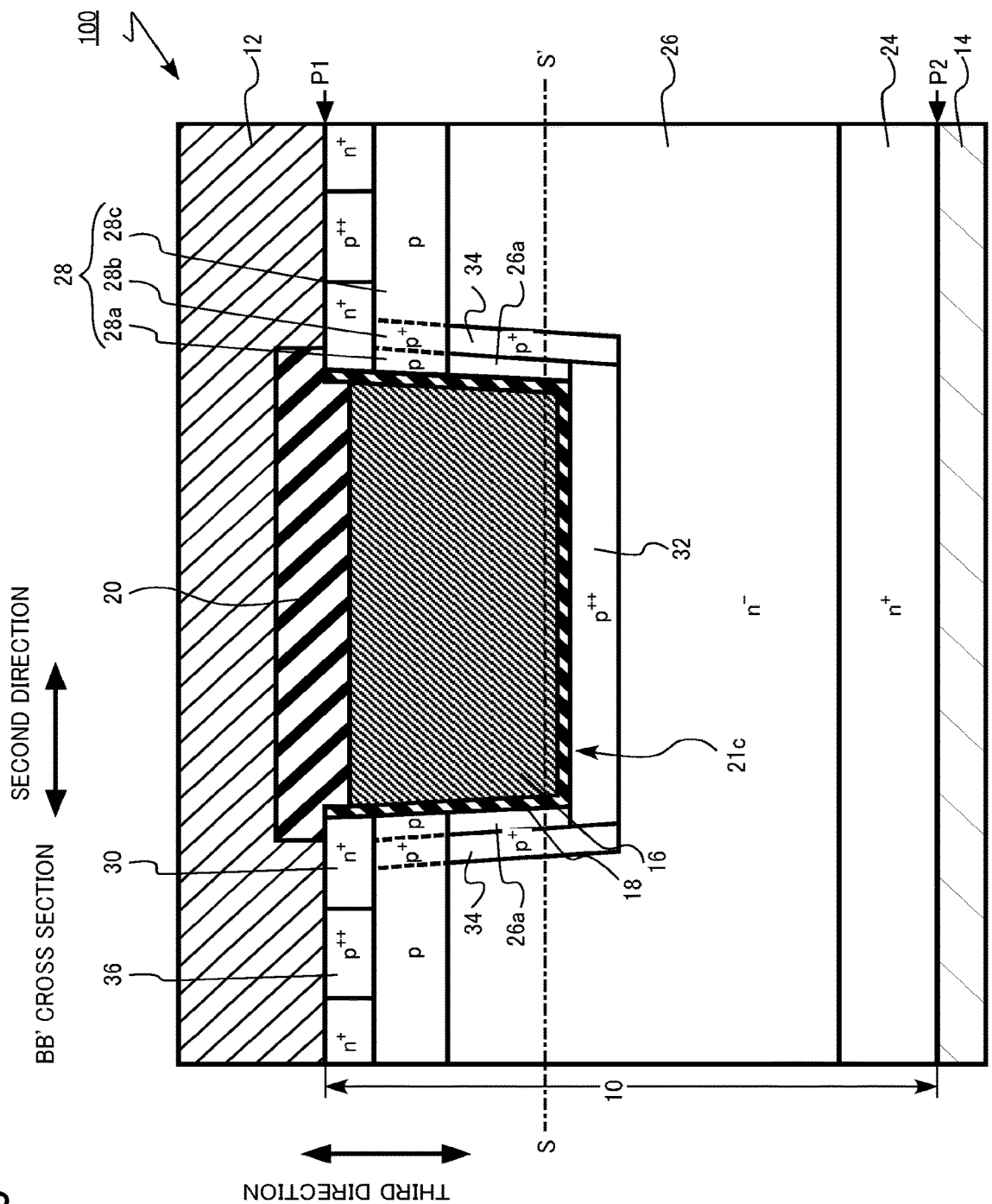
FIG. 3 is a schematic cross-sectional view of the semiconductor device of the first embodiment.
Figure 4:
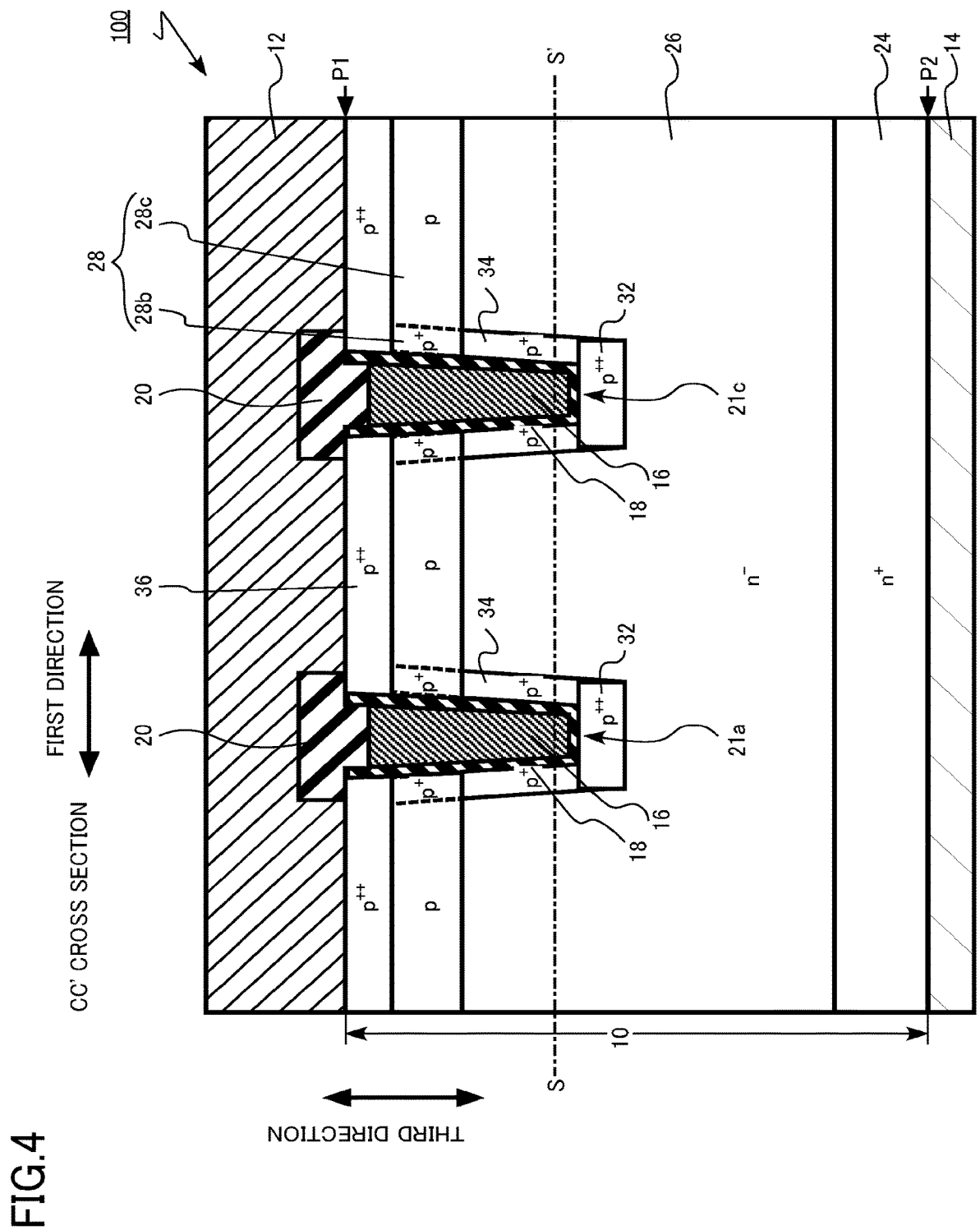
FIG. 4 is a schematic cross-sectional view of the semiconductor device of the first embodiment.
Figure 5:
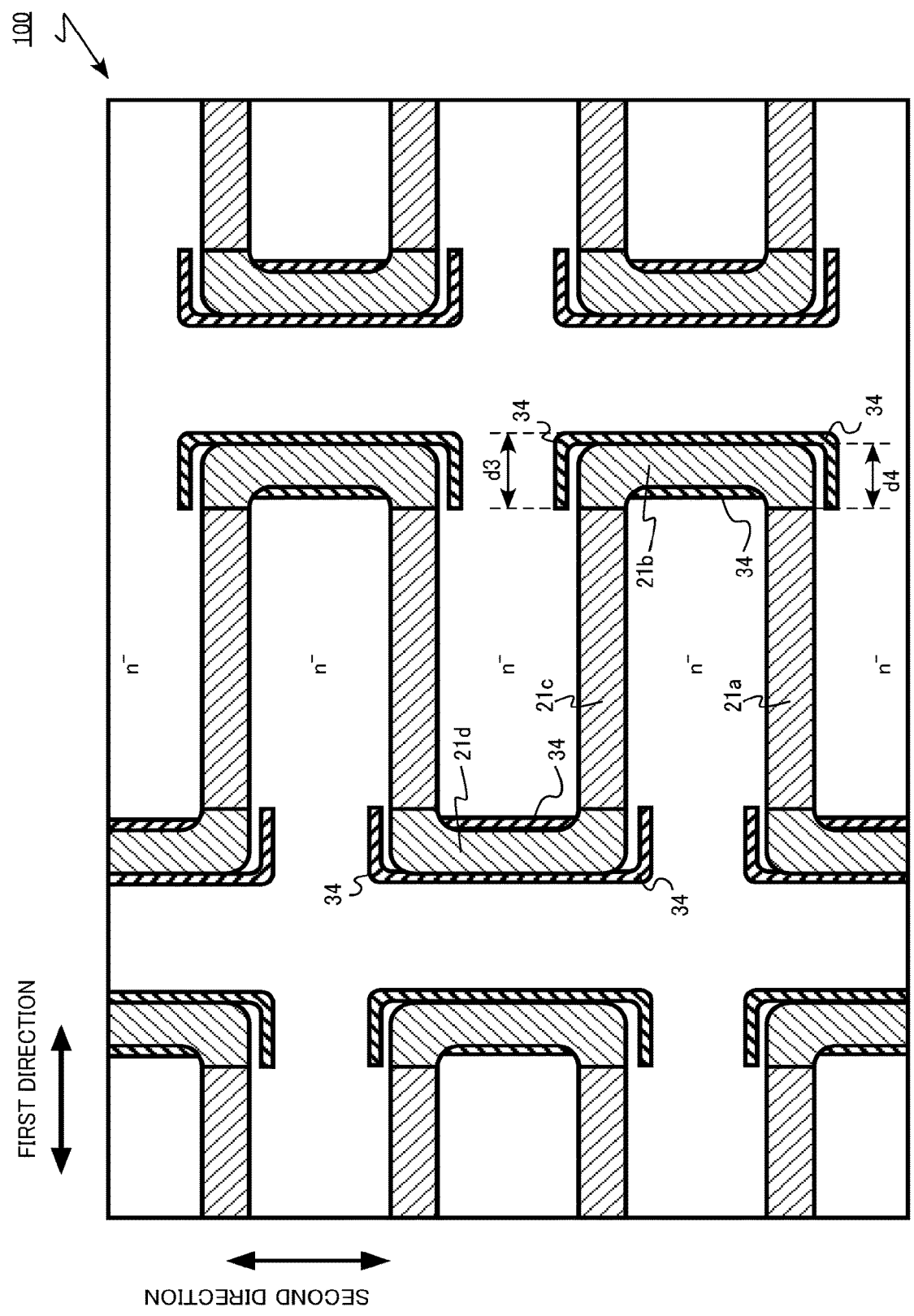
FIG. 5 is a schematic cross-sectional view of the semiconductor device of the first embodiment.

FIG. 1 is a schematic plan view of the semiconductor device of the first embodiment. FIG. 2 is a schematic cross-sectional view of the semiconductor device of the first embodiment. FIG. 3 is a schematic cross-sectional view of the semiconductor device of the first embodiment. FIG. 4 is a schematic cross-sectional view of the semiconductor device of the first embodiment. FIG. 5 is a schematic cross-sectional view of the semiconductor device of the first embodiment.

FIG. 1 is a diagram showing a pattern of a first trench on a first face P1 of a silicon carbide layer. FIG. 2 is a cross-sectional view taken along the line AA' of FIG. 1. FIG. 3 is a cross-sectional view taken along the line BB' of FIG. 1. FIG. 4 is a cross-sectional view taken along the line CC' of FIG. 1. FIG. 5 is a cross-sectional view taken along the line SS' of FIGS. 2, 3, and 4. FIG. 5 is a diagram showing a pattern of a first trench and a pattern of a fifth silicon carbide region.

The MOSFET 100 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 has a gate trench 21 (first trench), an n$^+$-type drain region 24, an n$^-$-type drift region 26 (first silicon carbide region), a p-type body region 28 (second silicon carbide region), an n$^+$-type source region 30 (third silicon carbide region), a p$^{++}$-type gate trench bottom region 32 (fourth silicon carbide region), a p$^+$-type connection region 34 (fifth silicon carbide region), and a p$^{++}$-type contact region 36.

The gate trench 21 has a first region 21a, a second region 21b, a third region 21c, and a fourth region 21d. The p-type body region 28 (second silicon carbide region) has a first low concentration portion 28a (first portion), a high concentration portion 28b (second portion), and a second low concentration portion 28c.

The source electrode 12 is an example of the first electrode. The drain electrode 14 is an example of the second electrode. The gate trench 21 is an example of the first trench. The drift region 26 is an example of the first silicon carbide region. The body region 28 is an example of the second silicon carbide region. The source region 30 is an example of the third silicon carbide region. The gate trench bottom region 32 is an example of the fourth silicon carbide region. The connection region 34 is an example of the fifth silicon carbide region. The first low concentration portion 28a is an example of the first portion. The high concentration portion 28b is an example of the second portion.

The silicon carbide layer 10 is disposed between the source electrode 12 and the drain electrode 14. The silicon carbide layer 10 includes a first face ("P1" in FIG. 2) and a second face ("P2" in FIG. 2). Hereinafter, the first face P1 is also referred to as a surface, and the second face P2 is also referred to as a back surface. The second face P2 is opposite to the first face P1.

The first direction and the second direction are directions parallel to the first face P1. In addition, the second direction is a direction perpendicular to the first direction. In addition, the third direction is a direction perpendicular to the first face P1. The third direction is a direction perpendicular to the first direction and the second direction.

Hereinafter, the "depth" means a depth with respect to the first face P1.

The silicon carbide layer 10 is a single crystal SiC. The silicon carbide layer 10 is, for example, 4H—SiC. The thickness of the silicon carbide layer 10 is, for example, equal to or more than 5 µm and equal to or less than 500 µm.

The first face P1 is, for example, a face inclined by an angle equal to or more than 0° and equal to or less than 8° with respect to the (0001) face. That is, the first face P1 is a face whose normal is inclined by an angle equal to or more than 0° and equal to or less than 8° with respect to the c axis in the [0001] direction. In other words, an off angle with respect to the (0001) face is equal to or more than 0° and equal to or less than 8°. In addition, the second face P2 is, for example, a face inclined by an angle equal to or more than 0° and equal to or less than 8° with respect to the (000-1) face.

The (0001) face is referred to as a silicon face. The (000-1) face is referred to as a carbon face. The inclination direction of the first face P1 and the second face P2 is, for example, a [11-20] direction. The [11-20] direction is an a-axis direction. In FIG. 2, for example, the second direction shown in the diagram is the a-axis direction.

The gate trench 21 is present in the silicon carbide layer 10. The gate trench 21 is disposed on the first face P1 side of the silicon carbide layer 10. The gate trench 21 is a groove formed in the silicon carbide layer 10.

The gate trench 21 has the first region 21a, the second region 21b, the third region 21c, and the fourth region 21d. The second region 21b is continuous with the first region 21a. The third region 21c is continuous with the second region 21b. The fourth region 21d is continuous with the third region 21c.

The first region 21a and the third region 21c extend in the first direction. The second region 21b and the fourth region 21d extend in the second direction, for example.

The first region 21a faces the third region 21c in the second direction. The first region 21a is repeatedly arranged in the second direction. The third region 21c is repeatedly arranged in the second direction. The third region 21c is interposed between the two first regions 21a.

The second region 21b is repeatedly arranged in the first direction. The two second regions 21b adjacent to each other face each other in the first direction.

The fourth region 21d is repeatedly arranged in the first direction. The two fourth regions 21d adjacent to each other face each other in the first direction.

The width of the first region 21a in the second direction is a first width w1. The width of the second region 21b in the second direction is a second width w2. The width of the third region 21c in the second direction is a third width w3. The width of the fourth region 21d in the second direction is a fourth width w4.

The second width w2 is larger than the first width w1. For example, the second width w2 is equal to or more than twice the first width w1.

The second width w2 is larger than the third width w3. For example, the second width w2 is equal to or more than twice the third width w3.

The fourth width w4 is larger than the first width w1. For example, the fourth width w4 is equal to or more than twice the first width w1.

The fourth width w4 is larger than the third width w3. For example, the fourth width w4 is equal to or more than twice the third width w3.

The depth of the gate trench 21 is, for example, equal to or more than 1 µm and equal to or less than 2 µm. The first width w1 of the first region 21a of the gate trench 21 is, for example, equal to or more than 0.5 µm and equal to or less than 1 µm.

The gate trench 21 penetrates the source region 30 and the body region 28.

The gate electrode 16 is disposed in the gate trench 21. The gate electrode 16 is provided between the source electrode 12 and the drain electrode 14.

The gate electrode 16 is a conductive layer. The gate electrode 16 is, for example, polycrystalline silicon containing a p-type impurity or an n-type impurity.

The gate insulating layer 18 is disposed between the gate electrode 16 and the silicon carbide layer 10. The gate insulating layer 18 is provided between the gate electrode 16 and each of the source region 30, the body region 28, the drift region 26, and the connection region 34.

The gate insulating layer 18 is, for example, a silicon oxide film. For example, a High-k insulating film (high dielectric constant insulating film such as HfSiON, ZrSiON, and AlON) can be applied to the gate insulating layer 18. In addition, for example, a stacked film of a silicon oxide film ($SiO_2$) and a High-k insulating film can be applied to the gate insulating layer 18.

The interlayer insulating layer 20 is provided on the gate electrode 16. The interlayer insulating layer 20 is provided between the gate electrode 16 and the source electrode 12.

The thickness of the interlayer insulating layer 20 is larger than, for example, the thickness of the gate insulating layer 18. The interlayer insulating layer 20 is, for example, a silicon oxide film. The interlayer insulating layer 20 electrically separates the gate electrode 16 and the source electrode 12 from each other.

The interface between the source electrode 12 and the interlayer insulating layer 20 is, for example, on the second face P2 side from the first face P1. The interface between the source electrode 12 and the interlayer insulating layer 20 is disposed, for example, in the gate trench 21.

As shown in FIGS. 2, 3, and 4, on the first face P1, the upper surface of the gate trench 21 is covered with the source electrode 12.

The source electrode 12 is disposed on the first face P1 side of the silicon carbide layer 10. The source electrode 12 is provided on the first face P1 of the silicon carbide layer 10. The source electrode 12 is in contact with the source region 30 and the contact region 36.

The source electrode 12 is in contact with the source region 30 at the first face P1 of the silicon carbide layer 10.

The source electrode 12 contains a metal. The metal forming the source electrode 12 has, for example, a stacked structure of titanium (Ti) and aluminum (Al). The source electrode 12 may contain, for example, a metal silicide or a metal carbide in contact with the silicon carbide layer 10.

The drain electrode 14 is disposed on the second face P2 side of the silicon carbide layer 10. The drain electrode 14 is provided on the second face P2 of the silicon carbide layer 10. The drain electrode 14 is in contact with the drain region 24.

The drain electrode 14 is, for example, a metal or a metal semiconductor compound. The drain electrode 14 contains a material selected from a group consisting of nickel silicide (NiSi), titanium (Ti), nickel (Ni), silver (Ag), and gold (Au), for example.

The $n^+$-type drain region 24 is provided on the second face P2 side of the silicon carbide layer 10. The drain region 24 contains, for example, nitrogen (N) as an n-type impurity. The n-type impurity concentration in the drain region 24 is, for example, equal to or more than $1\times10^{18}$ cm$^{-3}$ and equal to or less than $1\times10^{21}$ cm$^{-3}$.

The $n^-$-type drift region 26 is provided on the drain region 24. The drift region 26 is disposed between the first face P1 and the drain region 24.

The drift region 26 contains, for example, nitrogen (N) as an n-type impurity. The n-type impurity concentration in the drift region 26 is lower than the n-type impurity concentration in the drain region 24. The n-type impurity concentration in the drift region 26 is, for example, equal to or more than $4\times10^{14}$ cm$^{-3}$ and equal to or less than $1\times10^{18}$ cm$^{-3}$.

The p-type body region 28 is disposed between the drift region 26 and the first face P1.

The body region 28 has the first low concentration portion 28a (first portion), the high concentration portion 28b (second portion), and the second low concentration portion 28c. The first low concentration portion 28a is disposed between the gate trench 21 and the high concentration portion 28b. The high concentration portion 28b is disposed between the first low concentration portion 28a and the second low concentration portion 28c.

The first low concentration portion 28a functions as a channel forming region of the MOSFET 100. For example, when the MOSFET 100 is turned on, a channel through which electrons flow is formed in the first low concentration portion 28a.

The high concentration portion 28b has a function of suppressing the short channel effect of the MOSFET 100. By providing the high concentration portion 28b in the body region 28, a reduction in the threshold voltage of the MOSFET 100 when the channel length is reduced is suppressed.

The body region 28 contains, for example, aluminum (Al) as a p-type impurity. The p-type impurity concentration in the high concentration portion 28b is higher than the p-type impurity concentration in the first low concentration portion 28a. The p-type impurity concentration in the high concentration portion 28b is higher than the p-type impurity concentration in the second low concentration portion 28c.

The p-type impurity concentration in the high concentration portion 28b is, for example, equal to or more than twice and equal to or less than 10 times the p-type impurity concentration in the first low concentration portion 28a. The p-type impurity concentration in the high concentration portion 28b is, for example, equal to or more than twice and equal to or less than 10 times the p-type impurity concentration in the second low concentration portion 28c.

The p-type impurity concentration in each of the first low concentration portion 28a and the second low concentration portion 28c is, for example, equal to or more than $5\times10^{16}$ cm$^{-3}$ and equal to or less than $5\times10^{18}$ cm$^{-3}$. The p-type impurity concentration in the high concentration portion 28b is, for example, equal to or more than $1\times10^{17}$ cm$^{-3}$ and equal to or less than $5\times10^{18}$ cm$^{-3}$.

The depth of the body region 28 is smaller than the depth of the gate trench 21. The depth of the body region 28 is, for example, equal to or more than 0.4 μm and equal to or less than 1.0 μm.

The distance (d1 in FIG. 2) from the second face P2 to the body region 28 is larger than the distance (d2 in FIG. 2) from the second face P2 to the gate trench 21.

The $n^+$-type source region 30 is disposed between the body region 28 and the first face P1. The source region 30 is in contact with the source electrode 12. The source region 30 is in contact with the gate insulating layer 18.

The source region 30 contains, for example, phosphorus (P) as an n-type impurity. The n-type impurity concentration in the source region 30 is higher than the n-type impurity concentration in the drift region 26. The n-type impurity concentration in the source region 30 is, for example, equal to or more than $1\times10^{19}$ cm$^{-3}$ and equal to or less than $1\times10^{21}$ cm$^{-3}$.

The depth of the source region 30 is smaller than the depth of the body region 28. The depth of the source region 30 is, for example, equal to or more than 0.3 μm and equal to or less than 0.6 μm.

The p++-type gate trench bottom region 32 is disposed between the gate trench 21 and the drift region 26. The gate trench bottom region 32 is in contact with the bottom surface of the gate trench 21. The gate trench bottom region 32 is in contact with the gate insulating layer 18.

The gate trench bottom region 32 has a function of reducing the electric field applied to the gate insulating layer 18 when the MOSFET 100 is turned off.

The gate trench bottom region 32 contains, for example, aluminum (Al) as a p-type impurity. The p-type impurity concentration in the gate trench bottom region 32 is higher than, for example, the p-type impurity concentration in the body region 28. The p-type impurity concentration in the gate trench bottom region 32 is, for example, equal to or more than 10 times the p-type impurity concentration in the body region 28.

The p-type impurity concentration in the gate trench bottom region 32 is, for example, equal to or more than $5 \times 10^{17}$ cm$^{-3}$ and equal to or less than $5 \times 10^{19}$ cm$^{-3}$.

The p-type impurity concentration in the gate trench bottom region 32 between the second region 21b of the gate trench 21 and the drift region 26 is higher than the p-type impurity concentration in the gate trench bottom region 32 between the first region 21a of the gate trench 21 and the drift region 26.

The p+-type connection region 34 is disposed in the second direction of the second region 21b of the gate trench 21. The connection region 34 electrically connects the body region 28 and the gate trench bottom region 32 to each other.

The connection region 34 is in contact with the body region 28. The connection region 34 is in contact with, for example, the high concentration portion 28b of the body region 28. The connection region 34 is in contact with the gate trench bottom region 32.

For example, a part 26a of the drift region 26 is disposed between the gate trench 21 and the connection region 34. The part 26a of the drift region 26 is present between the gate trench 21 and the connection region 34 in the second direction of the gate trench 21. The connection region 34 is spaced from the gate trench 21 in the second direction.

The connection region 34 is also disposed, for example, in the first direction of the second region 21b of the gate trench 21. The connection region 34 in the first direction of the second region 21b is in contact with, for example, the gate trench 21. The connection region 34 is in contact with, for example, the gate trench 21 in the first direction.

The connection region 34 is not provided in the second direction of the first region 21a of the gate trench 21. The connection region 34 is not provided in the second direction of the third region 21c of the gate trench 21. The length (d3 in FIG. 5) of the connection region 34 in the first direction is, for example, equal to or less than 1.5 times the length (d4 in FIG. 5) of the second region 21b of the gate trench 21 in the first direction.

The connection region 34 contains, for example, aluminum (Al) as a p-type impurity. The p-type impurity concentration in the connection region 34 is lower than, for example, the p-type impurity concentration in the gate trench bottom region 32. The p-type impurity concentration in the connection region 34 is higher than, for example, the p-type impurity concentration in the first low concentration portion 28a of the body region 28. The p-type impurity concentration in the connection region 34 is higher than, for example, the p-type impurity concentration in the second low concentration portion 28c of the body region 28. The p-type impurity concentration in the connection region 34 is approximately the same as, for example, the p-type impurity concentration in the high concentration portion 28b of the body region 28. The p-type impurity concentration in the connection region 34 is lower than, for example, the p-type impurity concentration in the high concentration portion 28b of the body region 28.

The p-type impurity concentration in the connection region 34 is, for example, equal to or more than $1 \times 10^{17}$ cm$^{-3}$ and equal to or less than $5 \times 10^{18}$ cm$^{-3}$.

The p++-type contact region 36 is disposed between the body region 28 and the first face P1. The contact region 36 is in contact with the source electrode 12. The contact region 36 is in contact with, for example, the gate insulating layer 18.

The contact region 36 contains, for example, aluminum (Al) as a p-type impurity. The p-type impurity concentration in the contact region 36 is higher than the p-type impurity concentration in the body region 28. The p-type impurity concentration in the contact region 36 is, for example, equal to or more than 10 times the p-type impurity concentration in the body region 28. The p-type impurity concentration in the contact region 36 is, for example, equal to or more than $5 \times 10^{17}$ cm$^{-3}$ and equal to or less than $5 \times 10^{20}$ cm$^{-3}$.

Next, an example of a semiconductor device manufacturing method of the first embodiment will be described.

A semiconductor device manufacturing method of the first embodiment includes: forming a first trench on a side of a first face of a silicon carbide layer having the first face parallel to a first direction and a second direction perpendicular to the first direction, a second face opposite to the first face, a first silicon carbide region of n-type disposed between the second face and the first face, a second silicon carbide region of p-type disposed between the first silicon carbide region and the first face, and a third silicon carbide region of n-type disposed between the second silicon carbide region and the first face, the first trench having a first region extending in the first direction, a second region continuous with the first region, and a third region continuous with the second region and extending in the first direction and a second width of the second region in the second direction being larger than a first width of the first region in the second direction and a third width of the third region in the second direction; performing first ion implantation for forming a first p-type region by injecting p-type impurities into a bottom surface of the first trench; performing second ion implantation for forming a second p-type region by injecting p-type impurities into one side surface of the first region, one side surface of the second region, and one side surface of the third region in a direction inclined with respect to a normal of the first face; performing third ion implantation for forming a third p-type region by injecting p-type impurities into the other side surface of the first region, the other side surface of the second region, and the other side surface of the third region in a direction inclined with respect to the normal of the first face; forming a gate insulating layer in the first trench; and forming a gate electrode on the gate insulating layer in the first trench.

FIGS. 6 to 17 are schematic cross-sectional views showing an example of the semiconductor device manufacturing method of the first embodiment. FIGS. 6, 8, 10, 12, 14, and 16 show cross sections corresponding to FIG. 2, that is, the AA' cross section of FIG. 1. FIGS. 7, 9, 11, 13, 15, and 17 show cross sections corresponding to FIG. 3, that is, the BB' cross section of FIG. 1.

Figure 6:
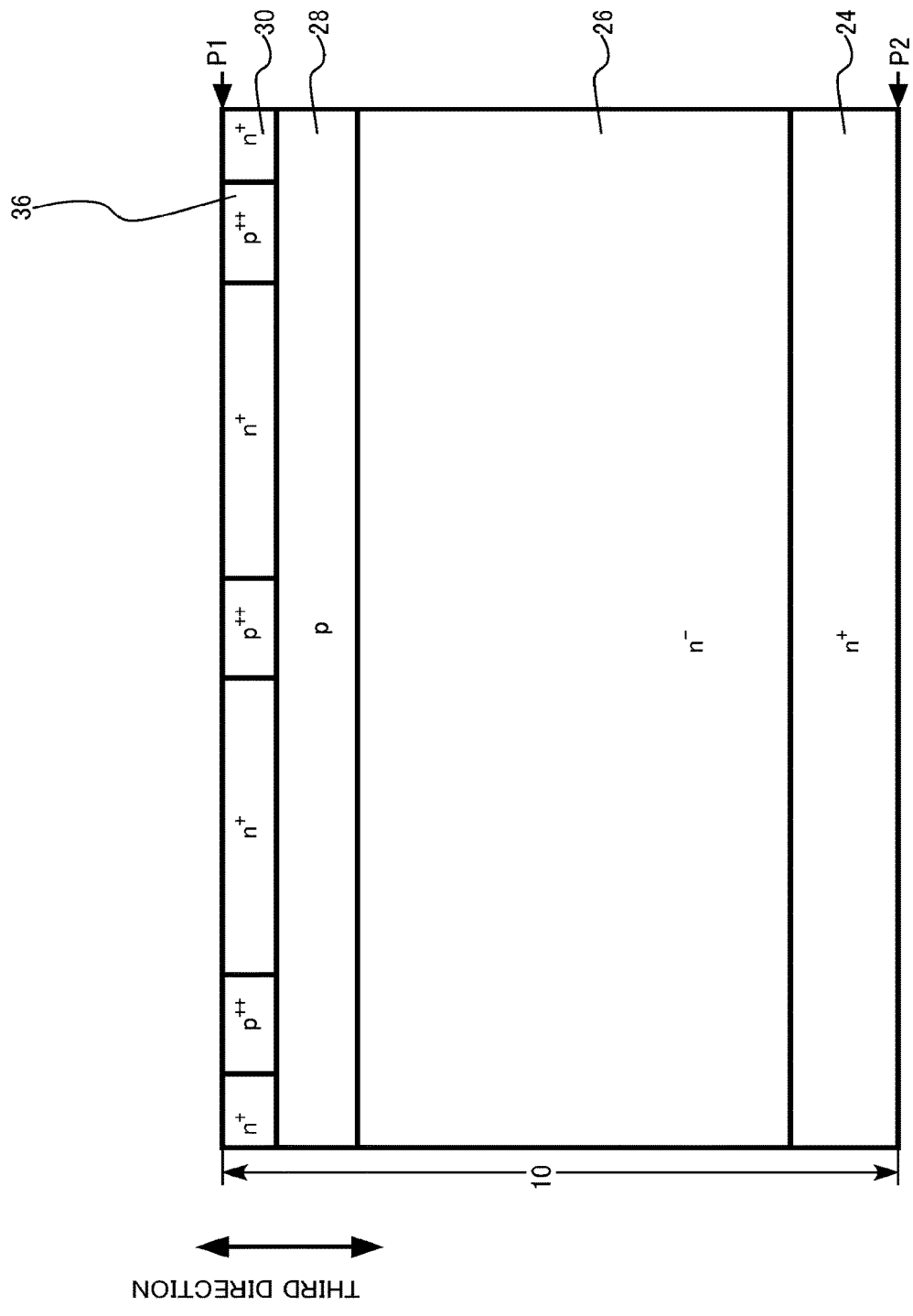
FIG. 6 is a schematic cross-sectional view showing an example of a semiconductor device manufacturing method of the first embodiment.
Figure 7:
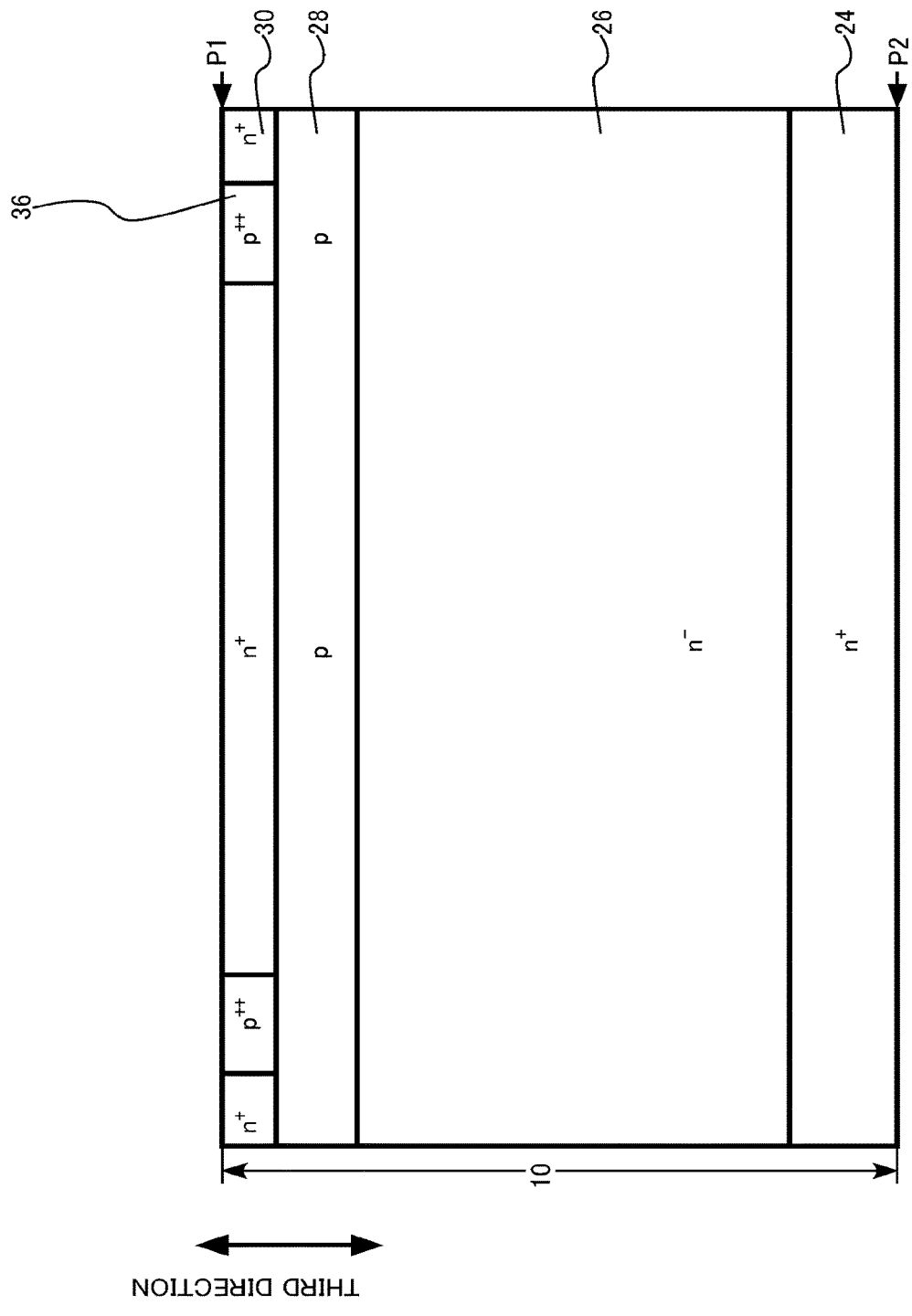
FIG. 7 is a schematic cross-sectional view showing an example of the semiconductor device manufacturing method of the first embodiment.

First, the silicon carbide layer 10 having the first face P1 parallel to a first direction and a second direction perpendicular to the first direction and the second face P2 opposite to the first face P1 is prepared (FIGS. 6 and 7). Hereinafter, the first face P1 is also referred to as a surface, and the second face P2 is also referred to as a back surface.

The silicon carbide layer 10 has an $n^+$-type drain region 24, an $n^-$-type drift region 26 (first silicon carbide region), a p-type body region 28 (second silicon carbide region), an $n^+$-type source region 30 (third silicon carbide region), and a $p^{++}$-type contact region 36. The drain region 24, the drift region 26, the body region 28, the source region 30, and the contact region 36 are formed in an $n^-$-type epitaxial layer formed by epitaxial growth by using an ion implantation method, for example.

Then, a mask material 50 is formed on the surface of the silicon carbide layer 10. The mask material 50 is formed, for example, by depositing a film by a chemical vapor deposition method (CVD method) and patterning the film by a lithography method and a reactive ion etching method (RIE method). The mask material 50 is, for example, a silicon oxide film.

Figure 8:
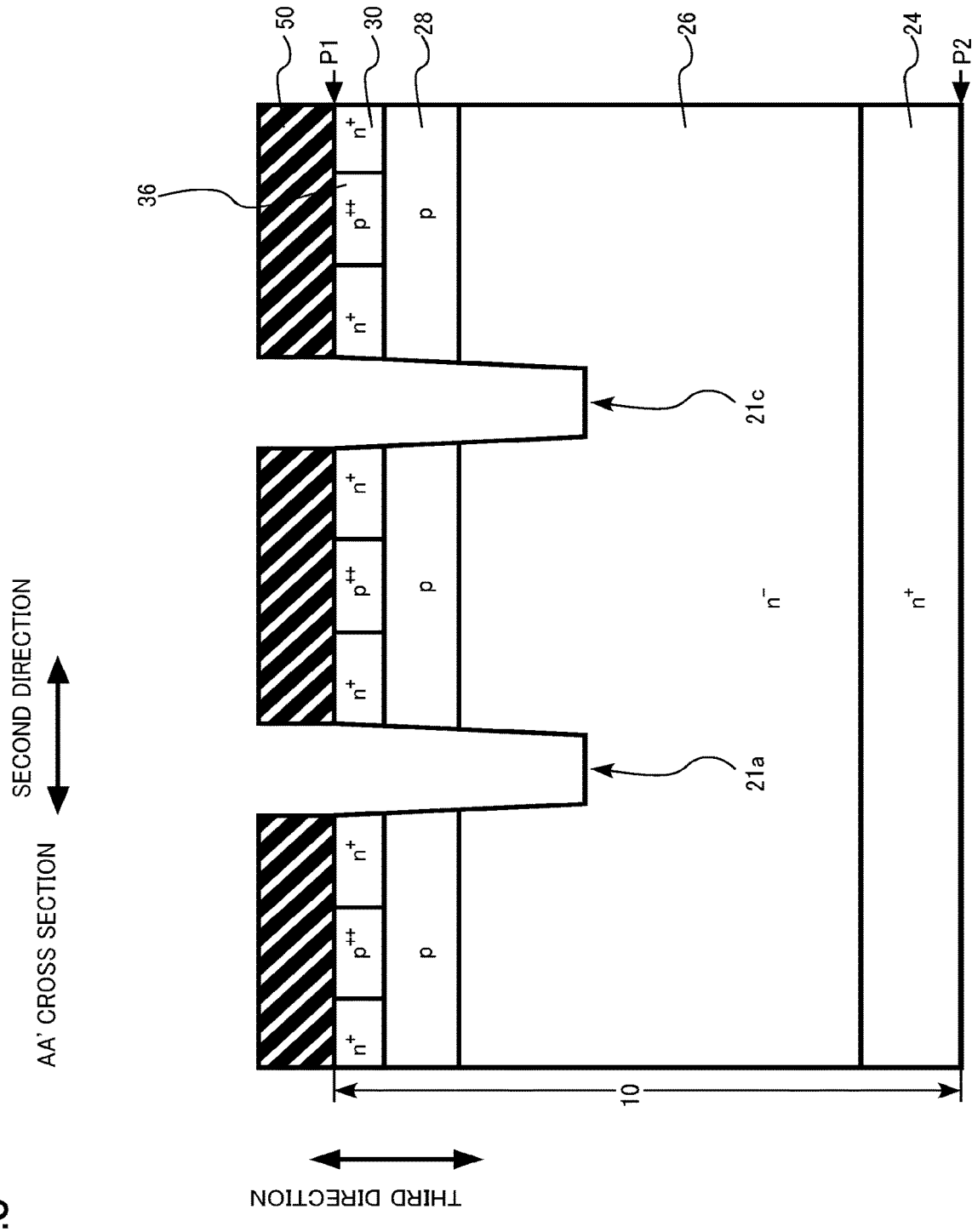
FIG. 8 is a schematic cross-sectional view showing an example of the semiconductor device manufacturing method of the first embodiment.
Figure 9:
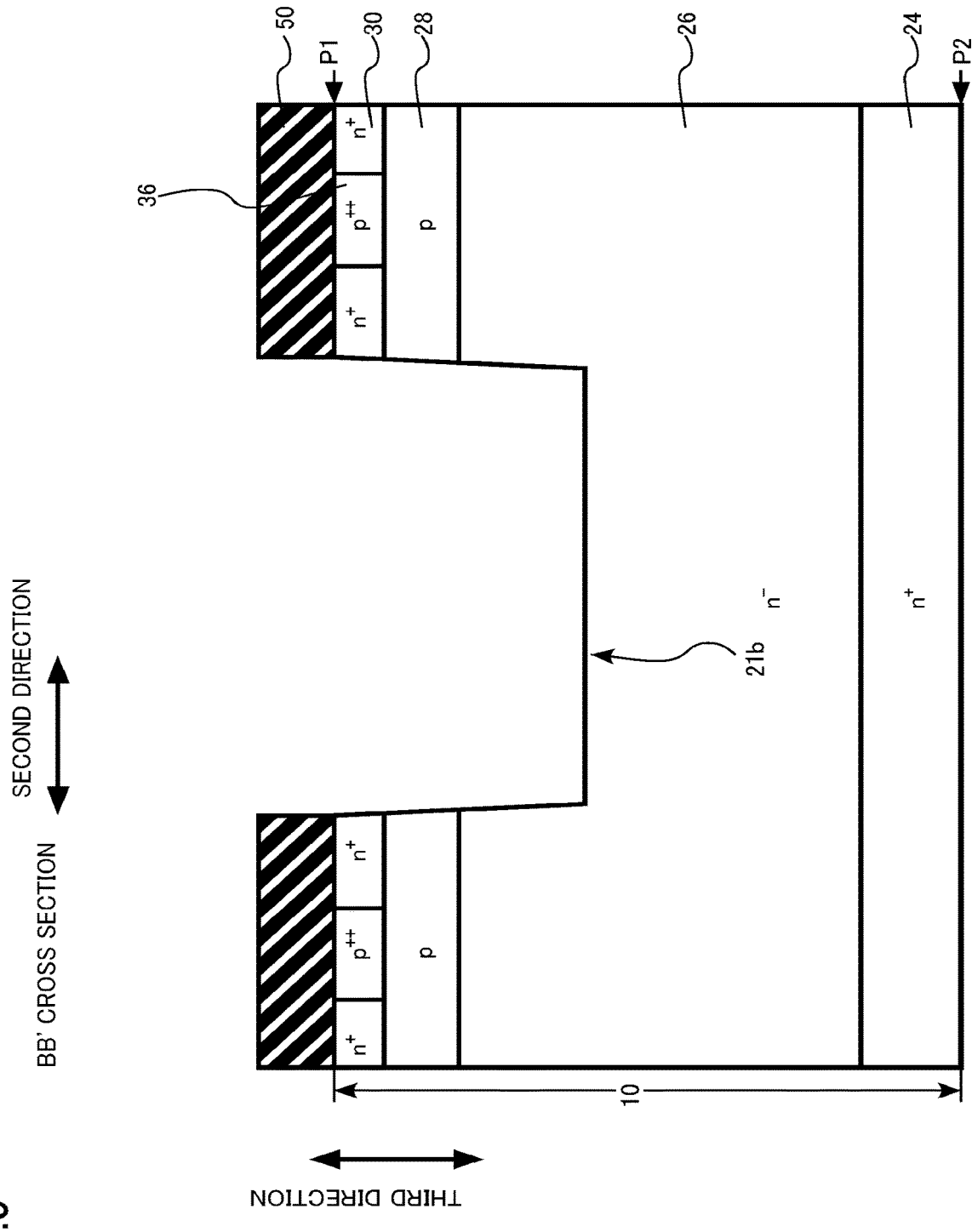
FIG. 9 is a schematic cross-sectional view showing an example of the semiconductor device manufacturing method of the first embodiment.

Then, the gate trench 21 (first trench) is formed by using the mask material 50 as a mask (FIGS. 8 and 9). The gate trench 21 is formed by using the RIE method. The gate trench 21 is formed so as to penetrate the source region 30 and the body region 28.

The gate trench 21 has the first region 21a, the second region 21b, and the third region 21c. The second region 21b is continuous with the first region 21a. The third region 21c is continuous with the second region 21b.

The first region 21a and the third region 21c extend in the first direction. The second region 21b extends in the second direction.

The width of the first region 21a in the second direction is the first width w1. The width of the second region 21b in the second direction is the second width w2. The width of the third region 21c in the second direction is the third width w3.

The second width w2 is larger than the first width w1. The second width w2 is larger than the third width w3.

Figure 10:
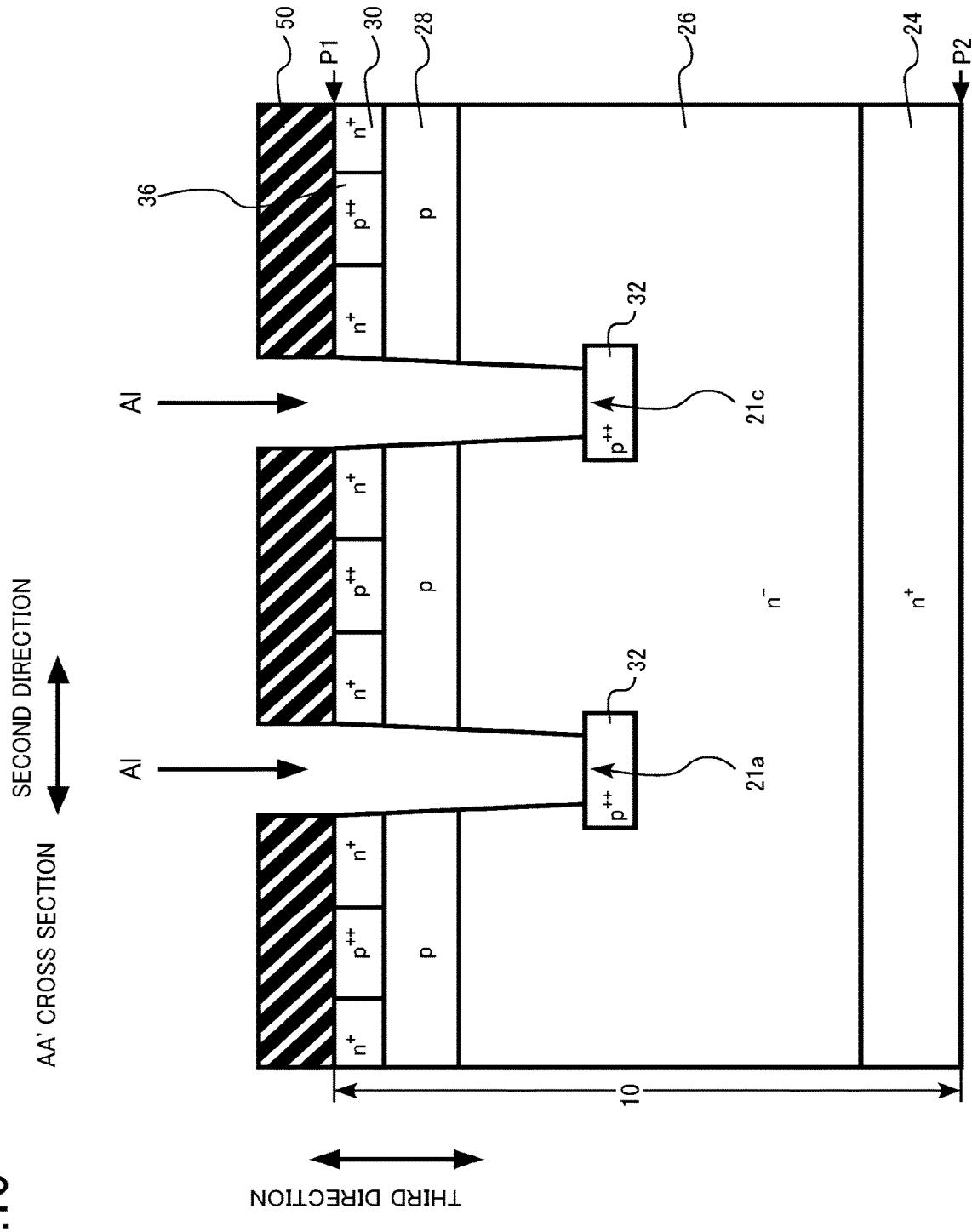
FIG. 10 is a schematic cross-sectional view showing an example of the semiconductor device manufacturing method of the first embodiment.
Figure 11:
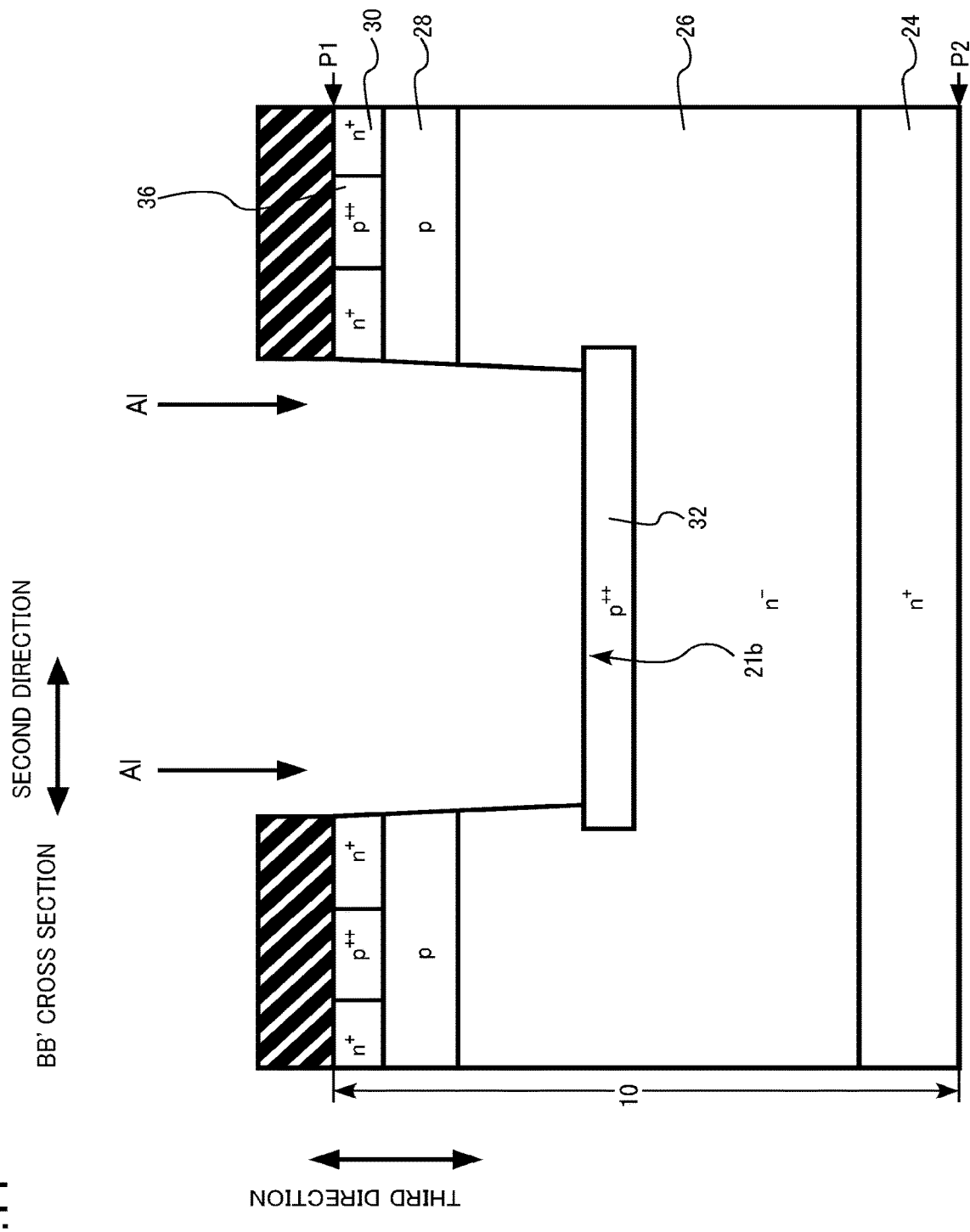
FIG. 11 is a schematic cross-sectional view showing an example of the semiconductor device manufacturing method of the first embodiment.

Then, first ion implantation is performed (FIGS. 10 and 11). In the first ion implantation, p-type impurities are injected into the bottom surface of the gate trench 21 to form the $p^{++}$-type gate trench bottom region 32. The gate trench bottom region 32 is an example of the first p-type region.

The p-type impurity is, for example, aluminum ion. In the first ion implantation, for example, aluminum ions are injected in a direction perpendicular to the normal of the first face P1. The gate trench bottom region 32 is formed in the drift region 26 near the bottom of the gate trench 21.

Figure 12:
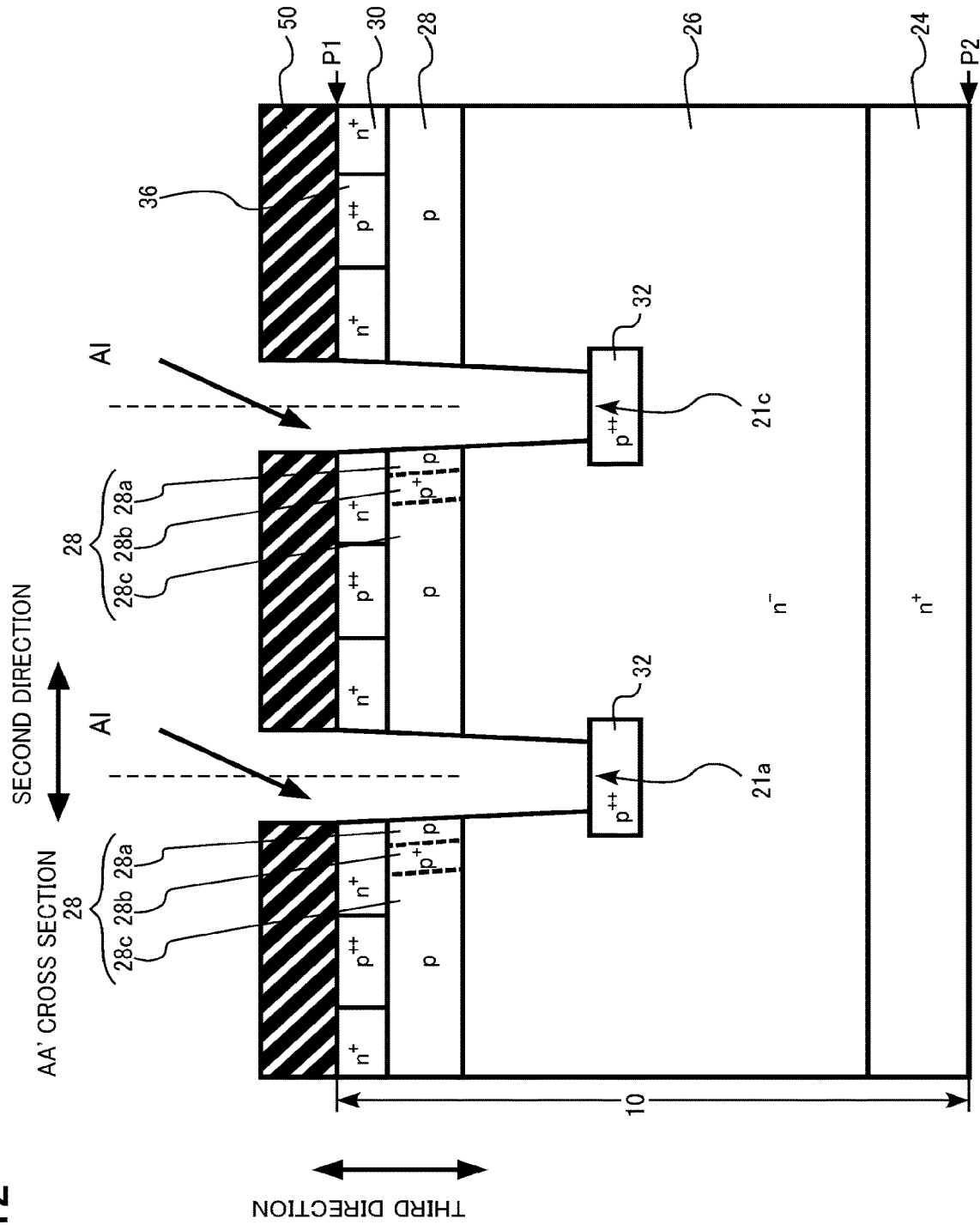
FIG. 12 is a schematic cross-sectional view showing an example of the semiconductor device manufacturing method of the first embodiment.
Figure 13:
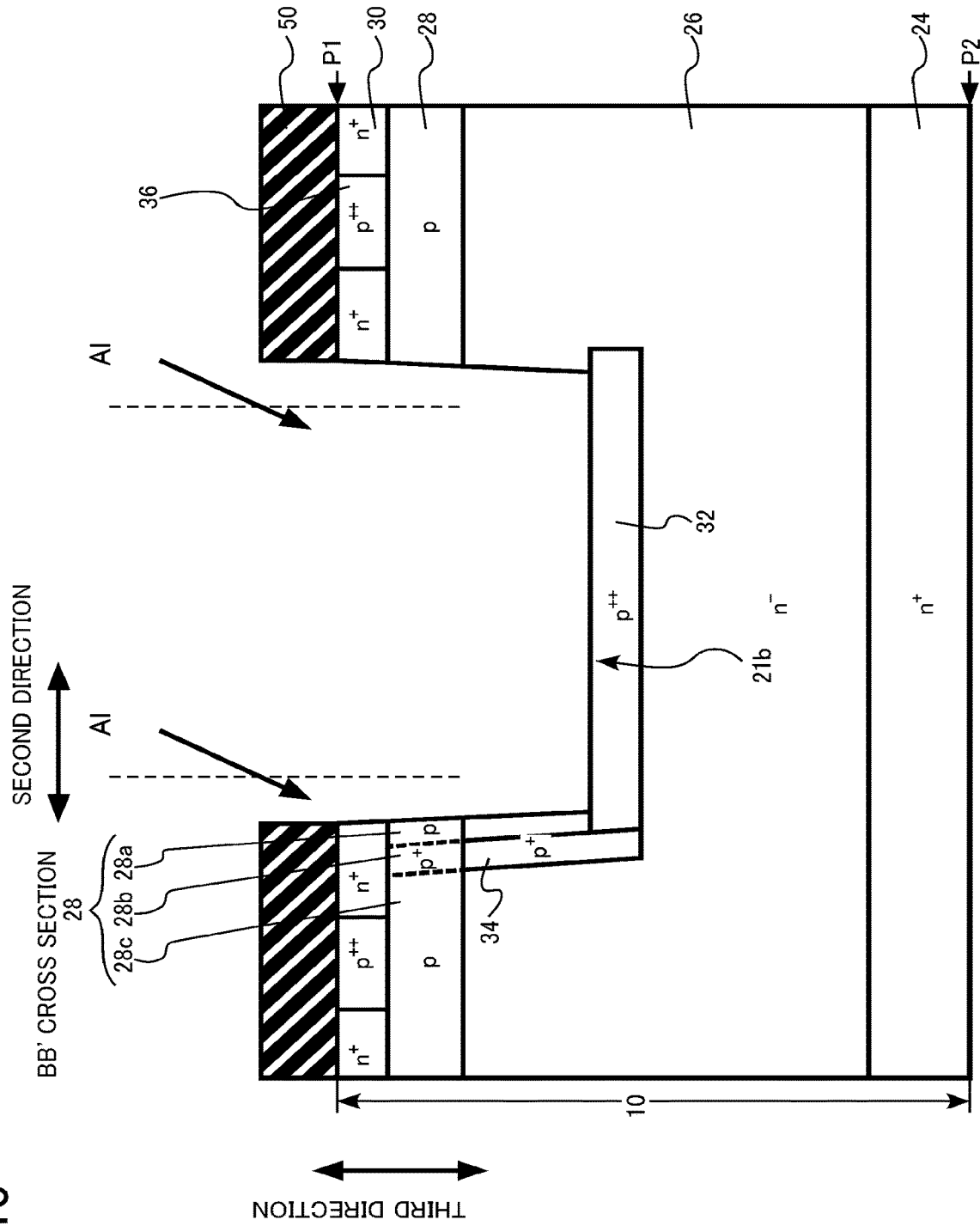
FIG. 13 is a schematic cross-sectional view showing an example of the semiconductor device manufacturing method of the first embodiment.

Then, second ion implantation is performed (FIGS. 12 and 13). In the second ion implantation, p-type impurities are injected into one side surface of the gate trench 21 to form a part of the $p^+$-type high concentration portion 28b of the body region 28 and a part of the $p^+$-type connection region 34. A part of the high concentration portion 28b and a part of the connection region 34 are examples of the second p-type region.

In the second ion implantation, p-type impurities are injected into one side surface of the first region 21a, one side surface of the second region 21b, and one side surface of the third region 21c.

The p-type impurity is, for example, aluminum ion. In the second ion implantation, for example, aluminum ions are injected in a direction inclined with respect to the normal (dotted line in FIGS. 12 and 13) of the first face P1. Aluminum ions are injected, for example, in a direction along the second direction. In the second ion implantation, an oblique ion implantation method is used.

As shown in FIG. 12, the high concentration portion 28b is formed on one side surface of the first region 21a in the second direction and one side surface of the third region 21c in the second direction. No aluminum ions are injected to the bottom surface or the deep portion of the side surface of the first region 21a and the bottom surface or the deep portion of the side surface of the third region 21c because the ion implantation is prevented by the mask material 50. In addition, no aluminum ions are injected into the other side surface of the first region 21a in the second direction and the other side surface of the third region 21c in the second direction.

In addition, as shown in FIG. 13, the high concentration portion 28b and the connection region 34 are formed on one side surface of the second region 21b in the second direction. A portion of the body region 28 other than the high concentration portion 28b becomes the first low concentration portion 28a or the second low concentration portion 28c. No aluminum ions are injected into the other side of the second region 21b in the second direction.

Figure 14:
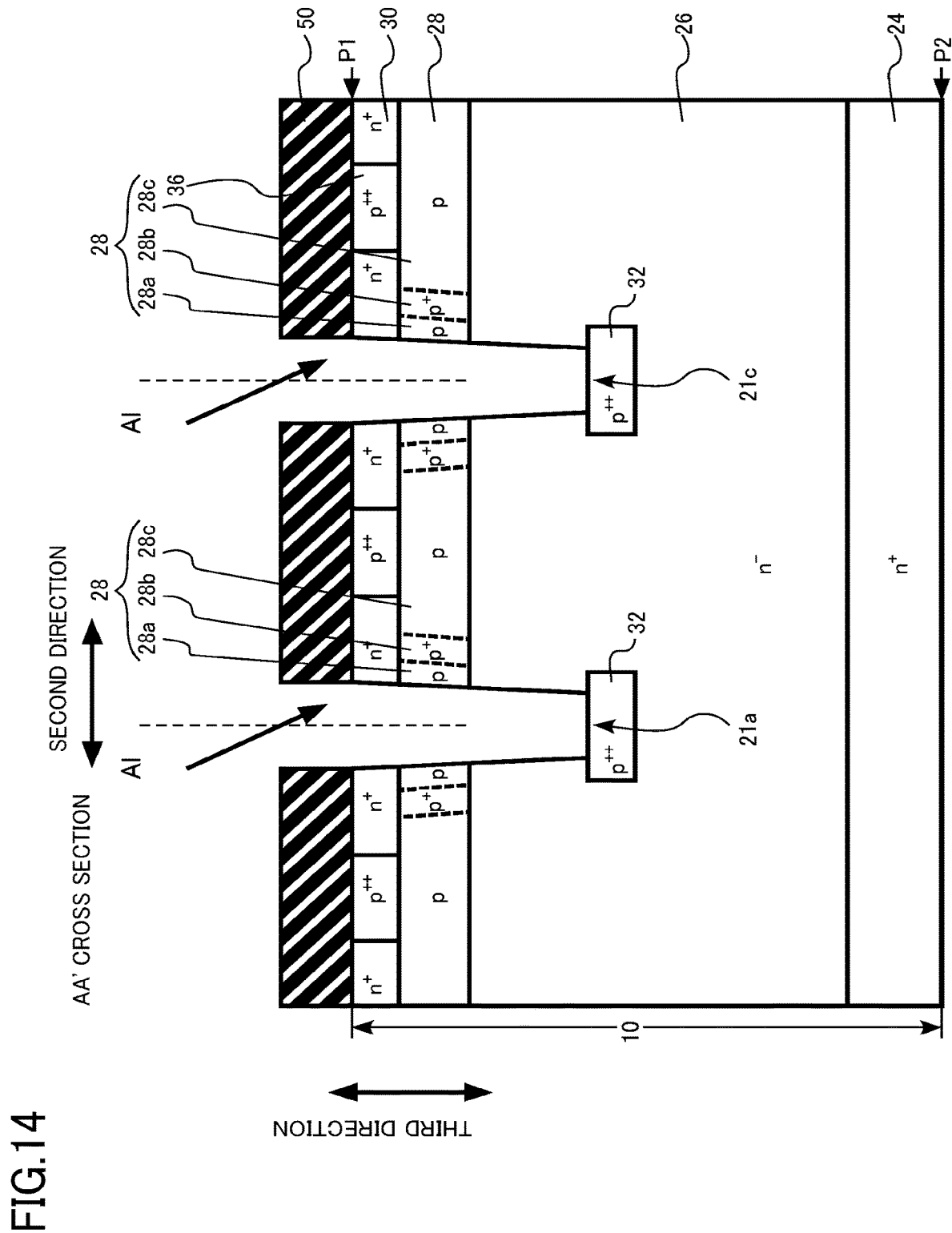
FIG. 14 is a schematic cross-sectional view showing an example of the semiconductor device manufacturing method of the first embodiment.
Figure 15:
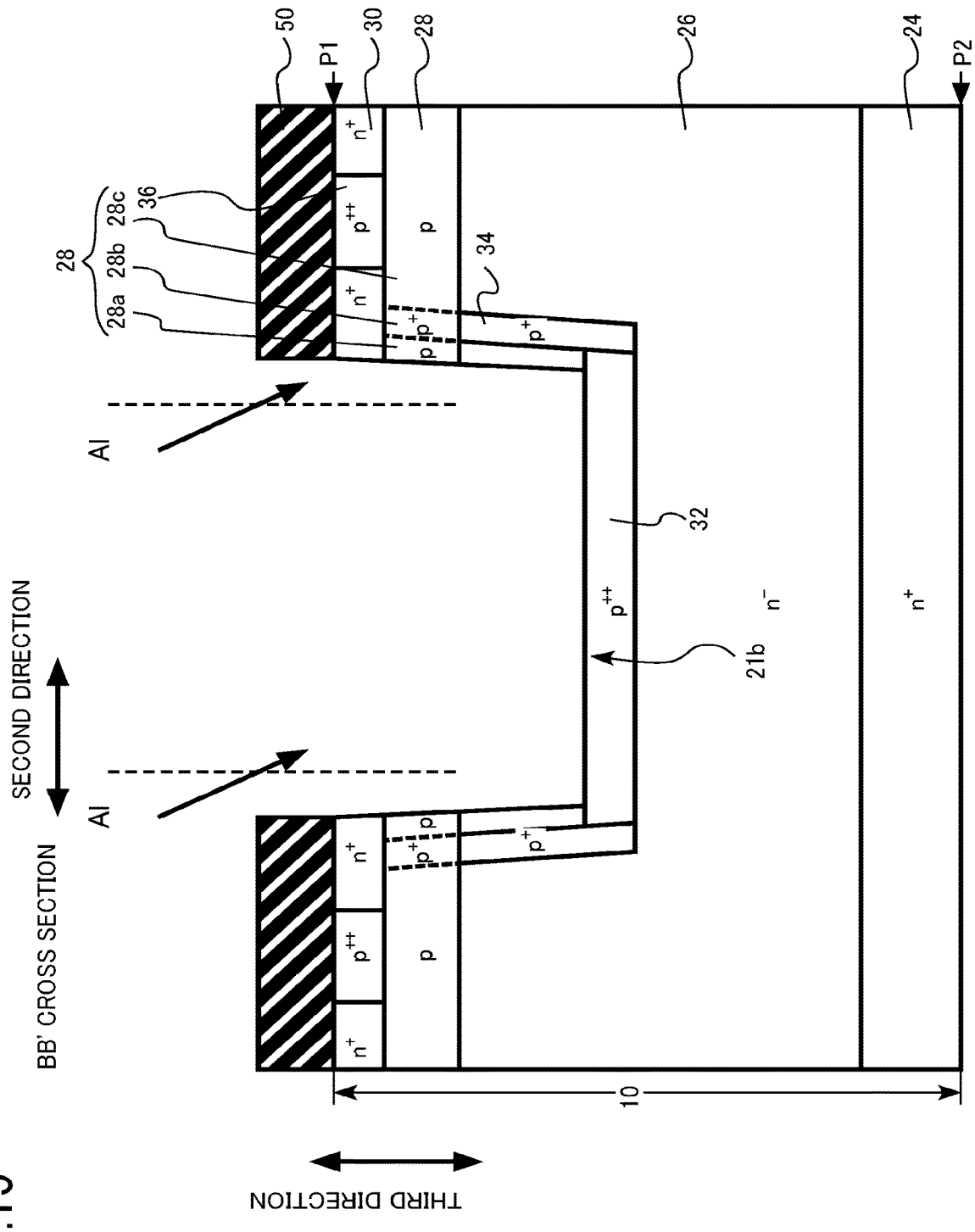
FIG. 15 is a schematic cross-sectional view showing an example of the semiconductor device manufacturing method of the first embodiment.

Then, third ion implantation is performed (FIGS. 14 and 15). In the third ion implantation, p-type impurities are injected into the other side surface of the gate trench 21 to form another part of the $p^+$-type high concentration portion 28b of the body region 28 and another part of the $p^+$-type connection region 34. A part of the high concentration portion 28b and another part of the connection region 34 are examples of the third p-type region.

In the third ion implantation, p-type impurities are injected into the other side surface of the first region 21a, the other side surface of the second region 21b, and the other side surface of the third region 21c.

The p-type impurity is, for example, aluminum ion. In the third ion implantation, for example, aluminum ions are injected in a direction inclined with respect to the normal (dotted line in FIGS. 14 and 15) of the first face P1. In the third ion implantation, for example, aluminum ions are injected in a direction inclined with respect to the normal of the first face P1 in a direction opposite to that in the first ion implantation.

Aluminum ions are injected, for example, in a direction along the second direction. Aluminum ions are injected from a direction opposite to that in the second ion implantation. In the third ion implantation, an oblique ion implantation method is used.

As shown in FIG. 14, the high concentration portion 28b is formed on the other side surface of the first region 21a in the second direction and the other side surface of the third region 21c in the second direction. No aluminum ions are injected to the bottom surface or the deep portion of the side surface of the first region 21a and the bottom surface or the deep portion of the side surface of the third region 21c because the ion implantation is prevented by the mask material 50.

In addition, as shown in FIG. 15, the high concentration portion 28b and the connection region 34 are formed on the other side surface of the second region 21b in the second direction. A portion of the body region 28 other than the high concentration portion 28b becomes the first low concentration portion 28a or the second low concentration portion 28c.

As shown in FIG. 14, by the second ion implantation and the third ion implantation, the high concentration portion 28b is formed on both side surfaces of the first region 21a in the second direction and both side surfaces of the third region 21c in the second direction. In addition, as shown in FIG. 14, by the second ion implantation and the third ion implantation, the high concentration portion 28*b* and the connection region 34 are formed on both side surfaces of the second region 21*b* in the second direction.

In addition, by the second ion implantation and the third ion implantation, for example, aluminum ions are also injected into the side surface of the second region 21*b* in the first direction. Therefore, the high concentration portion 28*b* and the connection region 34 are formed on the side surface of the second region 21*b* in the first direction. For example, since the side surface of the gate trench 21 has a forward taper shape, aluminum ions are also injected into the side surface of the second region 21*b* in the first direction.

In the second ion implantation and the third ion implantation, no aluminum ions are injected into the bottom surface of the first region 21*a* and the bottom surface of the third region 21*c*. On the other hand, in the second ion implantation and the third ion implantation, aluminum ions are injected into the bottom surface of the second region 21*b*. Therefore, the p-type impurity concentration in the gate trench bottom region 32 directly below the second region 21*b* is higher than the p-type impurity concentration in the gate trench bottom region 32 directly below the first region 21*a* and the third region 21*c*.

Figure 16:
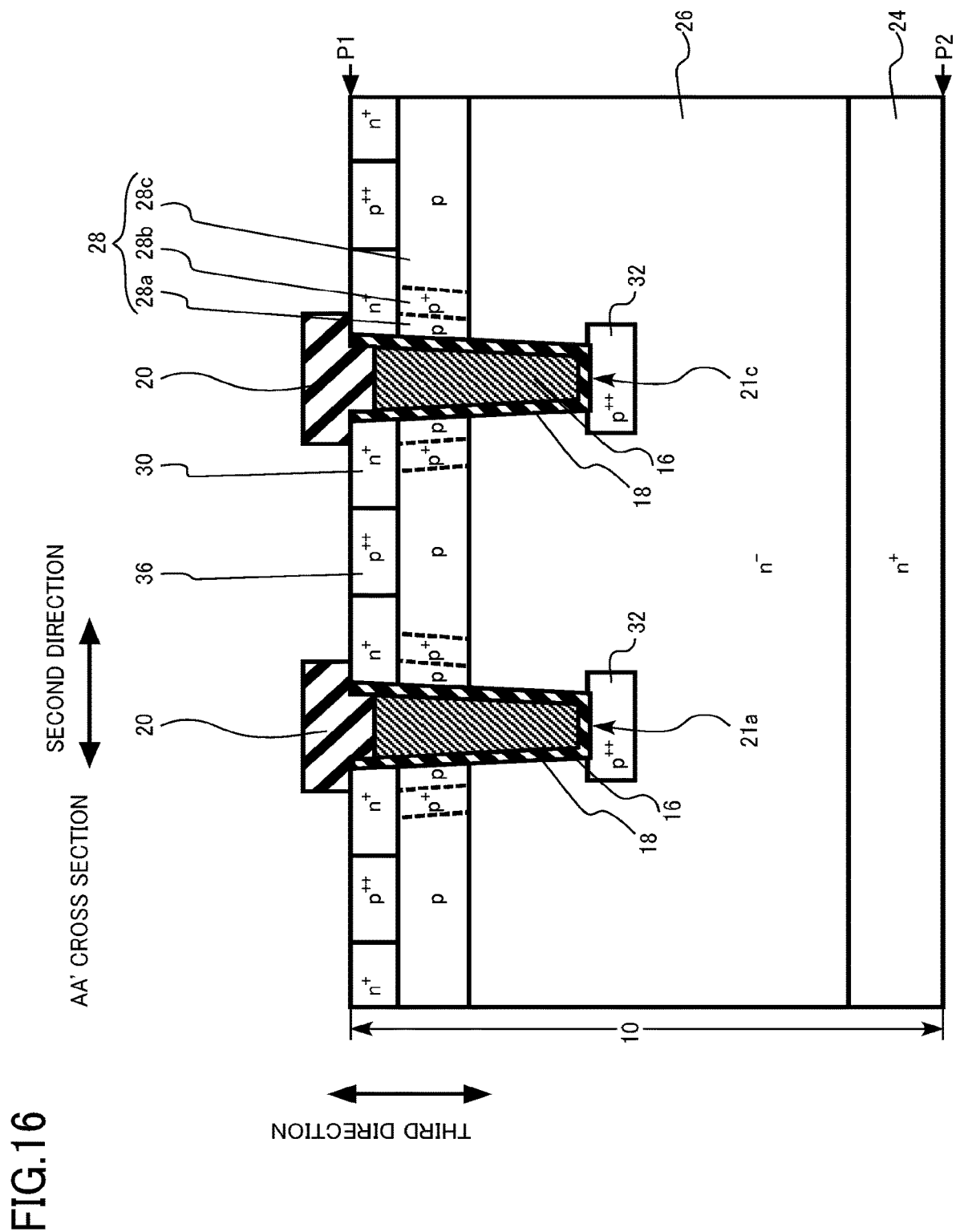
FIG. 16 is a schematic cross-sectional view showing an example of the semiconductor device manufacturing method of the first embodiment.
Figure 17:
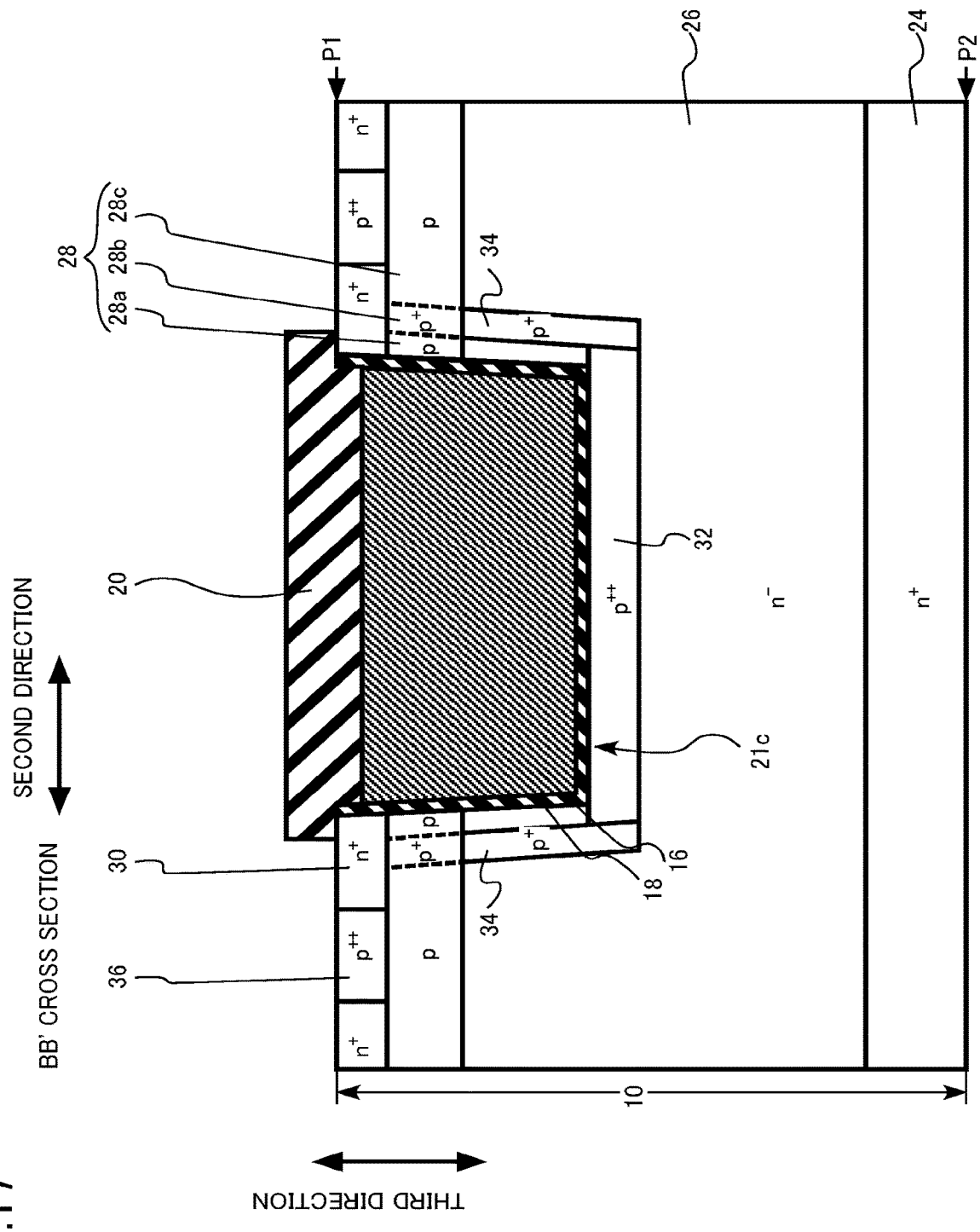
FIG. 17 is a schematic cross-sectional view showing an example of the semiconductor device manufacturing method of the first embodiment.

Then, the mask material 50 is peeled off. Then, the gate insulating layer 18 and the gate electrode 16 are formed in the gate trench 21 by using a known process technique. In addition, the interlayer insulating layer 20 is formed on the gate electrode 16 (FIGS. 16 and 17).

Then, the source electrode 12 is formed on the surface of the silicon carbide layer 10 by using a known process technique. In addition, the drain electrode 14 is formed on the back surface of the silicon carbide layer 10. By the manufacturing method described above, the MOSFET 100 shown in FIGS. 1 to 5 is manufactured.

Next, the function and effect of the semiconductor device and the semiconductor device manufacturing method of the first embodiment will be described.

A trench gate structure in which the gate electrode 16 is provided in the gate trench 21 is applied to the MOSFET 100. By applying the trench gate structure, the channel area per unit area is increased, and accordingly, the on-resistance of the MOSFET 100 is reduced.

The MOSFET 100 has the high concentration portion 28*b* in the body region 28. Due to the high concentration portion 28*b*, the short channel effect of the MOSFET 100 is suppressed. Therefore, it is possible to shorten the channel length of the MOSFET 100. Specifically, for example, it is possible to shorten the length of the first low concentration portion 28*a* in the depth direction (third direction) along the side surface of the gate trench 21. Therefore, the on-resistance of the MOSFET 100 is further reduced.

In addition, the MOSFET 100 has the gate trench bottom region 32 at the bottom of the gate trench 21. Due to the gate trench bottom region 32, the electric field applied to the gate insulating layer 18 at the bottom of the gate trench 21 is reduced when the MOSFET 100 is turned off. As a result, the reliability of the gate insulating layer 18 is improved.

For example, when the electric potential of the gate trench bottom region 32 is in a floating state, the switching loss of the MOSFET increases. For example, when the electric potential of the gate trench bottom region 32 is in a floating state, the switching loss increases because it takes time to discharge holes from the gate trench bottom region 32 when the MOSFET is turned off.

The MOSFET 100 has the connection region 34 for electrically connecting the gate trench bottom region 32 and the body region 28 to each other. Since the MOSFET 100 has the connection region 34, the electric potential of the gate trench bottom region 32 is fixed to the electric potential of the source electrode 12. Therefore, for example, when the MOSFET is turned off, the discharge of holes from the gate trench bottom region 32 is promoted. As a result, the switching loss of the MOSFET 100 can be reduced.

In addition, in the MOSFET 100, the gate trench 21 has the first region 21*a*, the second region 21*b*, and the third region 21*c*. The second region 21*b* is continuous with the first region 21*a*. The third region 21*c* is continuous with the second region 21*b*. Then, the first region 21*a* and the third region 21*c* extend in the first direction. The second region 21*b* extends in the second direction. The width of the first region 21*a* in the second direction is the first width w1. The width of the second region 21*b* in the second direction is the second width w2. The width of the third region 21*c* in the second direction is the third width w3. The second width w2 is larger than the first width w1. The second width w2 is larger than the third width w3.

Since the gate trench 21 of the MOSFET 100 has the above-described pattern, the high concentration portion 28*b* that suppresses the short channel effect of the MOSFET 100 and the connection region 34 that reduces the switching loss of the MOSFET 100 can be formed by the same ion implantation process. Specifically, the high concentration portion 28*b* and the connection region 34 can be formed at the same time by the second ion implantation and the third ion implantation described in the above manufacturing method. Therefore, since it is possible to suppress an increase in the number of manufacturing steps, it is possible to reduce the manufacturing cost of the MOSFET 100.

The second width w2 of the gate trench 21 is preferably equal to or more than twice the first width w1, more preferably equal to or more than three times the first width w1. As the second width w2 becomes larger, it becomes easier to form the connection region 34. For the same reason, the second width w2 is preferably equal to or more than twice the third width w3, more preferably equal to or more than three times the third width w3.

The second width w2 of the gate trench 21 is preferably equal to or less than 10 times the first width w1, more preferably equal to or less than 8 times the first width w1. As the second width w2 becomes smaller, the percentage of the channel forming region on the side surface of the gate trench 21 becomes higher. Therefore, since the channel area per unit area is increased, the on-resistance of the MOSFET 100 is reduced. For the same reason, the second width w2 is preferably equal to or less than 10 times the third width w3, more preferably equal to or less than 8 times the third width w3.

The length (d3 in FIG. 5) of the connection region 34 in the first direction is preferably equal to or less than 1.5 times the length (d4 in FIG. 5) of the second region 21*b* of the gate trench 21 in the first direction. By shortening the length of the connection region 34 in the first direction, the percentage of the channel forming region on the side surface of the gate trench 21 becomes higher. Therefore, since the channel area per unit area is increased, the on-resistance of the MOSFET 100 is reduced.

It is preferable that the part 26*a* of the drift region 26 is disposed between the gate trench 21 and the connection region 34. Since the part 26*a* of the drift region 26 is present between the gate trench 21 and the connection region 34, the first low concentration portion 28*a* directly above the gate trench 21 facing the connection region 34 functions as a channel forming region. Therefore, since the channel area per unit area is increased, the on-resistance of the MOSFET 100 is further reduced.

It is also preferable that the connection region 34 is disposed in the first direction of the second region 21b of the gate trench 21. Since the connection region 34 is also present in the first direction of the second region 21b, for example, when the MOSFET is turned off, the discharge of holes from the gate trench bottom region 32 is further promoted. Therefore, the switching loss of the MOSFET 100 can be further reduced.

As described above, according to the MOSFET 100 of the first embodiment, it is possible to realize the reduction of the on-resistance, the improvement of the reliability of the gate insulating layer, and the reduction of the switching loss at the same time. In addition, according to the MOSFET 100 and the MOSFET manufacturing method of the first embodiment, it is possible to reduce the manufacturing cost.

Second Embodiment

A semiconductor device of a second embodiment is different from the semiconductor device of the first embodiment in that the first trench has a fourth region that faces the second region in the first direction and is continuous with the first and third regions. Hereinafter, the description of a part of the content overlapping the first embodiment may be omitted.

The semiconductor device of the second embodiment is a vertical MOSFET 200 using silicon carbide. The MOSFET 200 is a MOSFET having a trench gate structure in which a gate electrode is provided in the trench. In addition, the MOSFET 200 is an n-channel MOSFET having electrons as carriers.

The MOSFET 200 of the second embodiment has a gate trench shape different from that of the MOSFET 100 of the first embodiment.

Figure 18:
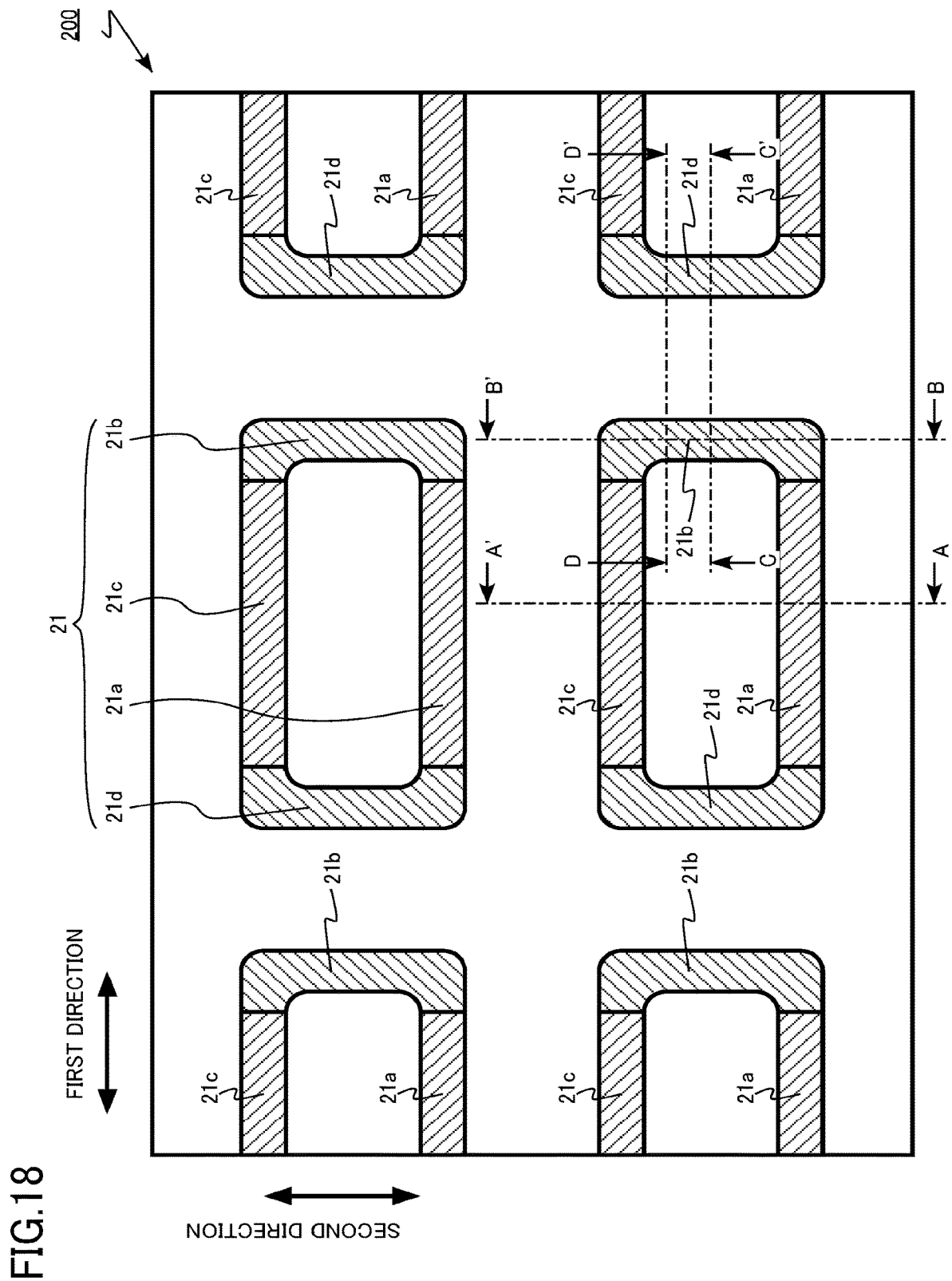
FIG. 18 is a schematic plan view of a semiconductor device of a second embodiment.
Figure 19:
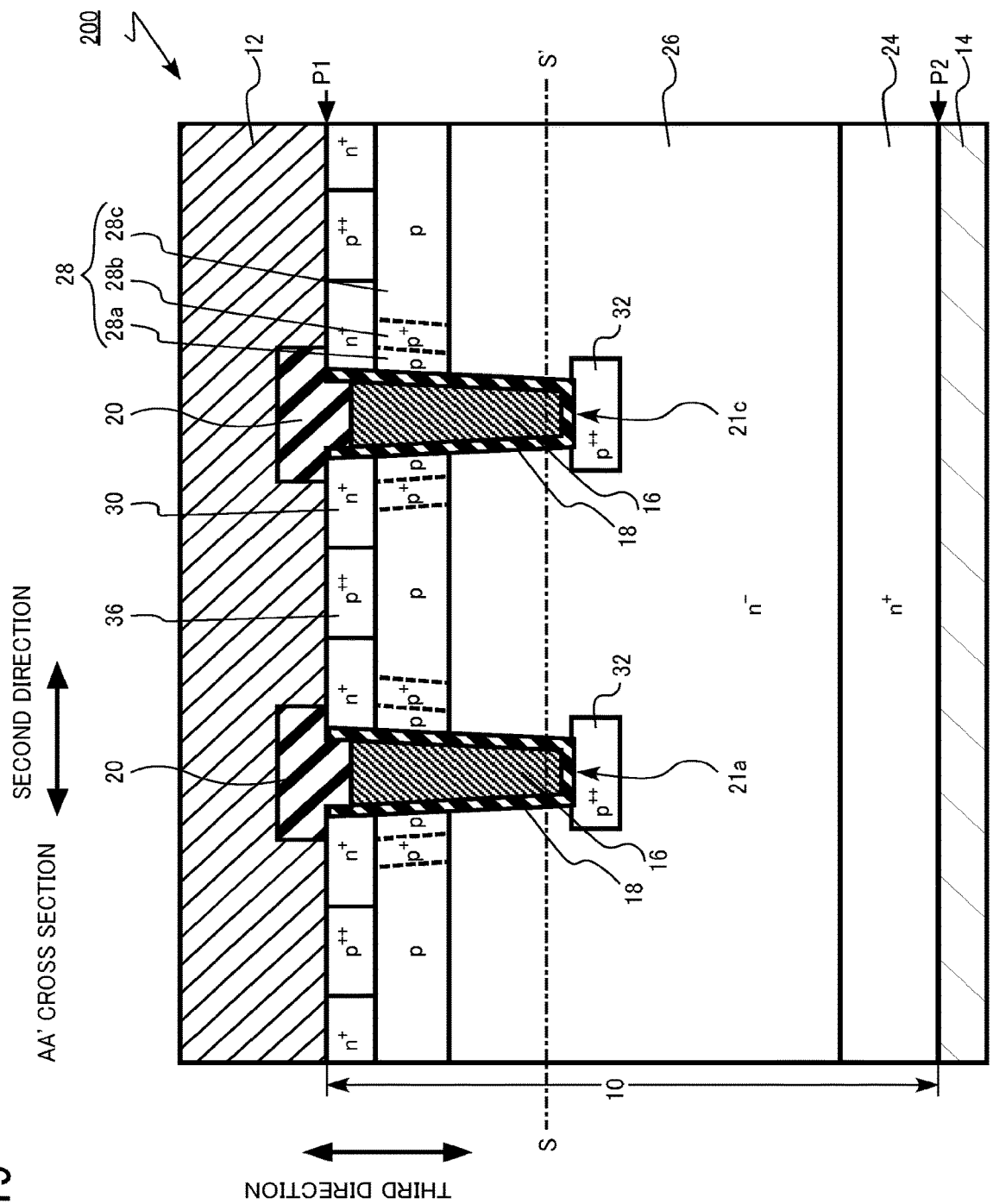
FIG. 19 is a schematic cross-sectional view of the semiconductor device of the second embodiment.
Figure 20:
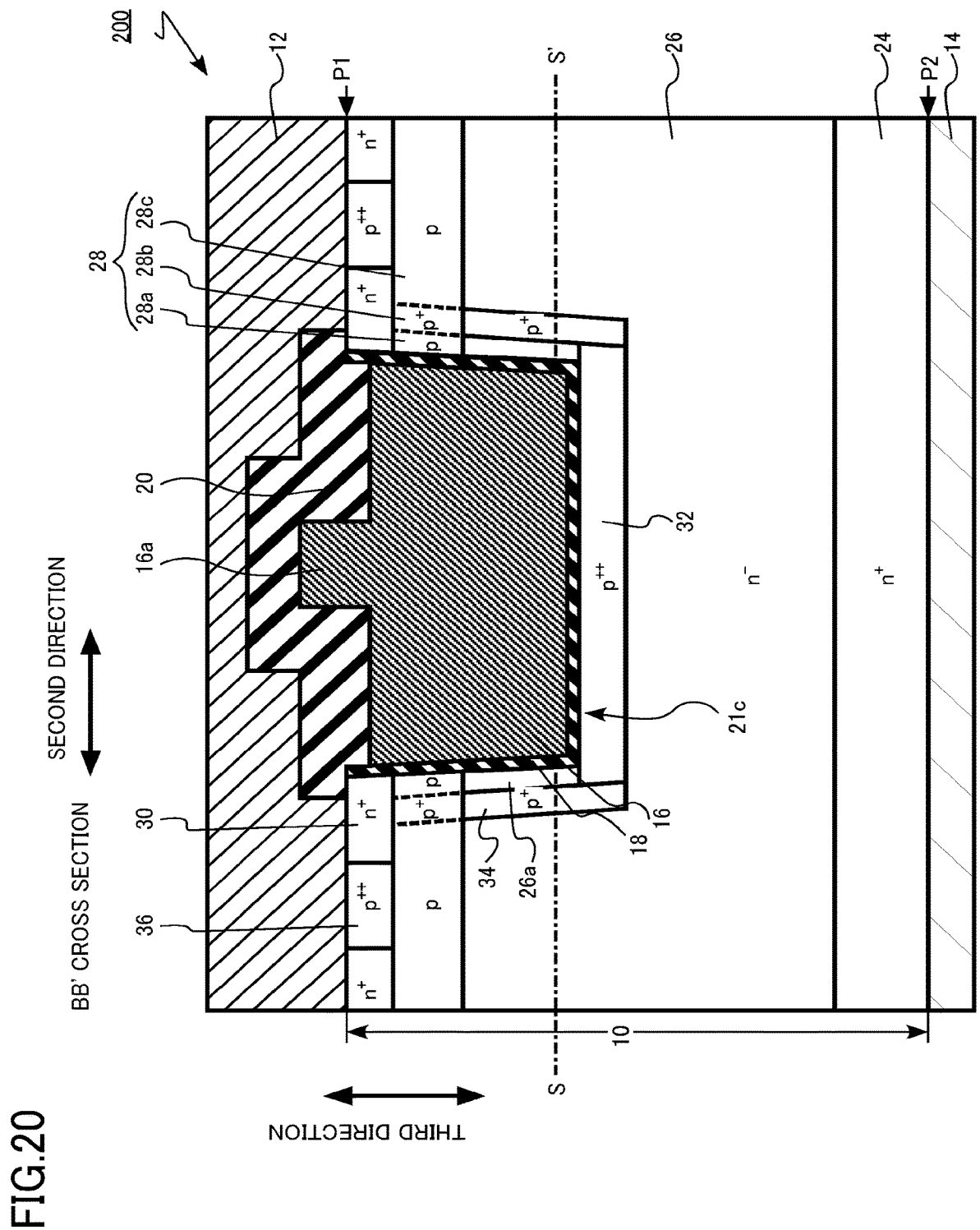
FIG. 20 is a schematic cross-sectional view of the semiconductor device of the second embodiment.
Figure 21:
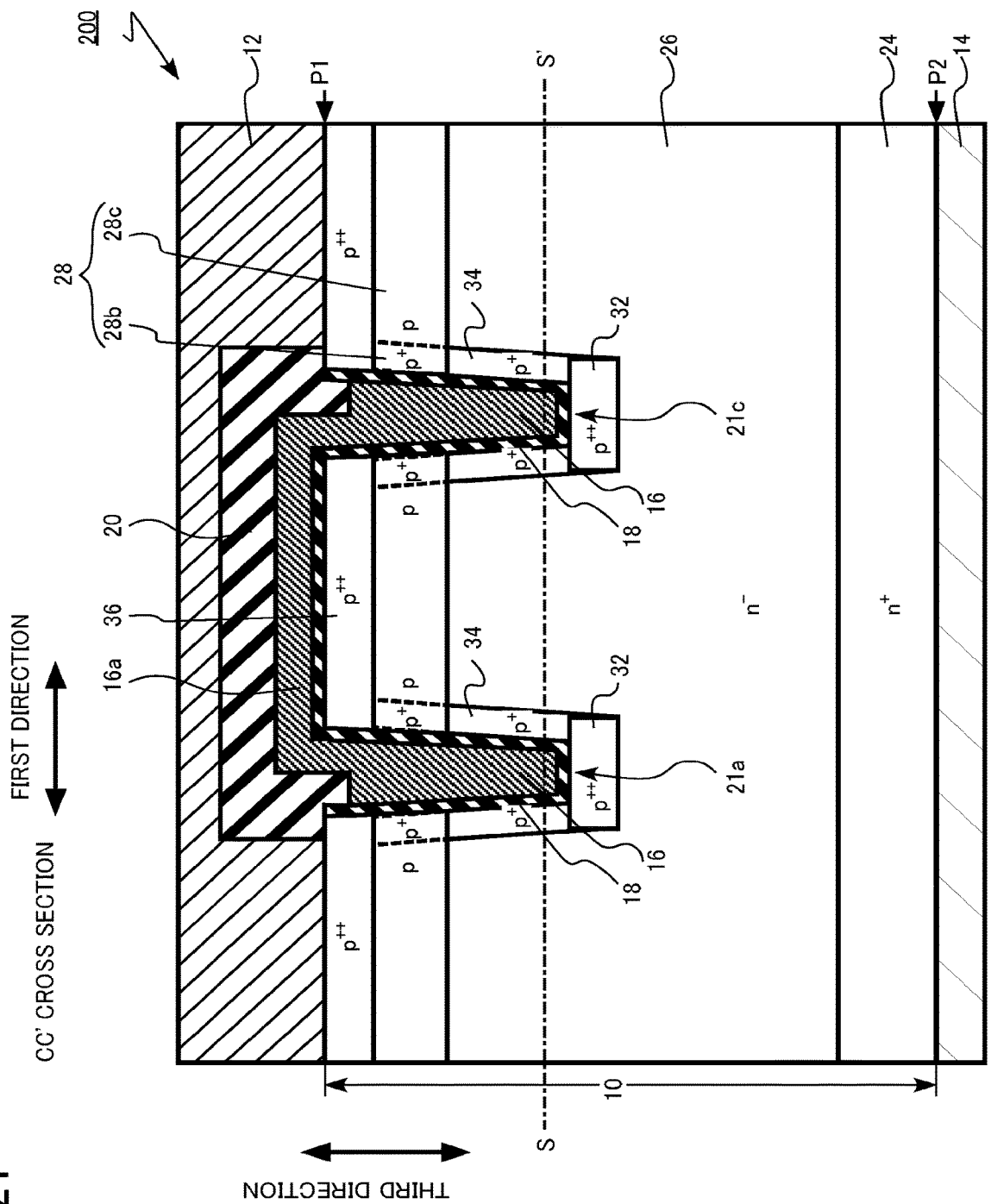
FIG. 21 is a schematic cross-sectional view of the semiconductor device of the second embodiment.
Figure 22:
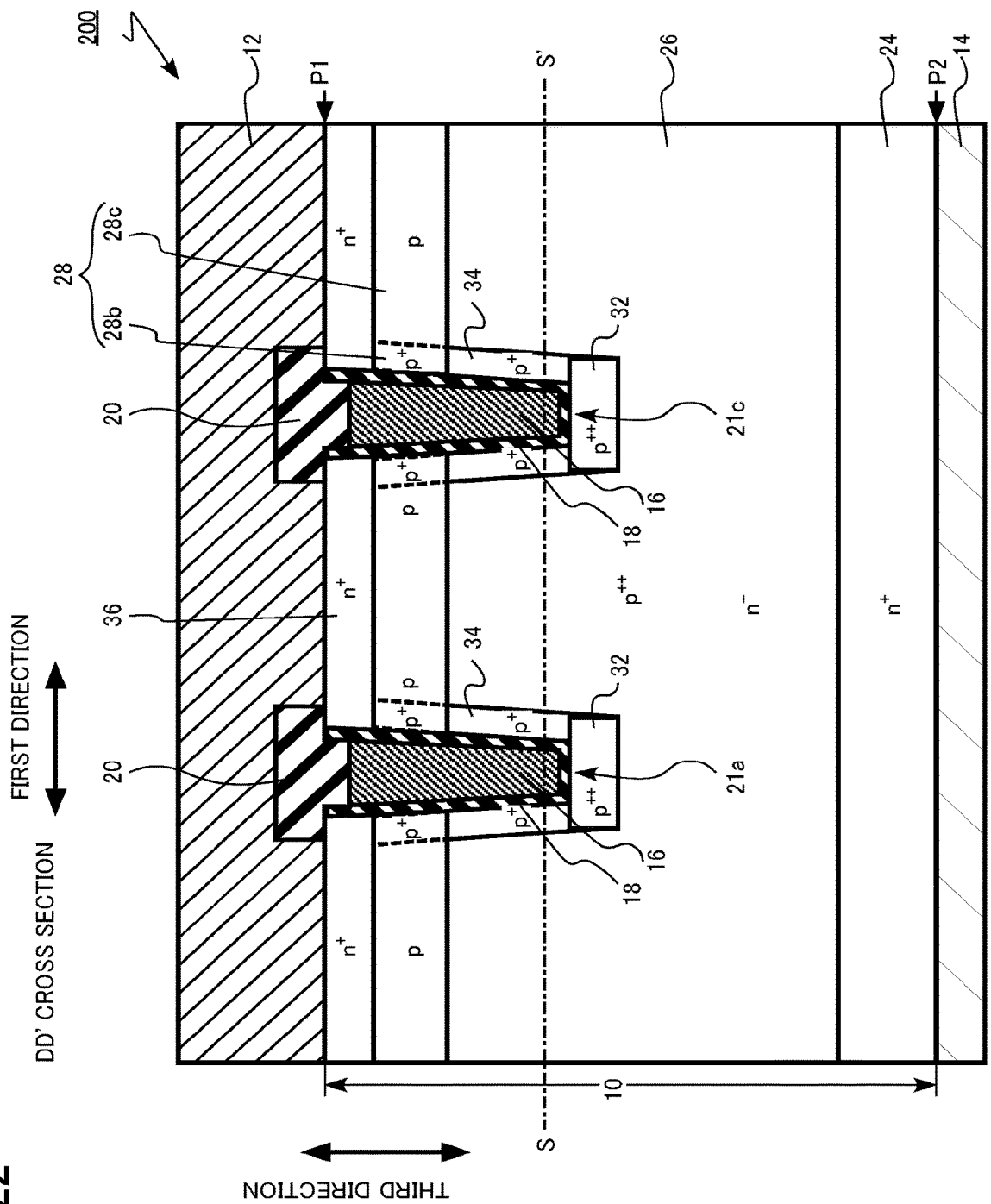
FIG. 22 is a schematic cross-sectional view of the semiconductor device of the second embodiment.
Figure 23:
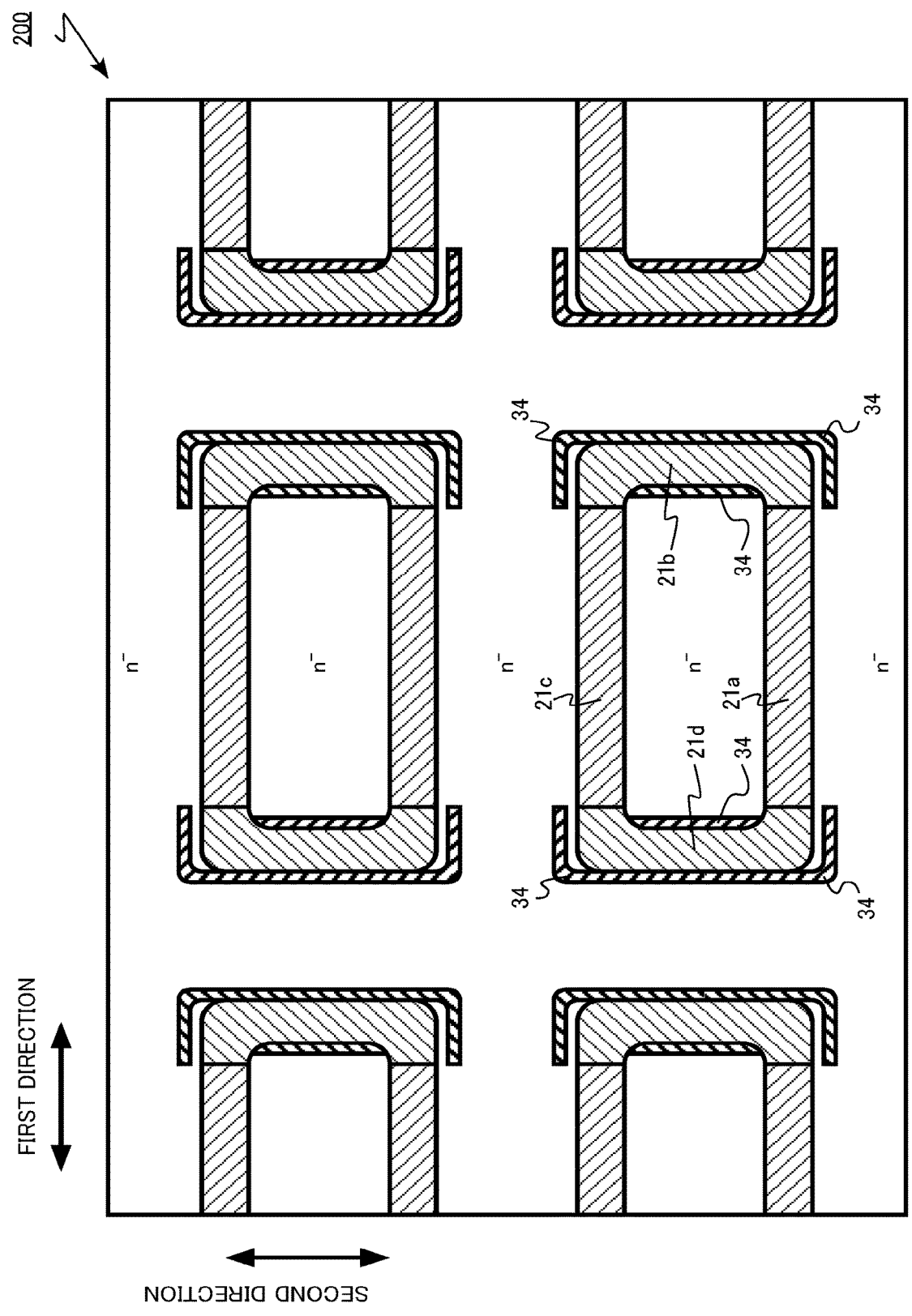
FIG. 23 is a schematic cross-sectional view of the semiconductor device of the second embodiment.

FIG. 18 is a schematic plan view of the semiconductor device of the second embodiment. FIG. 19 is a schematic cross-sectional view of the semiconductor device of the second embodiment. FIG. 20 is a schematic cross-sectional view of the semiconductor device of the second embodiment. FIG. 21 is a schematic cross-sectional view of the semiconductor device of the second embodiment. FIG. 22 is a schematic cross-sectional view of the semiconductor device of the second embodiment. FIG. 23 is a schematic cross-sectional view of the semiconductor device of the second embodiment.

FIG. 18 is a diagram showing a pattern of a first trench on the first face P1 of the silicon carbide layer. FIG. 19 is a cross-sectional view taken along the line AA' of FIG. 18. FIG. 20 is a cross-sectional view taken along the line BB' of FIG. 18. FIG. 21 is a cross-sectional view taken along the line CC' of FIG. 18. FIG. 22 is a cross-sectional view taken along the line DD' of FIG. 18. FIG. 23 is a cross-sectional view taken along the line SS' of FIGS. 19, 20, 21, and 22. FIG. 23 is a diagram showing a pattern of a first trench and a pattern of a fifth silicon carbide region.

The MOSFET 200 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 has a gate trench 21 (first trench), an $n^+$-type drain region 24, an $n^-$-type drift region 26 (first silicon carbide region), a p-type body region 28 (second silicon carbide region), an $n^+$-type source region 30 (third silicon carbide region), a $p^{++}$-type gate trench bottom region 32 (fourth silicon carbide region), a $p^+$-type connection region 34 (fifth silicon carbide region), and a $p^{++}$-type contact region 36.

The gate trench 21 has a first region 21a, a second region 21b, a third region 21c, and a fourth region 21d. The p-type body region 28 (second silicon carbide region) has a first low concentration portion 28a (first portion), a high concentration portion 28b (second portion), and a second low concentration portion 28c.

The gate electrode 16 includes a crosslinked portion 16a.

The source electrode 12 is an example of the first electrode. The drain electrode 14 is an example of the second electrode. The gate trench 21 is an example of the first trench. The drift region 26 is an example of the first silicon carbide region. The body region 28 is an example of the second silicon carbide region. The source region 30 is an example of the third silicon carbide region. The gate trench bottom region 32 is an example of the fourth silicon carbide region. The connection region 34 is an example of the fifth silicon carbide region. The first low concentration portion 28a is an example of the first portion. The high concentration portion 28b is an example of the second portion.

The gate trench 21 has the first region 21a, the second region 21b, the third region 21c, and the fourth region 21d. The second region 21b is continuous with the first region 21a. The third region 21c is continuous with the second region 21b. The fourth region 21d is continuous with the third region 21c and the first region 21a. The gate trench 21 has an annular shape.

The first region 21a and the third region 21c extend in the first direction. The second region 21b and the fourth region 21d extend in the second direction.

The first region 21a faces the third region 21c in the second direction. The first region 21a is repeatedly arranged in the second direction. The third region 21c is repeatedly arranged in the second direction. The third region 21c is interposed between the two first regions 21a.

The second region 21b is repeatedly arranged in the first direction. The second region 21b faces the fourth region 21d in the first direction.

The silicon carbide layer 10 of the MOSFET 200 includes a plurality of annular gate trenches 21 separated from each other.

The gate electrode 16 includes the crosslinked portion 16a as shown in FIGS. 20 and 21. The crosslinked portion 16a has a function of electrically connecting the gate electrodes 16 in the two gate trenches 21, which are spaced from each other so as to be adjacent to each other in the second direction, to each other.

The MOSFET 200 of the second embodiment can be manufactured by changing the pattern for forming the gate trench 21 and the pattern for processing the gate electrode 16 from those in the MOSFET manufacturing method of the first embodiment.

As described above, according to the MOSFET 200 of the second embodiment, it is possible to realize the reduction of the on-resistance, the improvement of the reliability of the gate insulating layer, and the reduction of the switching loss at the same time. In addition, according to the MOSFET 200 and the MOSFET manufacturing method of the second embodiment, it is possible to reduce the manufacturing cost.

Third Embodiment

A semiconductor device of a third embodiment is different from the semiconductor device of the first embodiment in that the pattern of the first trench is different. Hereinafter, the description of a part of the content overlapping the first embodiment may be omitted.

The semiconductor device of the third embodiment is a vertical MOSFET 300 using silicon carbide. The MOSFET 300 is a MOSFET having a trench gate structure in which a gate electrode is provided in the trench. In addition, the MOSFET 300 is an n-channel MOSFET having electrons as carriers.

The MOSFET 300 of the third embodiment has a gate trench shape different from that of the MOSFET 100 of the first embodiment.

Figure 24:
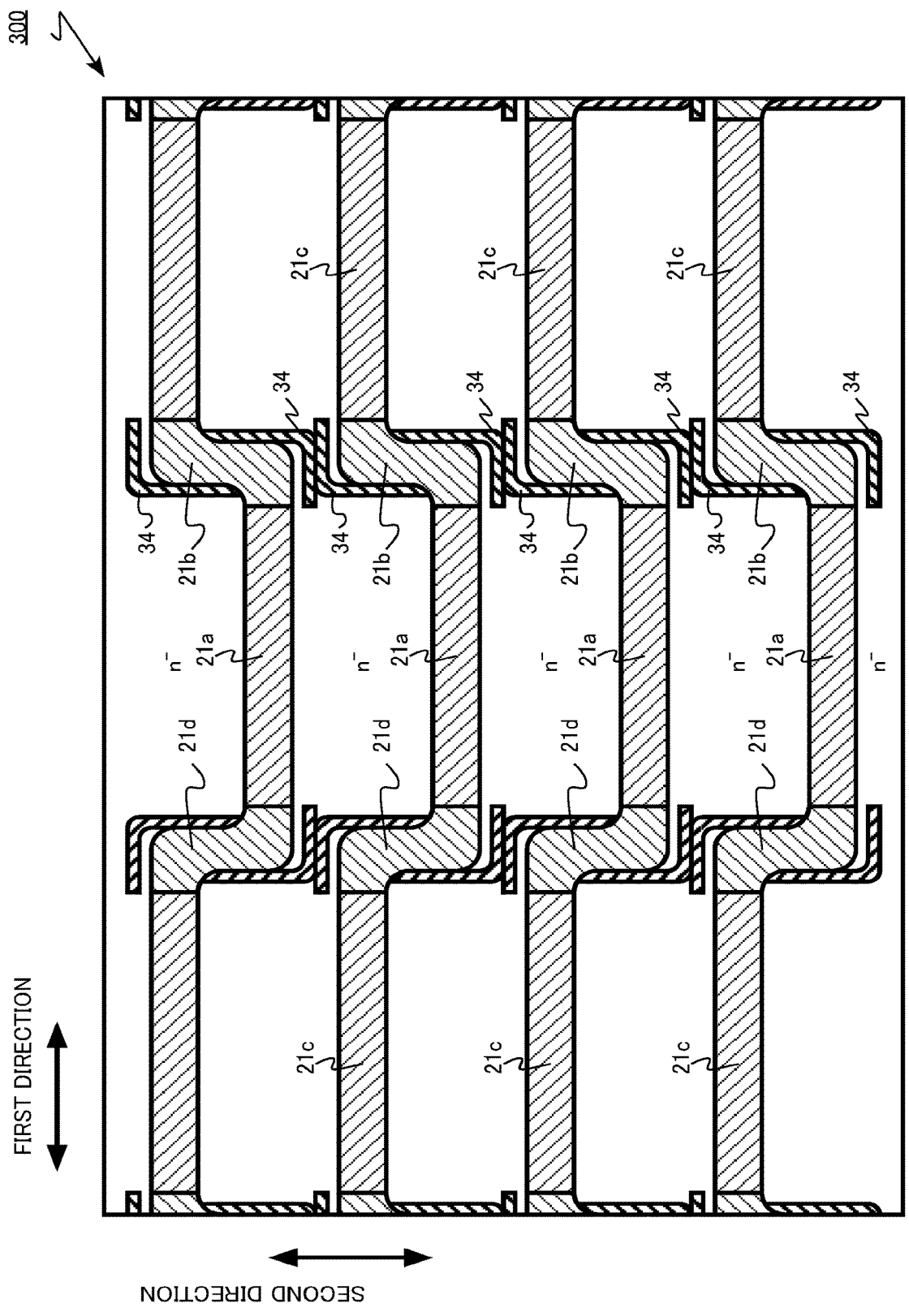
FIG. 24 is a schematic cross-sectional view of a semiconductor device of a third embodiment.

FIG. 24 is a schematic cross-sectional view of the semiconductor device of the third embodiment. FIG. 24 is a diagram showing a pattern of a first trench and a pattern of a fifth silicon carbide region. FIG. 24 is a diagram corresponding to FIG. 5 of the first embodiment.

The gate trench 21 has a first region 21a, a second region 21b, a third region 21c, and a fourth region 21d. The second region 21b is continuous with the first region 21a. The third region 21c is continuous with the second region 21b. The fourth region 21d is continuous with the third region 21c and the first region 21a.

The first region 21a and the third region 21c extend in the first direction. The second region 21b and the fourth region 21d extend in the second direction.

The first region 21a is repeatedly arranged in the second direction. The third region 21c is repeatedly arranged in the second direction.

Figure 25:
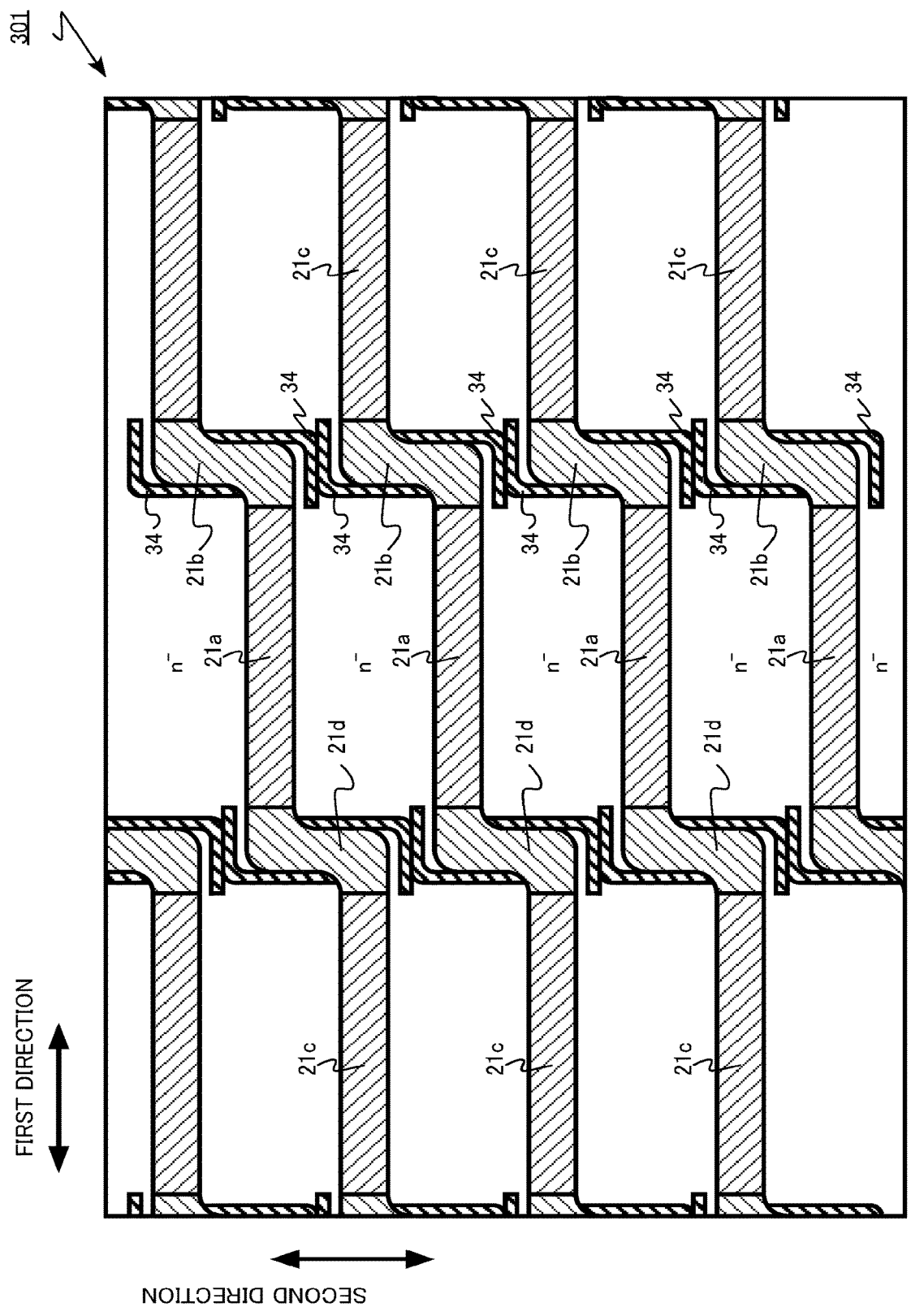
FIG. 25 is a schematic cross-sectional view of a first modification example of the semiconductor device of the third embodiment.

FIG. 25 is a schematic cross-sectional view of a first modification example of the semiconductor device of the third embodiment. FIG. 25 is a diagram showing a pattern of a first trench and a pattern of a fifth silicon carbide region. FIG. 25 is a diagram corresponding to FIG. 24 of the third embodiment.

A MOSFET 301 of the first modification example of the third embodiment has a gate trench shape different from that of the MOSFET 300 of the third embodiment.

Figure 26:
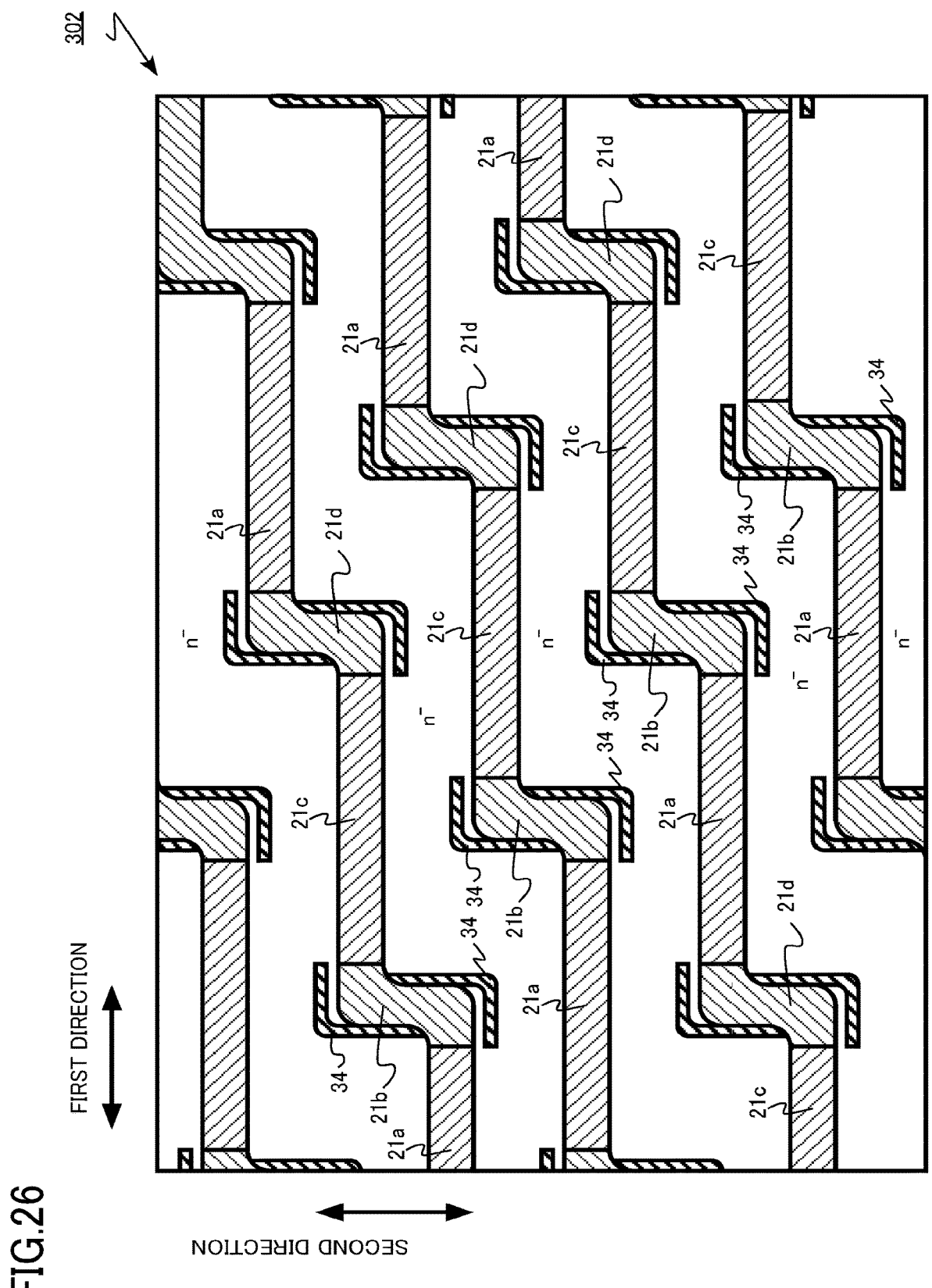
FIG. 26 is a schematic cross-sectional view of a second modification example of the semiconductor device of the third embodiment.

FIG. 26 is a schematic cross-sectional view of a second modification example of the semiconductor device of the third embodiment. FIG. 26 is a diagram showing a pattern of a first trench and a pattern of a fifth silicon carbide region. FIG. 26 is a diagram corresponding to FIG. 24 of the third embodiment.

A MOSFET 302 of the second modification example of the third embodiment has a gate trench shape different from that of the MOSFET 300 of the third embodiment.

The MOSFETs 300, 301, and 302 of the third embodiment and its modification examples can be manufactured by changing the pattern for forming the gate trench 21 from that in the MOSFET manufacturing method of the first embodiment.

As described above, according to the MOSFETs 300, 301, and 302 of the third embodiment and its modification examples, it is possible to realize the reduction of the on-resistance, the improvement of the reliability of the gate insulating layer, and the reduction of the switching loss at the same time. In addition, according to the MOSFET manufacturing methods of the third embodiment and its modification examples, it is possible to reduce the manufacturing cost.

Fourth Embodiment

A semiconductor device of a fourth embodiment is different from the semiconductor device of the first embodiment in that the silicon carbide layer further includes a second trench which is adjacent to the first region in the second direction, is disposed on the first face side, and extends in the first direction and in which a part of the first electrode is disposed. Hereinafter, the description of a part of the content overlapping the first embodiment may be omitted.

The semiconductor device of the fourth embodiment is a vertical MOSFET 400 using silicon carbide. The MOSFET 400 is a MOSFET having a trench gate structure in which a gate electrode is provided in the trench. In addition, the MOSFET 400 is a MOSFET having a so-called double trench structure in which a source electrode is provided in the trench. In addition, the MOSFET 400 is an n-channel MOSFET having electrons as carriers.

Figure 27:
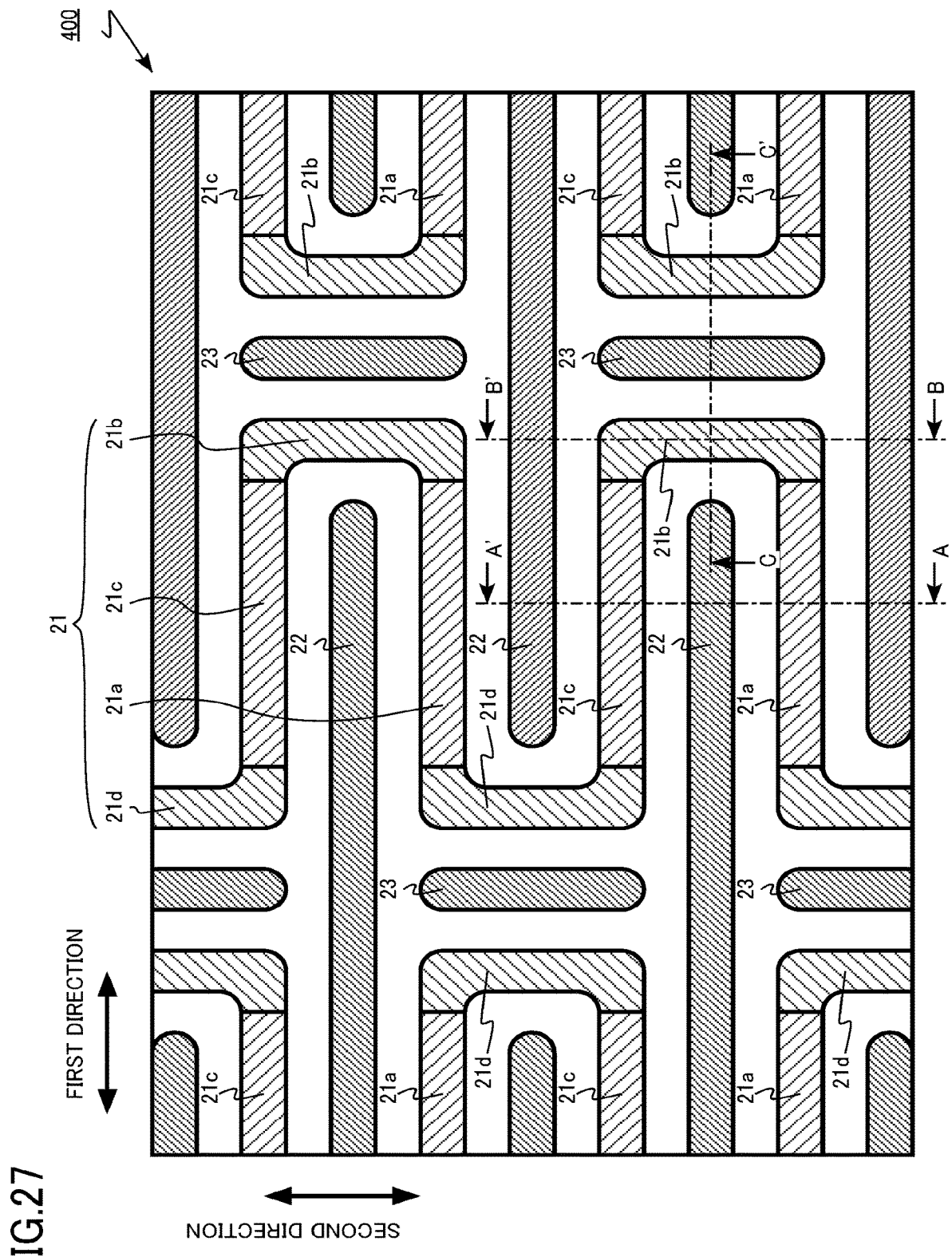
FIG. 27 is a schematic plan view of a semiconductor device of a fourth embodiment.
Figure 28:
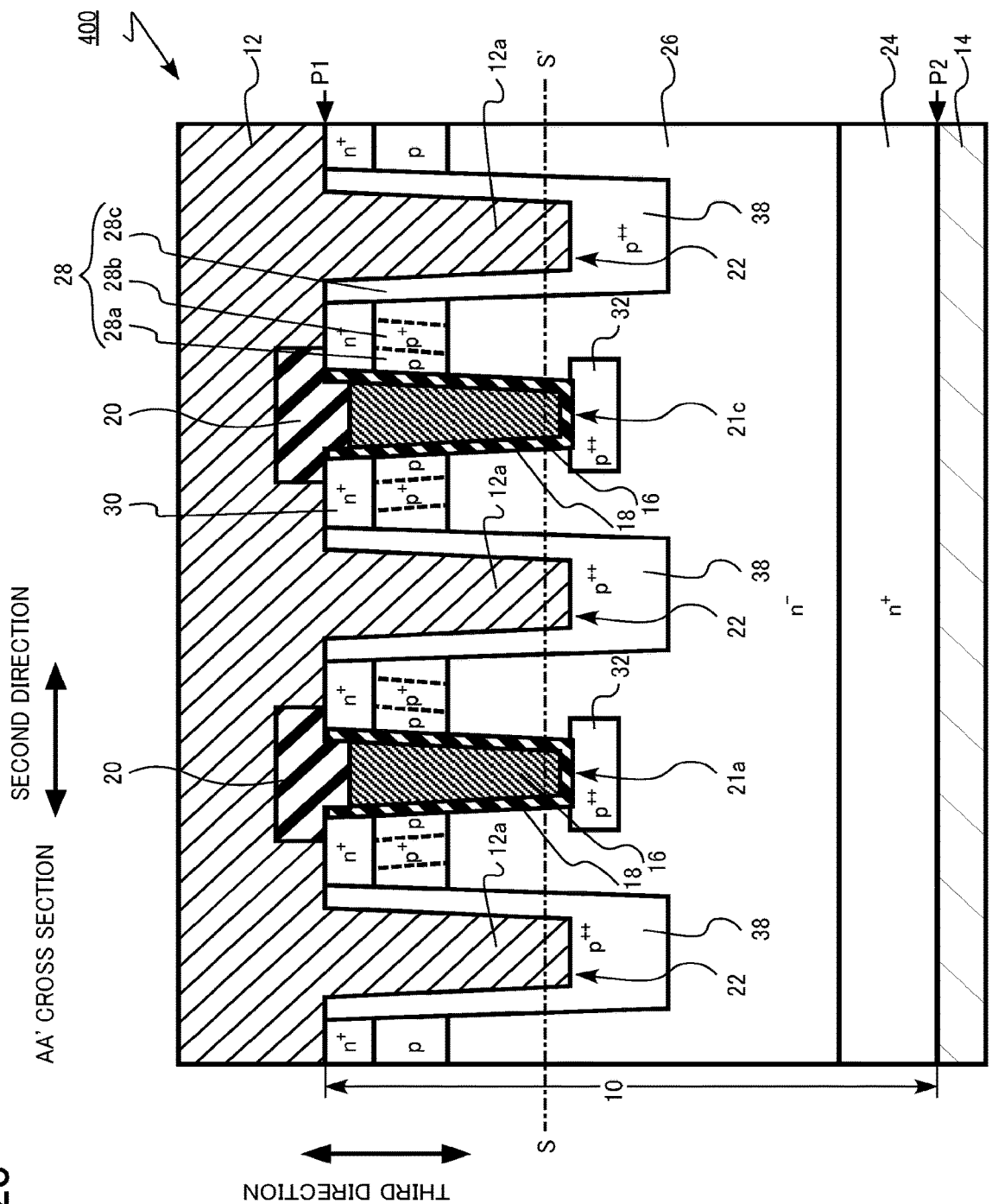
FIG. 28 is a schematic cross-sectional view of the semiconductor device of the fourth embodiment.
Figure 29:
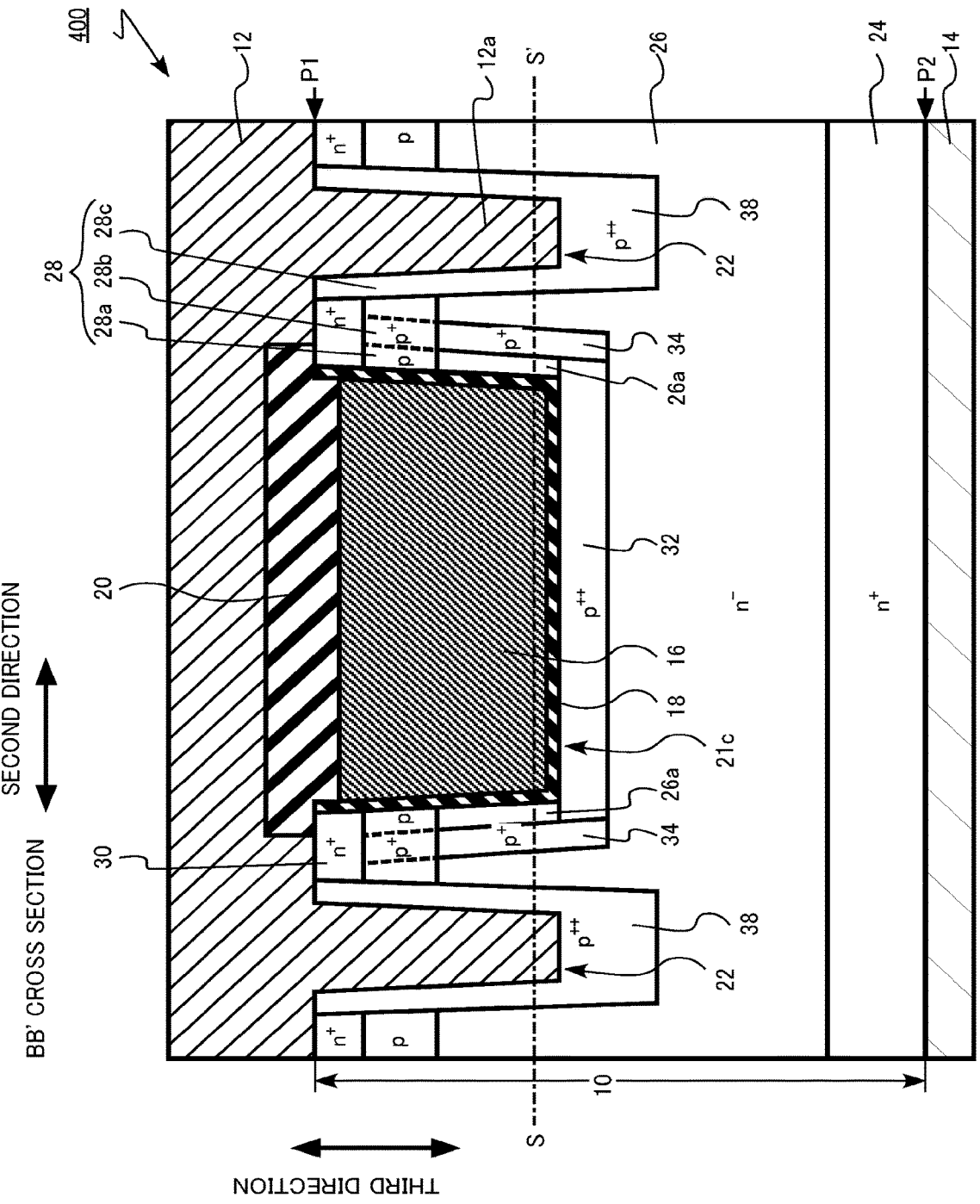
FIG. 29 is a schematic cross-sectional view of the semiconductor device of the fourth embodiment.
Figure 30:
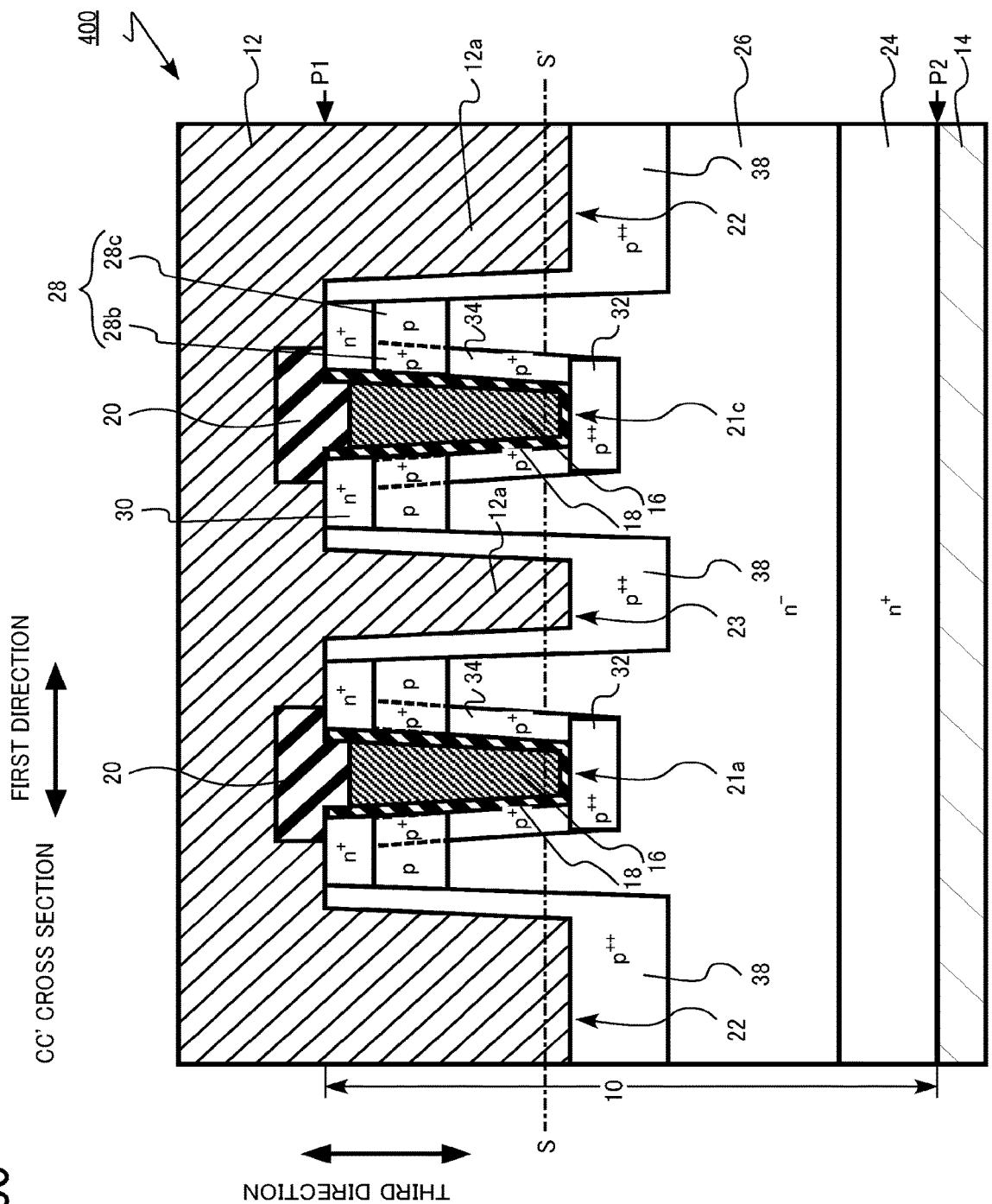
FIG. 30 is a schematic cross-sectional view of the semiconductor device of the fourth embodiment.
Figure 31:
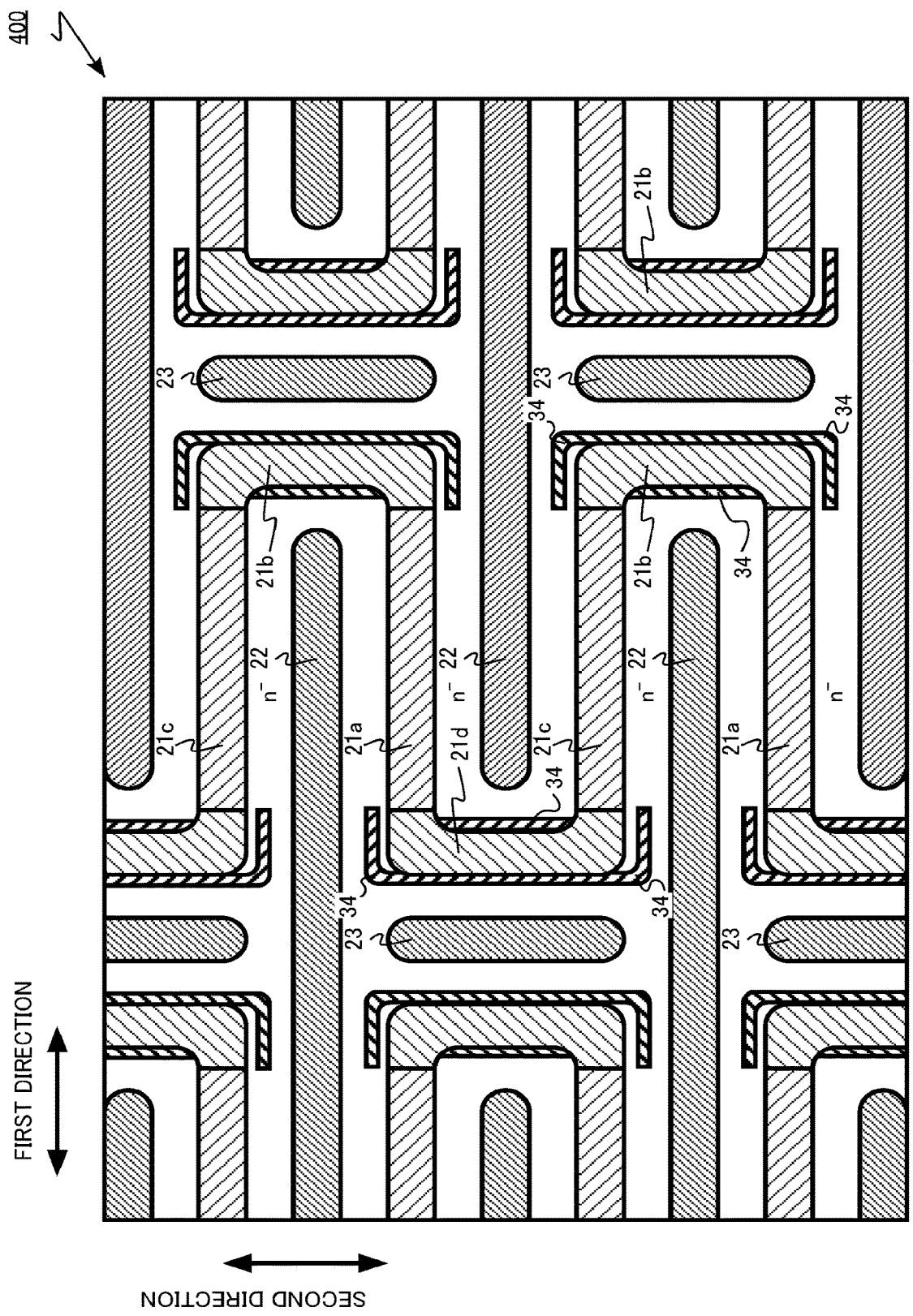
FIG. 31 is a schematic cross-sectional view of the semiconductor device of the fourth embodiment.

FIG. 27 is a schematic plan view of the semiconductor device of the fourth embodiment. FIG. 28 is a schematic cross-sectional view of the semiconductor device of the fourth embodiment. FIG. 29 is a schematic cross-sectional view of the semiconductor device of the fourth embodiment. FIG. 30 is a schematic cross-sectional view of the semiconductor device of the fourth embodiment. FIG. 31 is a schematic cross-sectional view of the semiconductor device of the fourth embodiment.

FIG. 27 is a diagram showing a pattern of a first trench and a second trench on the first face P1 of the silicon carbide layer. FIG. 28 is a cross-sectional view taken along the line AA' of FIG. 27. FIG. 29 is a cross-sectional view taken along the line BB' of FIG. 27. FIG. 30 is a cross-sectional view taken along the line CC' of FIG. 28. FIG. 31 is a cross-sectional view taken along the line SS' of FIGS. 28, 29, and 30. FIG. 31 is a diagram showing patterns of a first trench and a second trench and a pattern of a fifth silicon carbide region.

The MOSFET 400 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 has a gate trench 21 (first trench), a contact trench 22 (second trench), an auxiliary trench 23, an $n^+$-type drain region 24, an $n^-$-type drift region 26 (first silicon carbide region), a p-type body region 28 (second silicon carbide region), an $n^+$-type source region 30 (third silicon carbide region), a $p^{++}$-type gate trench bottom region 32 (fourth silicon carbide region), a $p^|$-type connection region 34 (fifth silicon carbide region), and a $p^{++}$-type electric field relaxation region 38.

The gate trench 21 has a first region 21a, a second region 21b, a third region 21c, and a fourth region 21d. The p-type body region 28 (second silicon carbide region) has a first low concentration portion 28a (first portion), a high concentration portion 28b (second portion), and a second low concentration portion 28c.

The source electrode 12 is an example of the first electrode. The drain electrode 14 is an example of the second electrode. The gate trench 21 is an example of the first trench. The drift region 26 is an example of the first silicon carbide region. The body region 28 is an example of the second silicon carbide region. The source region 30 is an example of the third silicon carbide region. The gate trench bottom region 32 is an example of the fourth silicon carbide region. The connection region 34 is an example of the fifth silicon carbide region. The first low concentration portion 28a is an example of the first portion. The high concentration portion 28b is an example of the second portion.

The gate trench 21 has the first region 21a, the second region 21b, the third region 21c, and the fourth region 21d. The second region 21b is continuous with the first region 21a. The third region 21c is continuous with the second region 21b. The fourth region 21d is continuous with the third region 21c.

The contact trench 22 is present in the silicon carbide layer 10. The contact trench 22 is disposed on the first face P1 side of the silicon carbide layer 10. The contact trench 22 is a groove formed in the silicon carbide layer 10.

The contact trench 22 is adjacent to the first region 21a of the gate trench 21 in the second direction. The contact trench 22 extends in the first direction. A part 12a of the source electrode 12 is disposed inside the contact trench 22.

The auxiliary trench 23 is present in the silicon carbide layer 10. The auxiliary trench 23 is disposed on the first face P1 side of the silicon carbide layer 10. The auxiliary trench 23 is a groove formed in the silicon carbide layer 10.

The auxiliary trench 23 is adjacent to the second region 21b of the gate trench 21 in the first direction. The auxiliary trench 23 extends in the second direction. A part 12a of the source electrode 12 is disposed inside the auxiliary trench 23.

The p$^+$-type electric field relaxation region 38 is disposed between the contact trench 22 and the drift region 26. The electric field relaxation region 38 is in contact with the bottom surface and the side surface of the contact trench 22. The electric field relaxation region 38 is in contact with a part 12a of the source electrode 12 in the contact trench 22.

The p$^{++}$-type electric field relaxation region 38 is disposed between the auxiliary trench 23 and the drift region 26. The electric field relaxation region 38 is in contact with the bottom surface and the side surface of the auxiliary trench 23. The electric field relaxation region 38 is in contact with a part 12a of the source electrode 12 in the auxiliary trench 23.

The electric field relaxation region 38 has a function of reducing the electric field applied to the gate insulating layer 18 when the MOSFET 400 is turned off. The electric field relaxation region 38 is fixed to, for example, the same electric potential as the electric potential of the source electrode 12.

The electric field relaxation region 38 contains, for example, aluminum (Al) as a p-type impurity. The p-type impurity concentration in the electric field relaxation region 38 is higher than the p-type impurity concentration in the body region 28. The p-type impurity concentration in the electric field relaxation region 38 is, for example, equal to or more than $5 \times 10^{17}$ cm$^{-3}$ and equal to or less than $5 \times 10^{20}$ cm$^{-3}$.

The MOSFET 400 of the fourth embodiment can be manufactured by adding steps of forming the contact trench 22 and the auxiliary trench 23 and a step of forming the electric field relaxation region 38 to the MOSFET manufacturing method of the first embodiment.

In addition, the contact trench 22 and the auxiliary trench 23 may be connected to each other in the second direction.

Figure 32:
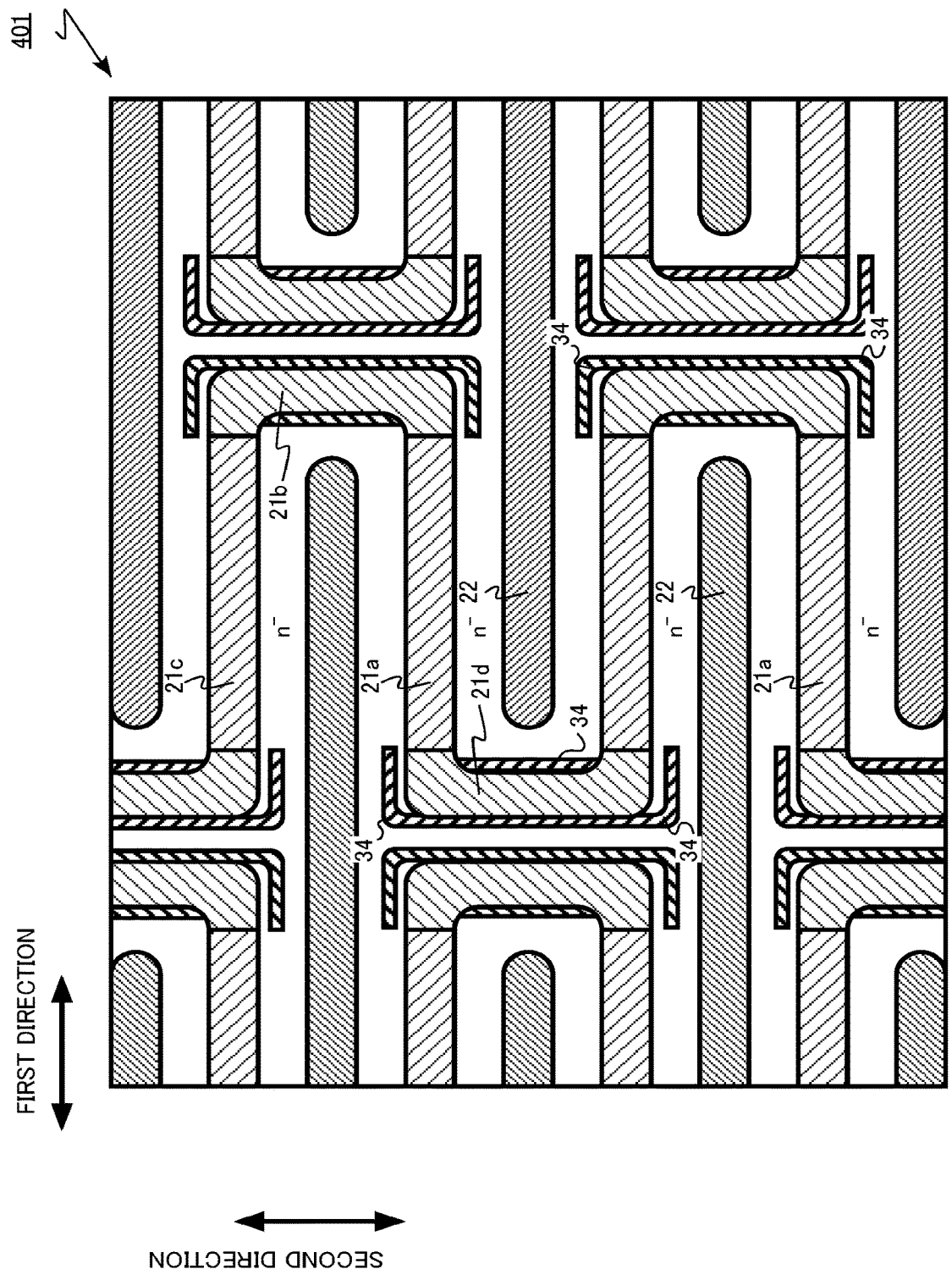
FIG. 32 is a schematic cross-sectional view of a modification example of the semiconductor device of the fourth embodiment.

FIG. 32 is a schematic cross-sectional view of a modification example of the semiconductor device of the fourth embodiment. FIG. 32 is a diagram showing patterns of a first trench and a second trench and a pattern of a fifth silicon carbide region. FIG. 32 is a diagram corresponding to FIG. 31 of the fourth embodiment.

A MOSFET 401 of a modification example of the fourth embodiment is different from the MOSFET 400 of the fourth embodiment in that the silicon carbide layer 10 does not include the auxiliary trench 23.

According to the MOSFET 401 of the modification example, the channel area per unit area is increased as compared with the MOSFET 400. Therefore, the on-resistance of the MOSFET 401 is further reduced.

As described above, according to the MOSFETs 400 and 401 of the fourth embodiment and its modification example, it is possible to realize the reduction of the on-resistance, the improvement of the reliability of the gate insulating layer, and the reduction of the switching loss at the same time. In addition, according to the MOSFETs 400 and 401 and the MOSFET manufacturing method of the fourth embodiment and its modification example, it is possible to reduce the manufacturing cost.

Fifth Embodiment

A semiconductor device of a fifth embodiment is different from the semiconductor device of the second embodiment in that the silicon carbide layer further includes a second trench which is adjacent to the first region in the second direction, is disposed on the first face side, and extends in the first direction and in which a part of the first electrode is disposed. Hereinafter, the description of a part of the content overlapping the second embodiment may be omitted.

The semiconductor device of the fifth embodiment is a vertical MOSFET 500 using silicon carbide. The MOSFET 500 is a MOSFET having a trench gate structure in which a gate electrode is provided in the trench. In addition, the MOSFET 500 is a MOSFET having a so-called double trench structure in which a source electrode is provided in the trench. In addition, the MOSFET 500 is an n-channel MOSFET having electrons as carriers.

Figure 33:
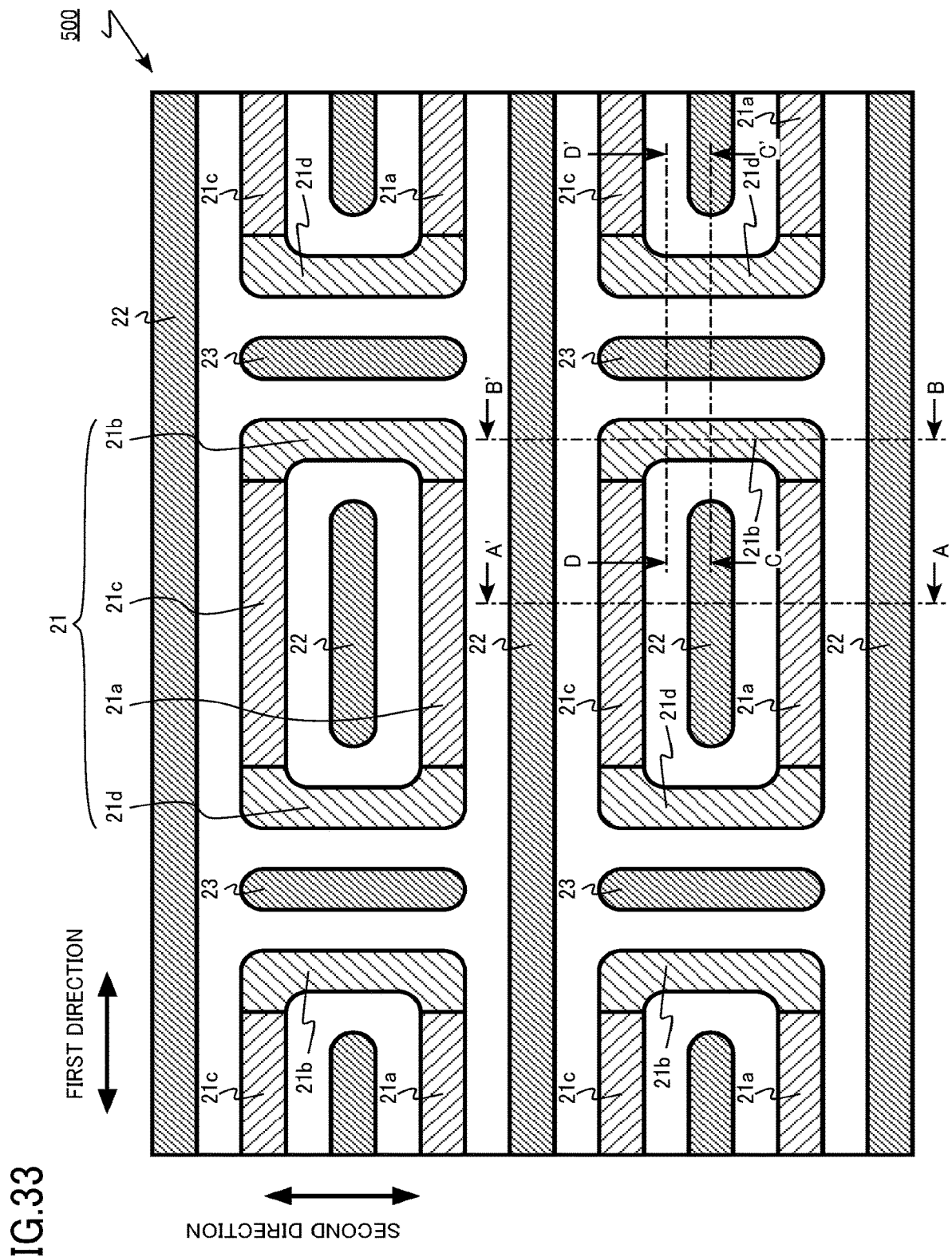
FIG. 33 is a schematic plan view of a semiconductor device of a fifth embodiment.
Figure 34:
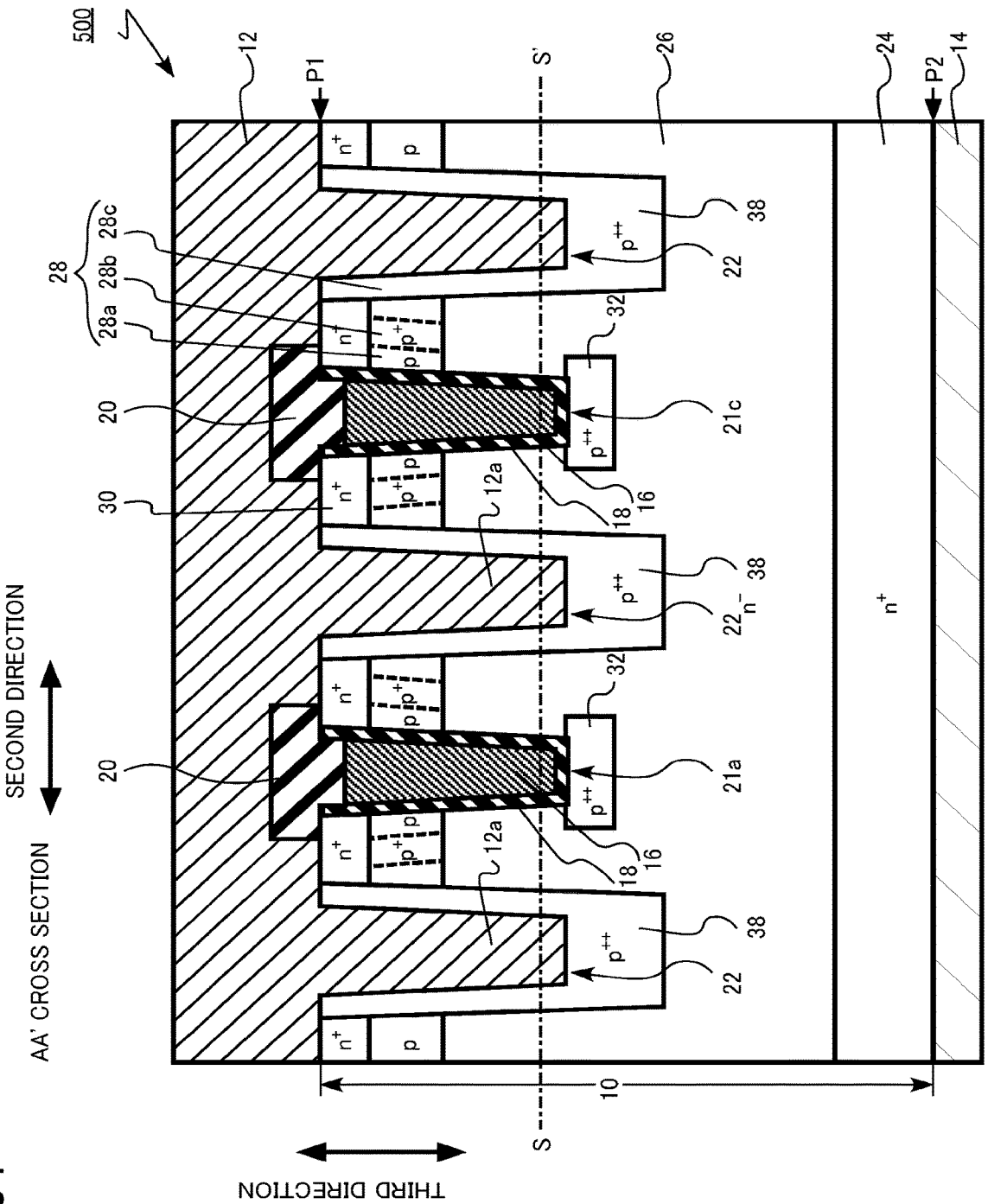
FIG. 34 is a schematic cross-sectional view of the semiconductor device of the fifth embodiment.
Figure 35:
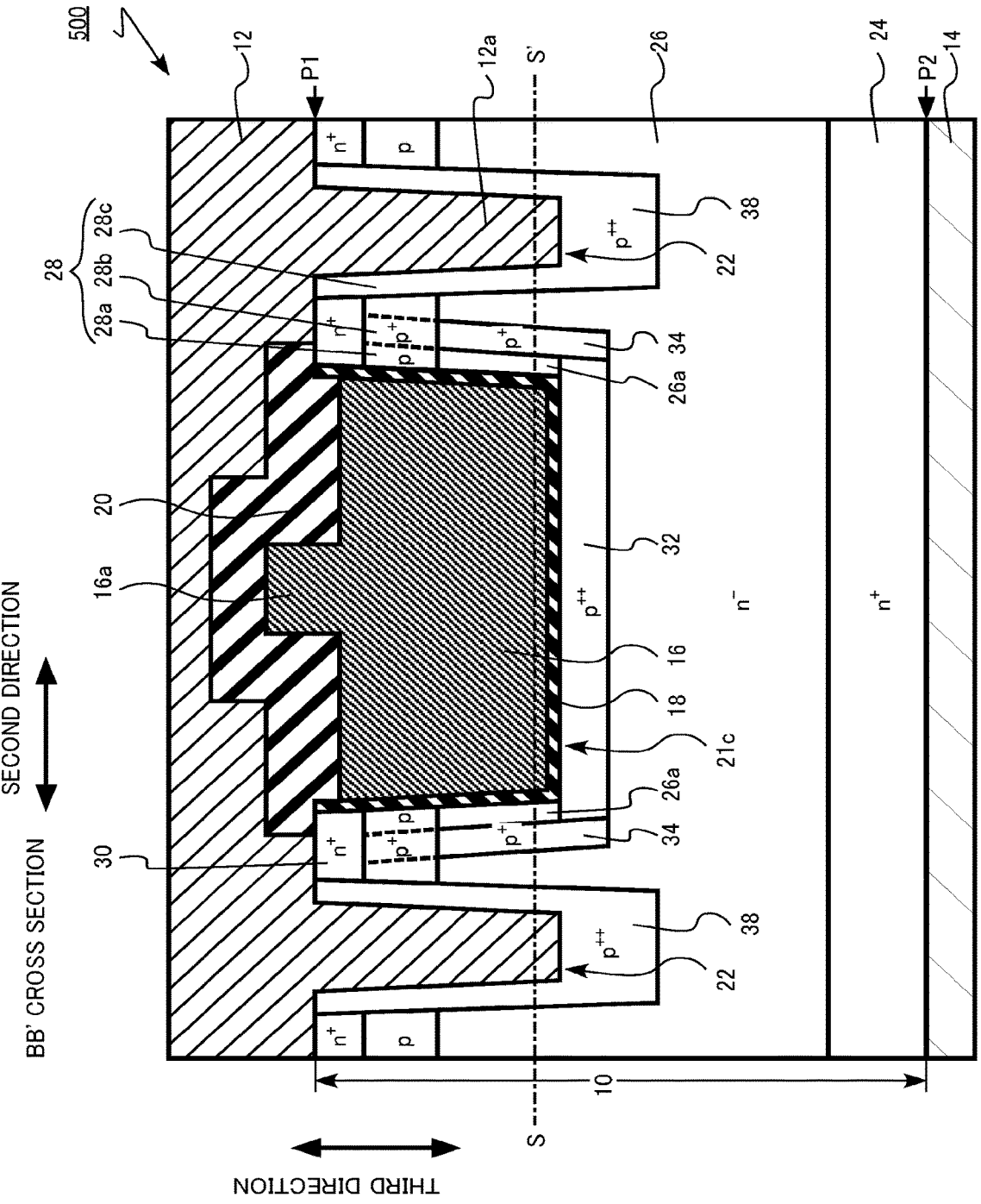
FIG. 35 is a schematic cross-sectional view of the semiconductor device of the fifth embodiment.
Figure 36:
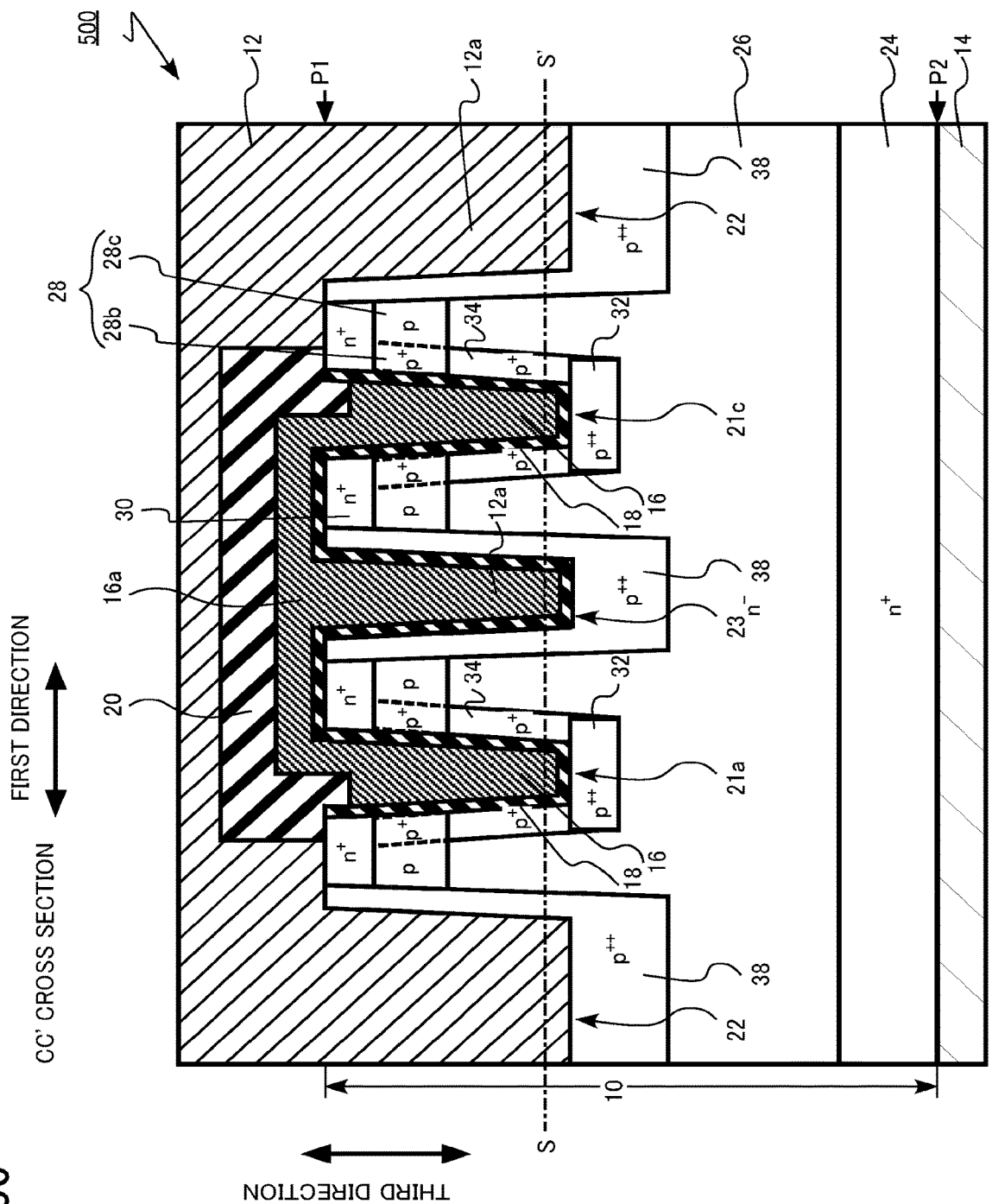
FIG. 36 is a schematic cross-sectional view of the semiconductor device of the fifth embodiment.
Figure 37:
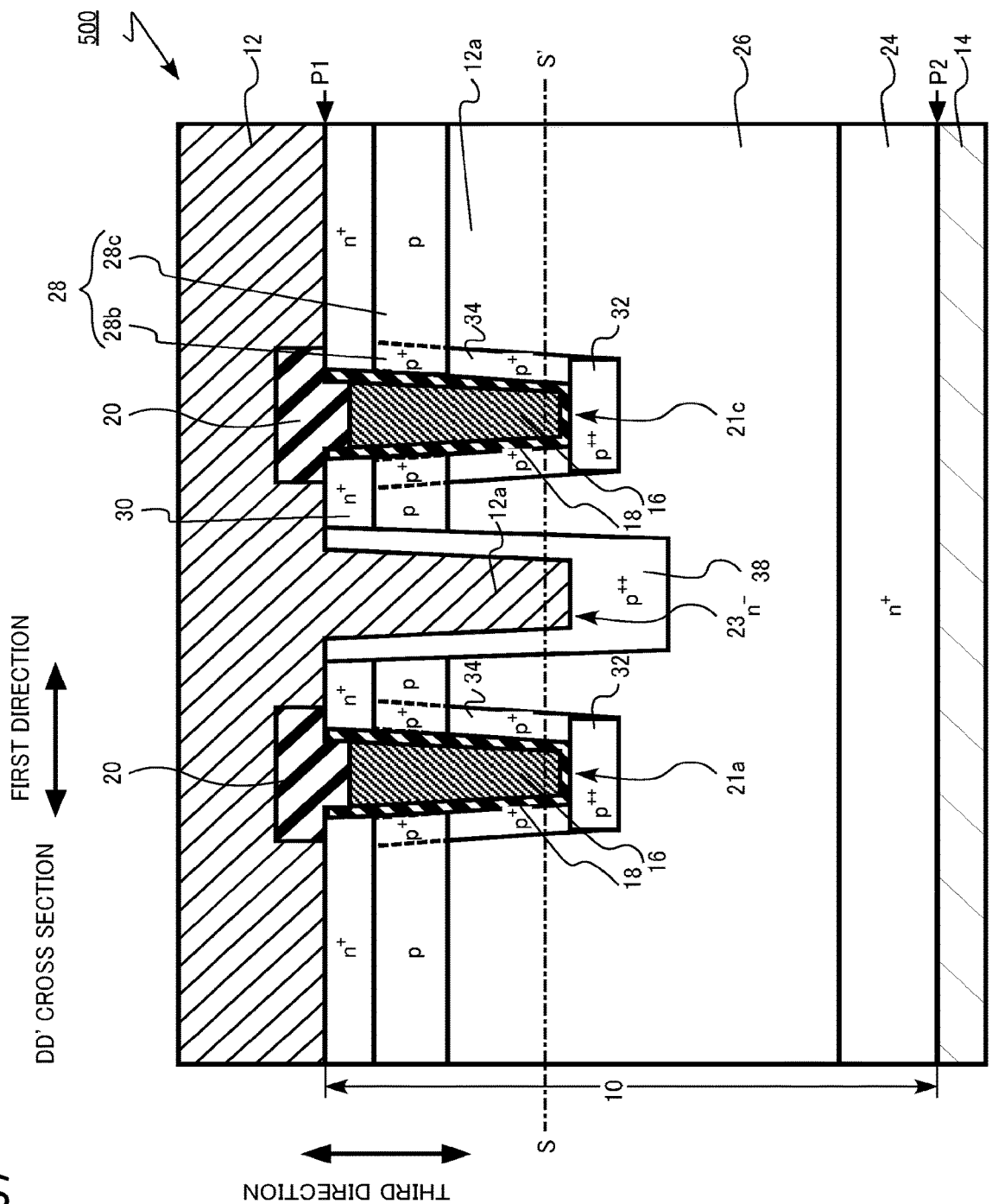
FIG. 37 is a schematic cross-sectional view of the semiconductor device of the fifth embodiment.
Figure 38:
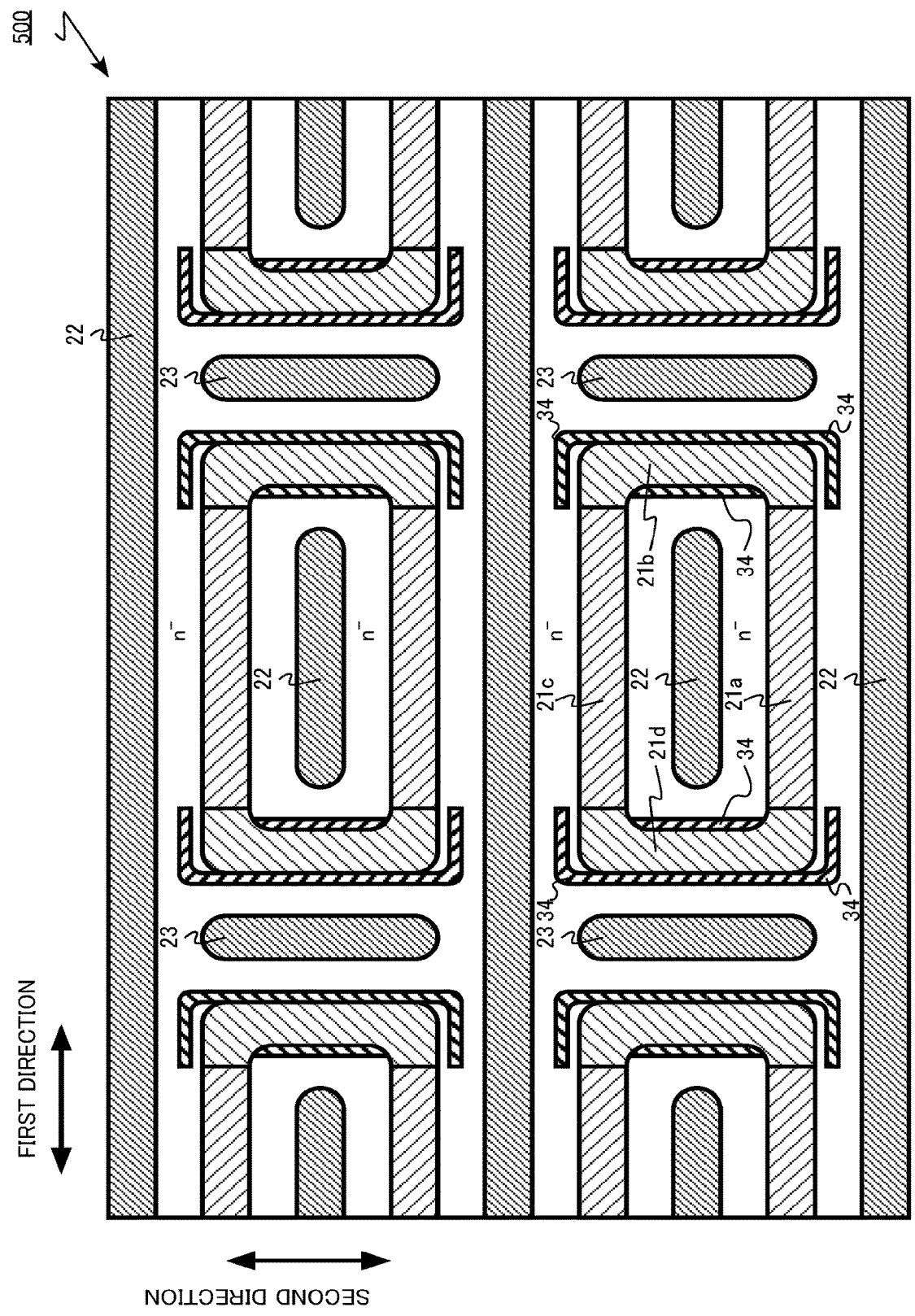
FIG. 38 is a schematic cross-sectional view of the semiconductor device of the fifth embodiment.

FIG. 33 is a schematic plan view of the semiconductor device of the fifth embodiment. FIG. 34 is a schematic cross-sectional view of the semiconductor device of the fifth embodiment. FIG. 35 is a schematic cross-sectional view of the semiconductor device of the fifth embodiment. FIG. 36 is a schematic cross-sectional view of the semiconductor device of the fifth embodiment. FIG. 37 is a schematic cross-sectional view of the semiconductor device of the fifth embodiment. FIG. 38 is a schematic cross-sectional view of the semiconductor device of the fifth embodiment.

FIG. 33 is a diagram showing patterns of a first trench and a second trench on the first face P1 of a silicon carbide layer. FIG. 34 is a cross-sectional view taken along the line AA' of FIG. 33. FIG. 35 is a cross-sectional view taken along the line BB' of FIG. 33. FIG. 36 is a cross-sectional view taken along the line CC' of FIG. 33. FIG. 37 is a cross-sectional view taken along the line DD' of FIG. 33. FIG. 38 is a cross-sectional view taken along the line SS' of FIGS. 34, 35, 36, and 37. FIG. 38 is a diagram showing patterns of a first trench and a second trench and a pattern of a fifth silicon carbide region.

The MOSFET 500 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 has a gate trench 21 (first trench), a contact trench 22 (second trench), an auxiliary trench 23, an n$^+$-type drain region 24, an n$^-$-type drift region 26 (first silicon carbide region), a p-type body region 28 (second silicon carbide region), an n$^+$-type source region 30 (third silicon carbide region), a p$^{++}$-type gate trench bottom region 32 (fourth silicon carbide region), a p$^+$-type connection region 34 (fifth silicon carbide region), and a p$^{++}$-type electric field relaxation region 38.

The gate trench 21 has a first region 21a, a second region 21b, a third region 21c, and a fourth region 21d. The p-type body region 28 (second silicon carbide region) has a first low concentration portion 28a (first portion), a high concentration portion 28b (second portion), and a second low concentration portion 28c.

The gate electrode 16 includes a crosslinked portion 16a.

The source electrode 12 is an example of the first electrode. The drain electrode 14 is an example of the second electrode. The gate trench 21 is an example of the first trench. The drift region 26 is an example of the first silicon carbide region. The body region 28 is an example of the second silicon carbide region. The source region 30 is an example of the third silicon carbide region. The gate trench bottom region 32 is an example of the fourth silicon carbide region. The connection region 34 is an example of the fifth silicon carbide region. The first low concentration portion 28a is an example of the first portion. The high concentration portion 28b is an example of the second portion.

The gate trench 21 has the first region 21a, the second region 21b, the third region 21c, and the fourth region 21d. The second region 21b is continuous with the first region 21a. The third region 21c is continuous with the second region 21b. The fourth region 21d is continuous with the third region 21c and the first region 21a. The gate trench 21 has an annular shape.

The contact trench 22 is present in the silicon carbide layer 10. The contact trench 22 is disposed on the first face P1 side of the silicon carbide layer 10. The contact trench 22 is a groove formed in the silicon carbide layer 10.

The contact trench 22 is adjacent to the first region 21a of the gate trench 21 in the second direction. The contact trench 22 extends in the first direction. A part 12a of the source electrode 12 is disposed inside the contact trench 22.

The auxiliary trench 23 is present in the silicon carbide layer 10. The auxiliary trench 23 is disposed on the first face P1 side of the silicon carbide layer 10. The auxiliary trench 23 is a groove formed in the silicon carbide layer 10.

The auxiliary trench 23 is adjacent to the second region 21b of the gate trench 21 in the first direction. The auxiliary trench 23 extends in the second direction. A part 12a of the source electrode 12 is disposed inside the auxiliary trench 23.

The p$^{++}$-type electric field relaxation region 38 is disposed between the contact trench 22 and the drift region 26. The electric field relaxation region 38 is in contact with the bottom surface and the side surface of the contact trench 22. The electric field relaxation region 38 is in contact with a part 12a of the source electrode 12 in the contact trench 22.

The p$^{++}$-type electric field relaxation region 38 is disposed between the auxiliary trench 23 and the drift region 26. The electric field relaxation region 38 is in contact with the bottom surface and the side surface of the auxiliary trench 23. The electric field relaxation region 38 is in contact with a part 12a of the source electrode 12 in the auxiliary trench 23.

The electric field relaxation region 38 has a function of reducing the electric field applied to the gate insulating layer 18 when the MOSFET 500 is turned off. The electric field relaxation region 38 is fixed to, for example, the same electric potential as the electric potential of the source electrode 12.

The electric field relaxation region 38 contains, for example, aluminum (Al) as a p-type impurity. The p-type impurity concentration in the electric field relaxation region 38 is higher than the p-type impurity concentration in the body region 28. The p-type impurity concentration in the electric field relaxation region 38 is, for example, equal to or more than $5 \times 10^{17}$ cm$^{-3}$ and equal to or less than $5 \times 10^{20}$ cm$^{-3}$.

The MOSFET 500 of the fifth embodiment can be manufactured by adding steps of forming the contact trench 22 and the auxiliary trench 23 and a step of forming the electric field relaxation region 38 to the MOSFET manufacturing method of the second embodiment.

In addition, the contact trench 22 and the auxiliary trench 23 may be connected to each other in the second direction.

Figure 39:
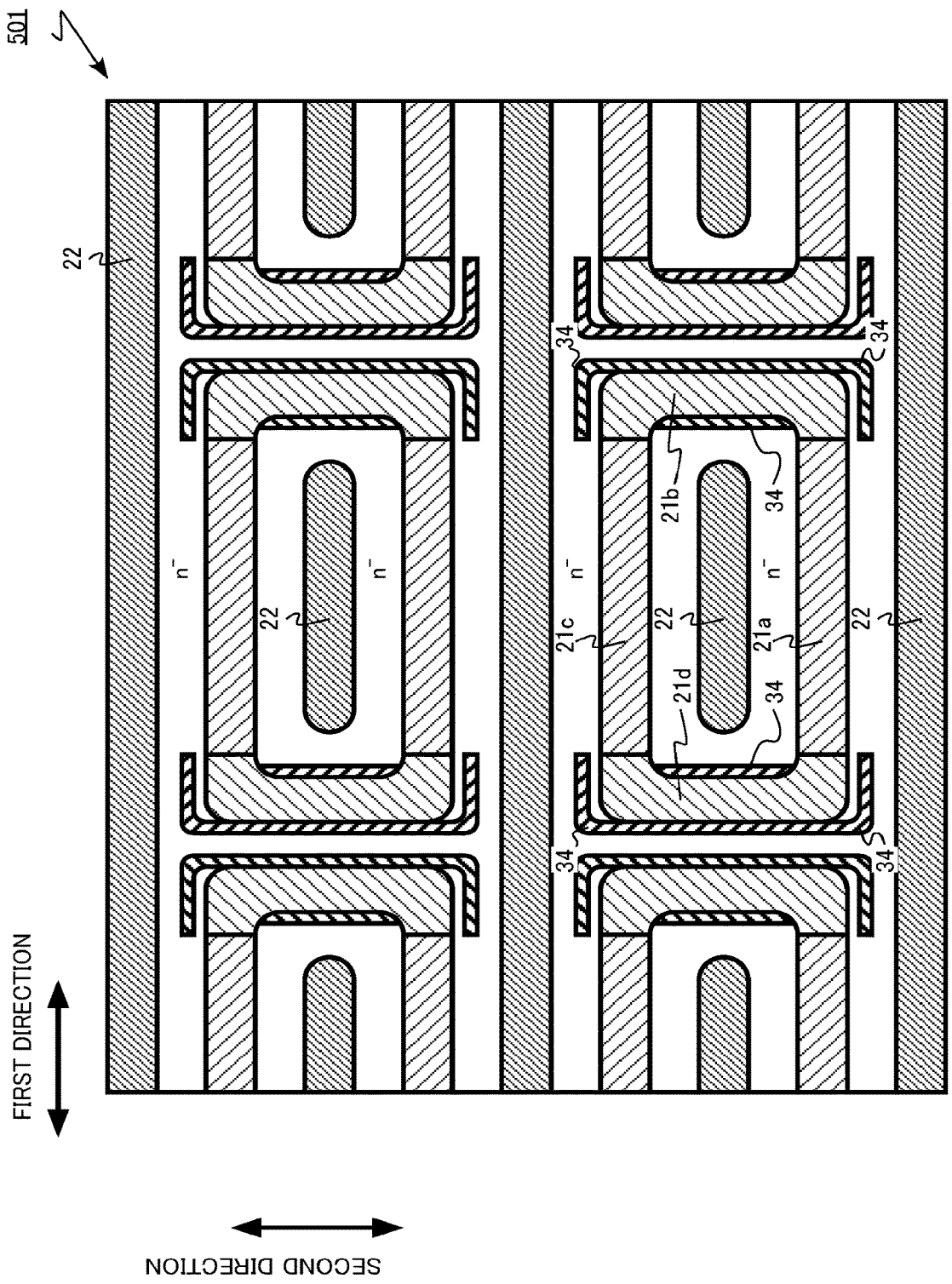
FIG. 39 is a schematic cross-sectional view of a modification example of the semiconductor device of the fifth embodiment.

FIG. 39 is a schematic cross-sectional view of a modification example of the semiconductor device of the fifth embodiment. FIG. 39 is a diagram showing patterns of a first trench and a second trench and a pattern of a fifth silicon carbide region. FIG. 39 is a diagram corresponding to FIG. 38 of the fifth embodiment.

A MOSFET 501 of a modification example of the fifth embodiment is different from the MOSFET 500 of the fifth embodiment in that the silicon carbide layer 10 does not include the auxiliary trench 23.

According to the MOSFET 501 of the modification example, the channel area per unit area is increased as compared with the MOSFET 500. Therefore, the on-resistance of the MOSFET 501 is further reduced.

As described above, according to the MOSFETs 500 and 501 of the fifth embodiment and its modification example, it is possible to realize the reduction of the on-resistance, the improvement of the reliability of the gate insulating layer, and the reduction of the switching loss at the same time. In addition, according to the MOSFETs 500 and 501 and the MOSFET manufacturing method of the fifth embodiment and its modification example, it is possible to reduce the manufacturing cost.

Sixth Embodiment

A semiconductor device of a sixth embodiment is different from the semiconductor device of the third embodiment in that the silicon carbide layer further includes a second trench which is adjacent to the first region in the second direction, is disposed on the first face side, and extends in the first direction and in which a part of the first electrode is disposed. Hereinafter, the description of a part of the content overlapping the third embodiment may be omitted.

The semiconductor device of the sixth embodiment is a vertical MOSFET 600 using silicon carbide. The MOSFET 600 is a MOSFET having a trench gate structure in which a gate electrode is provided in the trench. In addition, the MOSFET 600 is a MOSFET having a so-called double trench structure in which a source electrode is provided in the trench. In addition, the MOSFET 600 is an n-channel MOSFET having electrons as carriers.

Figure 40:
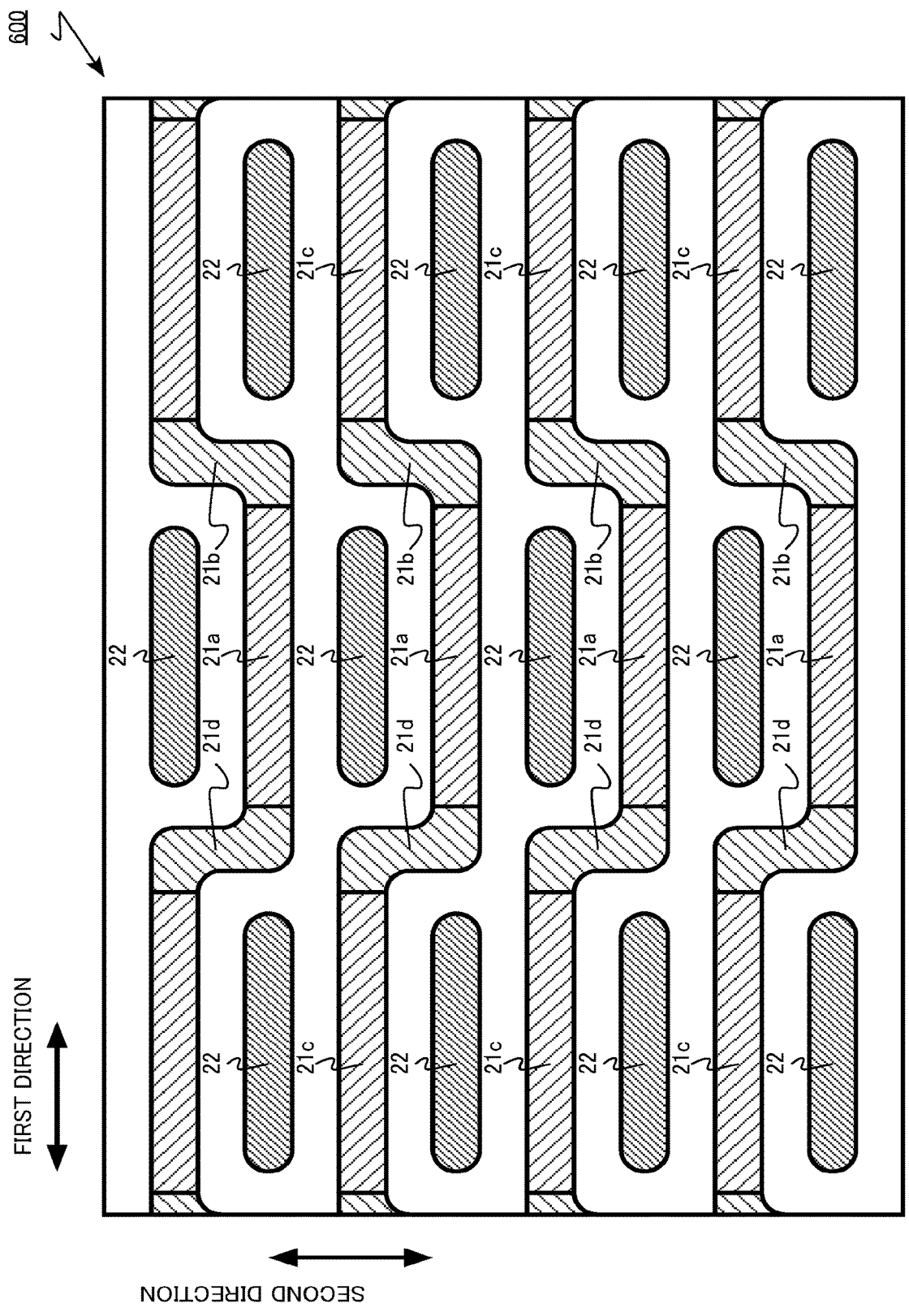
FIG. 40 is a schematic plan view of a semiconductor device of a sixth embodiment.
Figure 41:
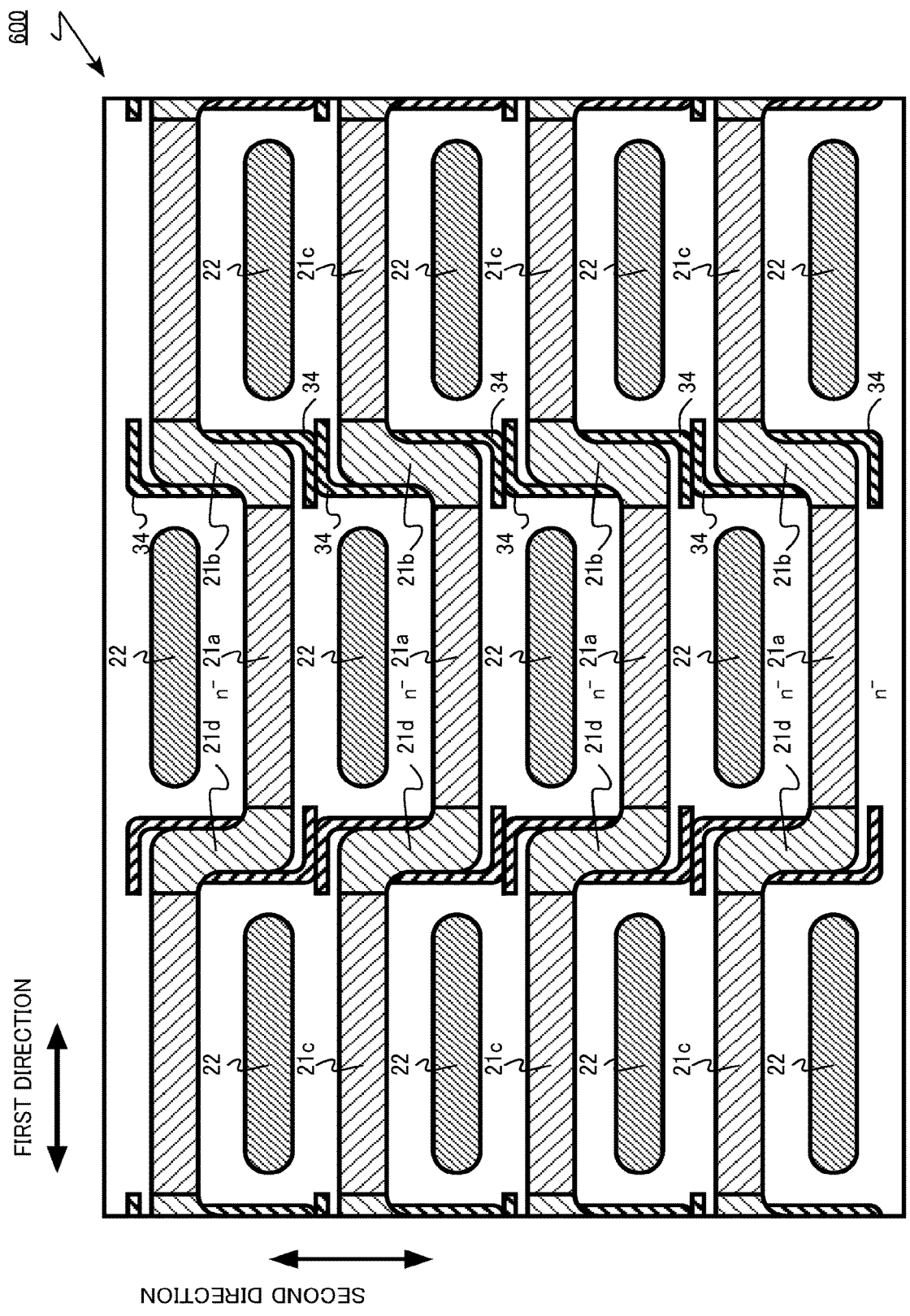
FIG. 41 is a schematic cross-sectional view of the semiconductor device of the sixth embodiment.

FIG. 40 is a schematic plan view of the semiconductor device of the sixth embodiment. FIG. 41 is a schematic cross-sectional view of the semiconductor device of the sixth embodiment.

FIG. 40 is a diagram showing a pattern of a first trench and a second trench on the first face P1 of a silicon carbide layer. FIG. 41 is a diagram showing patterns of a first trench and a second trench and a pattern of a fifth silicon carbide region. FIG. 41 is a diagram showing patterns of the gate trench 21 and the contact trench 22 and a pattern of the connection region 34.

The silicon carbide layer 10 includes the gate trench 21 (first trench) and the contact trench 22 (second trench). The silicon carbide layer 10 has the p$^{++}$-type electric field relaxation region 38. The structure of the contact trench 22 and the p$^{++}$-type electric field relaxation region 38 is the same as that in the MOSFET 400 of the fourth embodiment or the MOSFET 500 of the fifth embodiment, for example.

The gate trench 21 has a first region 21a, a second region 21b, a third region 21c, and a fourth region 21d. The second region 21b is continuous with the first region 21a. The third region 21c is continuous with the second region 21b. The fourth region 21d is continuous with the third region 21c and the first region 21a.

The first region 21a and the third region 21c extend in the first direction. The second region 21b and the fourth region 21d extend in the second direction.

The first region 21a is repeatedly arranged in the second direction. The third region 21c is repeatedly arranged in the second direction.

The contact trench 22 is present in the silicon carbide layer 10. The contact trench 22 is disposed on the first face P1 side of the silicon carbide layer 10. The contact trench 22 is a groove formed in the silicon carbide layer 10.

The contact trench 22 is adjacent to the first region 21a of the gate trench 21 in the second direction. The contact trench 22 extends in the first direction. A part 12a of the source electrode 12 is disposed inside the contact trench 22.

The MOSFET 600 of the sixth embodiment can be manufactured by adding a step of forming the contact trench 22 and a step of forming the electric field relaxation region 38 to the MOSFET manufacturing method of the third embodiment.

As described above, according to the MOSFET 600 of the sixth embodiment, it is possible to realize the reduction of the on-resistance, the improvement of the reliability of the gate insulating layer, and the reduction of the switching loss at the same time. In addition, according to the MOSFET 600 and the MOSFET manufacturing method of the sixth embodiment, it is possible to reduce the manufacturing cost.

Seventh Embodiment

An inverter circuit and a drive device of a seventh embodiment are drive devices including the semiconductor device of the first embodiment.

Figure 42:
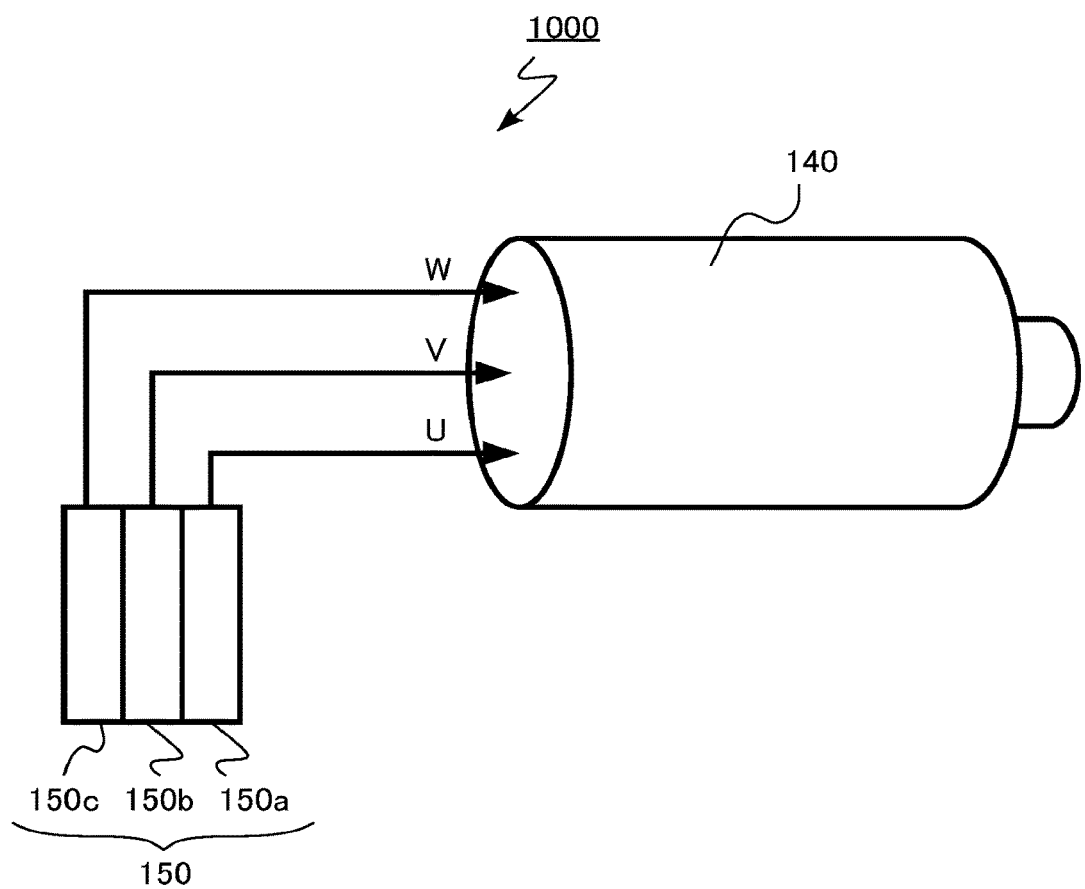
FIG. 42 is a schematic diagram of a drive device of a seventh embodiment.

FIG. 42 is a schematic diagram of the drive device of the seventh embodiment. A drive device 1000 includes a motor 140 and an inverter circuit 150.

The inverter circuit 150 includes three semiconductor modules 150a, 150b, and 150c having the MOSFET 100 of the first embodiment as a switching element. By connecting the three semiconductor modules 150a, 150b, and 150c in parallel to each other, a three-phase inverter circuit 150 having three AC voltage output terminals U, V, and W is realized. The motor 140 is driven by the AC voltage output from the inverter circuit 150.

According to the seventh embodiment, the characteristics of the inverter circuit 150 and the drive device 1000 are improved by providing the MOSFET 100 with improved characteristics.

Eighth Embodiment

A vehicle of an eighth embodiment is a vehicle including the semiconductor device of the first embodiment.

Figure 43:
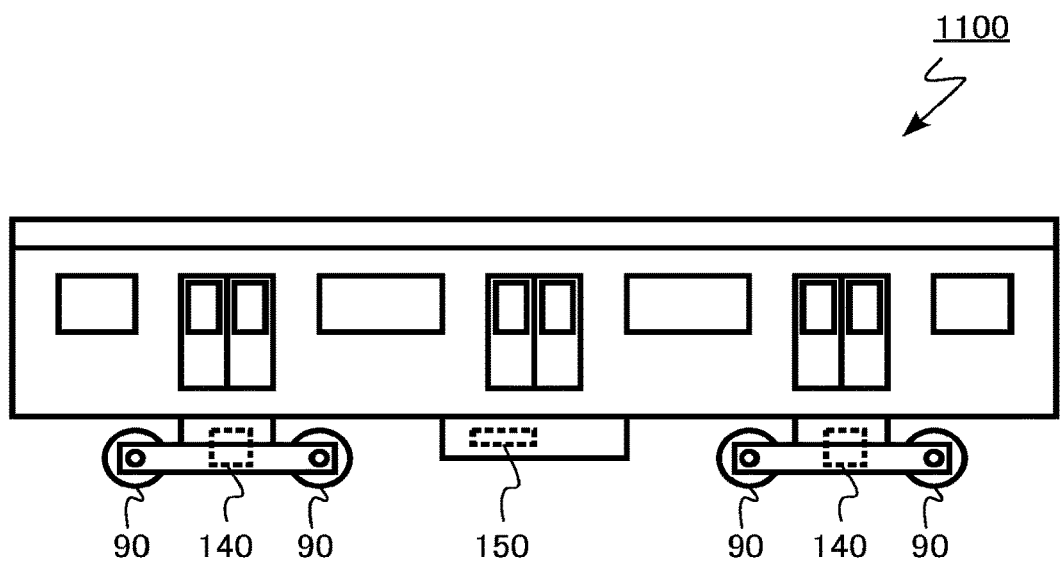
FIG. 43 is a schematic diagram of a vehicle of an eighth embodiment.

FIG. 43 is a schematic diagram of the vehicle of the eighth embodiment. A vehicle 1100 of the eighth embodiment is a railroad vehicle. The vehicle 1100 includes the motor 140 and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized. The motor 140 is driven by the AC voltage output from the inverter circuit 150. The motor 140 rotates wheels 90 of the vehicle 1100.

According to the eighth embodiment, the characteristics of the vehicle 1100 are improved by providing the MOSFET 100 with improved characteristics.

Ninth Embodiment

A vehicle of a ninth embodiment is a vehicle including the semiconductor device of the first embodiment.

Figure 44:
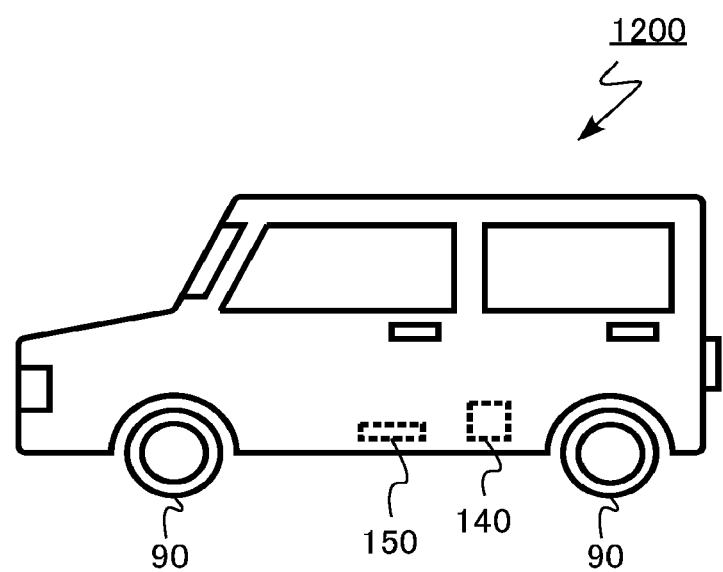
FIG. 44 is a schematic diagram of a vehicle of a ninth embodiment.

FIG. 44 is a schematic diagram of the vehicle of the ninth embodiment. A vehicle 1200 of the ninth embodiment is an automobile. The vehicle 1200 includes the motor 140 and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The motor 140 rotates wheels 90 of the vehicle 1200.

According to the ninth embodiment, the characteristics of the vehicle 1200 are improved by providing the MOSFET 100 with improved characteristics.

Tenth Embodiment

An elevator of a tenth embodiment is an elevator including the semiconductor device of the first embodiment.

Figure 45:
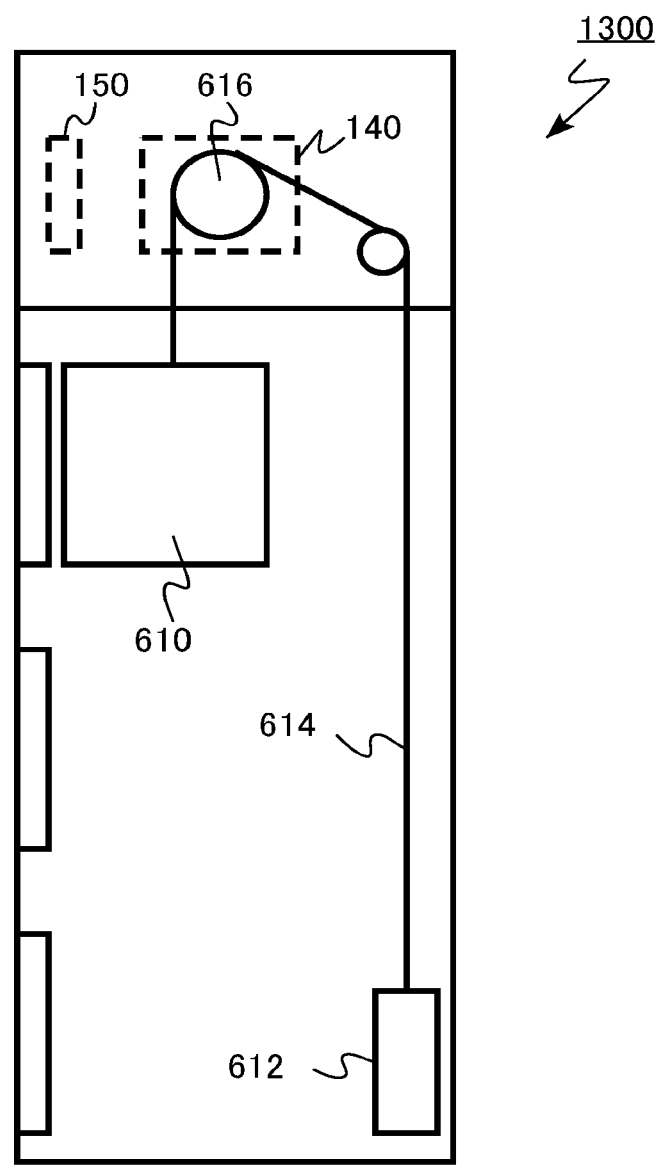
FIG. 45 is a schematic diagram of an elevator of a tenth embodiment.

FIG. 45 is a schematic diagram of the elevator of the tenth embodiment. An elevator 1300 of the tenth embodiment includes a car 610, a counterweight 612, a wire rope 614, a hoisting machine 616, the motor 140, and the inverter circuit 150.

The inverter circuit 150 includes three semiconductor modules having the MOSFET 100 of the first embodiment as a switching element. By connecting the three semiconductor modules in parallel to each other, a three-phase inverter circuit 150 having three AC voltage output terminals U, V, and W is realized.

The motor 140 is driven by the AC voltage output from the inverter circuit 150. The hoisting machine 616 is rotated by the motor 140, and the car 610 is moved up and down.

According to the tenth embodiment, the characteristics of the elevator 1300 are improved by providing the MOSFET 100 with improved characteristics.

In the first to sixth embodiments, the case of 4H—SiC has been described as an example of the crystal structure of silicon carbide. However, embodiments can also be applied to silicon carbide having other crystal structures, such as 6H—SiC and 3C—SiC.

In addition, in the first to sixth embodiments, MOSFETs have been described as examples of the semiconductor device. However, embodiments can also be applied to an insulated gate bipolar transistor (IGBT), for example.

In addition, in the seventh to tenth embodiments, the cases where the semiconductor device of the first embodiment is provided have been described as examples. However, the semiconductor devices of the second to sixth embodiments can also be applied.

In addition, in the seventh to tenth embodiments, the cases where the semiconductor devices of embodiments are applied to a vehicle or an elevator have been described as examples. However, the semiconductor devices of embodiments can also be applied to, for example, a power conditioner of a photovoltaic power generation system.

While certain embodiments have been described, these embodiments have been presented by way of example only, and are not intended to limit the scope of the inventions. Indeed, the semiconductor device, the semiconductor device manufacturing method, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a silicon carbide layer having a first face and a second face opposite to the first face, the first face being parallel to a first direction and a second direction, the second direction being perpendicular to the first direction, and the silicon carbide layer including:
      a first trench disposed on a side of the first face and including a first region, a second region, and a third region, the first region extending in the first direction, the second region continuous with the first region, the third region continuous with the second region and extending in the first direction, a second width of the second region in the second direction being larger than a first width of the first region in the second direction, and the second width of the second region in the second direction being larger than a third width of the third region in the second direction;
      a first silicon carbide region of n-type;
      a second silicon carbide region of p-type disposed between the first silicon carbide region and the first face, a distance from the second face to the second silicon carbide region being larger than a distance from the second face to the first trench;
      a third silicon carbide region of n-type disposed between the second silicon carbide region and the first face;
      a fourth silicon carbide region of p-type disposed between the first trench and the first silicon carbide region; and
      a fifth silicon carbide region disposed in the second direction of the second region and electrically connecting the second silicon carbide region and the fourth silicon carbide region to each other;
   a gate electrode disposed in the first trench;
   a gate insulating layer disposed between the gate electrode and the silicon carbide layer;
   a first electrode disposed on the side of the first face of the silicon carbide layer and in contact with the third silicon carbide region; and
   a second electrode disposed on a side of the second face of the silicon carbide layer.

2. The semiconductor device according to claim 1, wherein the fifth silicon carbide region is in contact with the second silicon carbide region, and the fifth silicon carbide region is in contact with the fourth silicon carbide region.

3. The semiconductor device according to claim 1, wherein the second silicon carbide region includes a first portion and a second portion, the first portion is disposed between the first trench and the second portion, a p-type impurity concentration in the second portion is higher than a p-type impurity concentration in the first portion, and the fifth silicon carbide region is in contact with the second portion.

4. The semiconductor device according to claim 1, wherein the second region extends in the second direction.

5. The semiconductor device according to claim 1, wherein the second width is equal to or more than twice the first width.

6. The semiconductor device according to claim 1, wherein a part of the first silicon carbide region is disposed between the first trench and the fifth silicon carbide region.

7. The semiconductor device according to claim 1, wherein a p-type impurity concentration in the fourth silicon carbide region between the second region and the first silicon carbide region is higher than a p-type impurity concentration in the fourth silicon carbide region between the first region and the first silicon carbide region.

8. The semiconductor device according to claim 1, wherein a length of the fifth silicon carbide region in the first direction is equal to or less than 1.5 times a length of the second region in the first direction.

9. The semiconductor device according to claim 1, wherein a p-type impurity concentration in the fifth silicon carbide region is lower than a p-type impurity concentration in the fourth silicon carbide region.

10. The semiconductor device according to claim 1, wherein the first region and the third region face each other in the second direction.

11. The semiconductor device according to claim 10, wherein the first trench further includes a fourth region facing the second region in the first direction and continuous with the first region and the third region.

12. The semiconductor device according to claim 1, wherein the silicon carbide layer further includes a second trench adjacent to the first region in the second direction, the second trench is disposed on the side of the first face, the second trench extends in the first direction, and a part of the first electrode is disposed inside the second trench.

13. The semiconductor device according to claim 1, wherein the fifth silicon carbide region in contact with the first trench is disposed in the first direction of the second region.

14. An inverter circuit comprising the semiconductor device according to claim 1.

15. A drive device comprising the semiconductor device according to claim 1.

16. A vehicle comprising the semiconductor device according to claim 1.

17. An elevator comprising the semiconductor device according to claim 1.

* * * * *